(12) United States Patent
Lee et al.

(10) Patent No.: US 7,721,234 B2
(45) Date of Patent: May 18, 2010

(54) SIMULATION METHOD AND SIMULATION PROGRAM

(75) Inventors: Peter Maurice Lee, Tokyo (JP); Junji Sato, Tokyo (JP); Goichi Yokomizo, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 502 days.

(21) Appl. No.: 11/619,885

(22) Filed: Jan. 4, 2007

(65) Prior Publication Data
US 2007/0186194 A1  Aug. 9, 2007

(30) Foreign Application Priority Data
Feb. 9, 2006  (JP)  ............... 2006-031868

(51) Int. Cl.
*G06F 17/50* (2006.01)
*G06F 9/45* (2006.01)

(52) U.S. Cl. .................. 716/4; 716/1; 716/2; 716/3; 716/5; 716/6; 716/7; 716/18; 703/13; 703/14; 703/22

(58) Field of Classification Search .................. 716/1–7, 716/18; 703/11, 13, 14, 22
See application file for complete search history.

(56) References Cited

U.S. PATENT DOCUMENTS

| | | | | |
|---|---|---|---|---|
| 5,247,468 A * | 9/1993 | Henrichs et al. | ............... | 703/14 |
| 5,416,717 A * | 5/1995 | Miyama et al. | ............... | 703/14 |
| 5,555,201 A * | 9/1996 | Dangelo et al. | ................. | 716/1 |
| 5,801,958 A * | 9/1998 | Dangelo et al. | ............... | 716/18 |
| 5,980,096 A * | 11/1999 | Thalhammer | ............... | 707/100 |
| 6,470,482 B1 * | 10/2002 | Rostoker et al. | ............... | 716/6 |
| 6,539,522 B1 * | 3/2003 | Devins et al. | ................. | 716/5 |
| 6,845,489 B1 * | 1/2005 | Mizuno et al. | ................. | 716/1 |
| 7,080,365 B2 * | 7/2006 | Broughton et al. | ........... | 717/146 |
| 7,092,864 B2 * | 8/2006 | Roesner et al. | ............... | 703/14 |
| 7,181,383 B1 * | 2/2007 | McGaughy et al. | ........... | 703/14 |
| 7,206,732 B2 * | 4/2007 | Williams et al. | ............... | 703/22 |
| 7,343,572 B1 * | 3/2008 | Stone et al. | ................... | 716/4 |
| 7,392,169 B2 * | 6/2008 | Gabele et al. | ................. | 703/13 |
| 7,483,825 B2 * | 1/2009 | Van Huben et al. | ........... | 703/16 |

(Continued)

FOREIGN PATENT DOCUMENTS

JP  9-259151 A  10/1997

(Continued)

Primary Examiner—Helen Rossoshek
(74) Attorney, Agent, or Firm—Miles & Stockbridge P.C.

(57) ABSTRACT

There is a need for keeping the amount of data to be saved and a simulation process time almost constant irrespectively of a hierarchical level of a hierarchical circuit to be simulated. This simulation method includes a first process and a second process. The first process saves result data obtained from simulating an interface node between higher-level and lower-level hierarchies in accordance with a result of simulation using hierarchical circuit data hierarchized for multiple hierarchies. The second process uses result data saved by the first process to reproduce internal node data not saved by the first process. Result data for the interface node between hierarchies indirectly determines a value for the internal node. Result data to be saved is data concerning the interface node between hierarchies. The amount of saved data and the time needed for the second process are independent of a hierarchical level or a higher-level or lower-level hierarchy.

4 Claims, 52 Drawing Sheets

U.S. PATENT DOCUMENTS

| | | | |
|---|---|---|---|
| 2002/0046009 A1* | 4/2002 | Devaquet et al. | 703/1 |
| 2002/0069039 A1* | 6/2002 | Ricks et al. | 703/1 |
| 2005/0267721 A1* | 12/2005 | Thalhammer-reyero | 703/11 |
| 2007/0043547 A1* | 2/2007 | Plun et al. | 703/13 |
| 2007/0245278 A1* | 10/2007 | Chen | 716/5 |

FOREIGN PATENT DOCUMENTS

| | | |
|---|---|---|
| JP | 11-96207 A | 4/1999 |
| WO | WO 03/036523 A1 | 5/2003 |

* cited by examiner

- ◆ Interface Nodes
- ○ Internal Nodes
- /\/\/\ Resistor
- ▨ Individual devices

FIG. 22

| HIERARCHY LEVEL | NODE OR ELEMENT NAME WITH HIERARCHICAL INFORMATION |
|---|---|
| 1 | IN |
| 1 | OUT |
| 1 | SRC |
| 1 | O |
| 1 | N1 |
| 2 | X1. N1 |
| 2 | X1. N2 |
| 2 | X1. N3 |
| 2 | X2. N1 |
| 2 | X2. M1 |
| 2 | X2. M2 |
| 2 | X2. M3 |
| 2 | X2. M4 |
| 3 | X1. X1. N1 |
| 3 | X1. X1. M1 |
| 3 | X1. X1. M2 |
| 3 | X1. X1. M3 |
| 3 | X1. X1. M4 |
| 3 | X1. X2. N1 |
| 3 | X1. X2. M1 |
| 3 | X1. X2. M2 |
| 3 | X1. X2. M3 |
| 3 | X1. X2. M4 |

US 7,721,234 B2

SIMULATION METHOD AND SIMULATION PROGRAM

CROSS-REFERENCE TO RELATED APPLICATION

The present application claims priority from Japanese patent application No. 2006-31868 filed on Feb. 9, 2006, the content of which is hereby incorporated by reference into this application.

BACKGROUND OF THE INVENTION

The present invention relates to a data processing method typified by a circuit simulating method and a simulation program. For example, the invention relates to a technology effectively applied to a simulator used for development or design of semiconductor integrated circuits.

The circuit simulation technology is used as a circuit verification technology for the circuit design and the layout design of a semiconductor integrated circuit. Recently, devices have become smaller and consequently circuits have become large in scale and highly integrated. It becomes obvious that the circuit simulation time becomes long and the amount of data for saving simulation results increases. When a designer wants to ensure he obtains the information he needs, he needs to specify explicitly the information to output before doing the actual circuit simulation. Only specified information is saved as result data. Accordingly, result data that is not saved cannot be displayed. To enable any result to be displayed without specifically selecting the data to output, it is necessary to perform a simulation that specifies all the circuit nodes to be output. As a result, the data of from all nodes need to be maintained. A large-scale circuit generates a large amount of data because all the results need to be saved. It is practically impossible to save all the data. Increasing the amount of data for result display also increases the retrieval time for result data and slows display speed. In addition, large-scale circuits increase simulation process time and therefore also increases the re-simulation time required when the circuit is partially modified or an element parameter is modified.

Concerning reduction of a storage area for saving simulation results, Japanese Unexamined Patent Publication No. Hei 11(1999)-96207 describes a technology of compressing the saved simulation result data. Japanese Unexamined Patent Publication NO. Hei 9(1997)-259151 discloses a technology that divides a circuit from an upstream and a downstream side of a signal path with respect to a modified circuit block and performs simulation for each part downstream of the modified block which would be affected by the modification of the block.

However, the technology described in Japanese Unexamined Patent Publication No. Hei 11(1999)-96207 additionally requires compression and decompression processes and further increases computation time due to the simulation and the result display. The technology described in Japanese Unexamined Patent Publication NO. Hei 9(1997)-259151 decreases the amount of memory used for computation, but does not decrease the storage capacity of auxiliary storage means for maintaining results. The circuit needs to be divided so as not to be dependent on the other simulation results and needs to be serially simulated. The process time is considered to increase.

The applicants made an application for patent (International Publication 03/036523 in the form of a brochure). The simulation method according to the application includes first and second processes. The first process performs simulation and saves a result so that a result output node corresponds to a higher hierarchical circuit node for hierarchical circuit data. The second process performs simulation under a specified initial condition for a lower hierarchical circuit node using the simulation result saved by the above-mentioned process as input/output information about a circuit area containing the lower hierarchical circuit node.

SUMMARY OF THE INVENTION

The inventors further examined the applied invention. The first point is trade-off between the amount of data to be saved and the simulation speed. The second point is generation of voltage source loops during simulation. According to the first point, deepening the lower-level hierarchy below which no results data are saved would increase the amount of data to be saved but shortens the simulation time for lower-level hierarchies. An attempt to decrease the amount of data to be saved adversely increases the simulation time for lower-level hierarchies. With respect to the second point, the simulation may include a path that connects with at least only one of voltage sources and an inductor. When a loop is formed by connecting the voltage source or the ground to both ends of the path, the loop will cause a situation where inconsistencies in the voltage may occur, and the current through the loop cannot be calculated. A loop formed only by voltage sources and the inductors is called a voltage source loop. No simulation result may be obtained when a voltage source loop is generated in a circuit under simulation.

It is an object of the present invention to provide a simulation method capable of displaying data at any result output point without saving all simulation result data for a large-scale object under simulation and capable of keeping the amount of data to be saved and a simulation process time almost constant irrespectively of a hierarchical level of a hierarchical circuit to be simulated.

It is another object of the present invention to provide a simulation method capable of displaying data at any result output point without saving all simulation result data for a large-scale object under simulation while not forming any voltage source loops in the process.

These and other objects and novel features of the invention may be readily ascertained by referring to the following description and appended drawings.

The following describes an overview of representative means of the invention disclosed in this application.

[1]<1-A> A simulation method according to the invention includes: a first process for saving result data obtained from simulating an interface node between higher-level and lower-level hierarchies in accordance with a result of simulation using hierarchical circuit data hierarchized for multiple hierarchies; and a second process for using result data saved by the first process to reproduce internal node data not saved by the first process. A specified initial condition is preferably equivalent to that for the simulation of the first process. It is only necessary to allow the first process to save the initial condition along with a simulation result and make the initial condition reusable. In this manner, a simulation result is saved only to result data for an interface node between hierarchies. It is possible to decrease the amount of result data to be saved for simulation. No simulation result is saved for an internal node other than the interface node. Under the same initial condition as the simulation condition for the first process, result data for the interface node between hierarchies indirectly determines a value for the internal node. When the request to display output data happens to select an interface node for which data is already available from the first process, it is only necessary to display the result of the simulation of the first process in the second process. Even though the amount of stored data is small (the results data from the first process), it is possible to display all data in the circuit as if all the data had been saved for a large-scale simulation object such as a large-scale integrated circuit. Decreasing the amount of result data to be saved can shorten the time for retrieving result data. Since the scale of a targeted circuit can be decreased during simulation by the second process, it is possible to shorten the re-simulation time when making a partial circuit modification or an element parameter modification to a large-scale circuit. Result data to be saved is data concerning the interface node between hierarchies. The data is independent of the hierarchical level; interface nodes are saved at any specified hierarchical level or all hierarchical levels. Accordingly, it is possible to keep the amount of data to be saved and the simulation process time almost constant irrespectively of the hierarchical level of a hierarchical circuit to be simulated.

Preferably, the first process also saves simulation result data of an internal node different from an interface node between higher-level and lower-level hierarchies when the simulation result data determines a value of a voltage source or a current source in another hierarchy (these voltage and current sources are called dependent voltage sources and dependent current sources, since they are dependent on another quantity). Preferably, the first process saves simulation result data for an element in the hierarchy when the simulation result data determines a value for a voltage source or current source in another hierarchy (FIG. 24). It is possible to perform the hierarchical simulation according to the above-mentioned method capable of shortening the simulation time despite such dependency that a simulation result from an internal node in a given hierarchy determines a value for a voltage source or a current source in another hierarchy.

<1-B> At this time, a hierarchical circuit area (3p) having an internal node as an object of the second process is supposed to have a partial circuit (VLC) including one of elements such as a voltage source (Vs) and an inductor (Lt) or at least two connected elements such as the voltage source and the inductor. The hierarchical circuit area is supposed to have one or more specific nodes as interface nodes for connecting the partial circuit to a hierarchical circuit in another hierarchy, e.g., one or more specific nodes (N1 through NN) as interface nodes for connection to a higher-level hierarchical circuit. Alternatively, the hierarchical circuit area is supposed to have one or more specific nodes (M1 through MN) as interface nodes for connection to a lower-level hierarchical circuit. The partial circuit is supposed to be connected to a ground potential (GND). The second process then supplies electric current information (IN1 through INN and IM1 through IMN) as input/output information to the specific node (FIGS. 31 and 46). The electric current information is given as a specified current source. During the simulation, there may be a partial circuit connecting with at least only one of circuit elements such as the voltage source and the inductor. In such case, the ground potential can determine the potential reference for the partial circuit. The electric current information can be supplied to a specific node for the partial circuit. In this manner, the necessary simulation result can be obtained by eliminating the possibility of forming a voltage source loop by supplying voltage information to the specific node. To obtain the electric current information, the first process only needs to connect a 0-V voltage source to the one specific node, find the electric current flowing through the element, and save the current to use it for the second process.

A hierarchical circuit area having an internal node of which the output result is desired in the second process may have a partial circuit including one voltage source or at least two connected voltage sources, one or more specific nodes as interface nodes for connecting the partial circuit to a hierarchical circuit in another hierarchy, and another circuit (CIR) for connection to the partial circuit. The one or more specific nodes as interface nodes include, for example, those (N1 through NN) connected to a higher-level hierarchical circuit or those (M1 through MN) connected to a lower-level hierarchical circuit. The partial circuit is connected to a ground potential. The second process then supplies electric current information as input/output information to all specific nodes for the partial circuit (VLCv)(FIGS. 35, 50). When still another circuit is connected to the partial circuit through a specific node, the other circuit's state determines the current value through the specific node for the partial circuit. If only voltage value information for each node is required, all the specific nodes can actually be floated. This will prevent any voltage source loops from forming. However, there may be a need to perform simulation to verify an electric current flowing through the voltage source for the partial circuit. In this case, only electric current information as input/output information needs to be supplied to all the specific notes for the partial circuit (VLCv). The electric current information can be found as mentioned above.

A hierarchical circuit having an internal node as an object of the second process may have a partial circuit including one voltage source or two or more connected voltage sources, one or more specific nodes as interface nodes for connecting the partial circuit to a hierarchical circuit in another hierarchy, and another circuit for connection to the partial circuit. The one or more specific nodes as interface nodes include, for example, those (N1 through NN) connected to a higher-level hierarchical circuit or those (M1 through MN) connected to a lower-level hierarchical circuit. The partial circuit is connected to a ground potential. If the case is such that in the second process electric current flowing through voltage sources of the partial circuit are not required, then all the specific nodes are floated (FIGS. 34 and 49). In this case, no simulation is needed to verify the electric current flowing through the voltage sources of the partial circuit, and thus floating the higher-level interface nodes are allowed.

A hierarchical circuit area having an internal node as an object of the second process may have a partial circuit including one of elements such as a voltage source and an inductor or at least two connected elements such as a voltage source and an inductor and have one or more specific nodes as interface nodes for connecting the partial circuit to a hierarchical circuit in another hierarchy. The one or more specific nodes as interface nodes include, for example, those (N1 through NN) connected to a higher-level hierarchical circuit or those (M1 through MN) connected to a lower-level hierarchical circuit. The partial circuit is connected to a ground potential. If in the second process extracting the electric current flowing through the elements is not necessary, the partial circuit is then deleted (FIGS. 36 and 51). In short, when it is unnecessary to simulate an electric current flowing through all elements of the partial circuit for verification, the simulation only needs to be performed by eliminating the partial circuit. This contributes to deleting circuit information for the simulation and shortening the computation time.

<1-C> According to the above-mentioned description, the partial circuit is connected to the ground potential. However, this is not mandatory. A hierarchical circuit having an internal node as an object of the second process may have a partial circuit including one of elements such as a voltage source and an inductor or at least two connected elements such as a voltage source and an inductor and have two or more specific nodes as interface nodes for connecting the partial circuit to a hierarchical circuit in another hierarchy. The two or more specific nodes as interface nodes include, for example, those (N1 through NN) connected to a higher-level hierarchical circuit or those (M1 through MN) connected to a lower-level hierarchical circuit. The partial circuit is not connected to a ground potential. The second process then supplies voltage source information as input/output information to one of the two or more specific nodes and supplies current source information as input/output information to the remaining specific nodes (FIGS. 39 and 54). The voltage source information as input/output information supplied to one specific node is equivalent to information about the ground potential in the previous case.

Similarly, a hierarchical circuit area having an internal node as an object of the second process may have a partial circuit including one voltage source or at least two connected voltage sources, two or more specific nodes as interface nodes for connecting the partial circuit to a hierarchical circuit in another hierarchy, and another circuit for connection to the partial circuit. The two or more specific nodes as interface nodes include, for example, those (N1 through NN) connected to a higher-level hierarchical circuit or those (M1 through MN) connected to a lower-level hierarchical circuit. The partial circuit is not connected to a ground potential. The second process then supplies voltage source information as input/output information to one of the two or more specific nodes and supplies current source information as input/output information to the remaining specific nodes (FIGS. 42 and 57).

Similarly, a hierarchical circuit having an internal node as an object of the second process may have a partial circuit including one voltage source or two or more connected voltage sources, two or more specific nodes as interface nodes for connecting the partial circuit to a hierarchical circuit in another hierarchy, and another circuit for connection to the partial circuit. The two or more specific nodes as interface nodes include, for example, those (N1 through NN) connected to a higher-level hierarchical circuit or those (M1 through MN) connected to a lower-level hierarchical circuit. The partial circuit is not connected to a ground potential. If the electric current information flowing through the voltage sources of the partial circuit is not desired in the second process, voltage source information as input/output information to one specific node is adequate, and the remaining specific nodes can be floated (FIGS. 51 and 56).

A hierarchical circuit area having an internal node as an object of the second process may have a partial circuit including one of elements such as a voltage source and an inductor or at least two connected elements such as a voltage source and an inductor and have one or more specific nodes as interface nodes for connecting the partial circuit to a hierarchical circuit in another hierarchy. The one or more specific nodes as interface nodes include, for example, those (N1 through NN) connected to a higher-level hierarchical circuit or those (M1 through MN) connected to a lower-level hierarchical circuit. The partial circuit is not connected to a ground potential. If in the second process electric current flowing through all elements of the partial circuit can be ignored, then the partial circuit can be deleted.

[2] A simulation method according to another aspect of the invention includes: an extraction process for extracting a circuit node in a specified hierarchy from hierarchical circuit data; a simulation execution process for executing a circuit simulation using a circuit node extracted by the extraction process as a result output node. The method further includes: a save process for saving result data that is obtained by the simulation execution process for a result output node and relates to an interface node between higher-level and lower-level hierarchies; and a simulation re-execution process for using the saved result data concerning an interface node between a specified hierarchy and a hierarchy one level higher or lower and obtaining simulation result data for a circuit node in the specified hierarchy.

Similar to <1-A> as mentioned above, the simulation re-execution process can keep the amount of data to be saved and the simulation process time almost constant irrespectively of the hierarchical level of a hierarchical circuit to be simulated. It is possible to perform the hierarchical simulation according to the above-mentioned method with shortened simulation time. As described in <1-B> and <1-C>, it is possible to provide the simulation method including processes concerning a partial circuit so as to prevent voltage source loops to be formed.

An embodiment of the invention may further include a display process for displaying result data saved by the save process in response to an instruction to display a simulation result or displaying a simulation result obtained by the simulation re-execution process.

For example, the extraction process registers a circuit node identifiable at a specified hierarchical level each time the extraction process changes a hierarchical level to a lower one while keeping track of a series of references to a lower-level hierarchy in hierarchical circuit data. This process may be performed for all series of references in an object under simulation. This makes it possible to extract a result output node for the simulation by specifying a hierarchy.

[3] With respect to the display process for the simulation result, a simulation method according to an embodiment includes: a simulation execution process for performing a circuit simulation using a circuit node for a hierarchical circuit data in a specified hierarchy as a result output node; a save process for saving result data that is obtained by the simulation execution process for a result output node and relates to an interface node between higher-level and lower-level hierarchies; and a first display process for displaying result data retrieved from those saved by the save process as a result of the simulation execution process. The method further includes: a simulation re-execution process for using the saved result data concerning an interface node between a specified hierarchy and a hierarchy one level higher or lower and obtaining simulation result data for a circuit node in the specified hierarchy; and a second display process for displaying result data from the simulation re-execution process.

Similarly to <1-A> as mentioned above, the simulation re-execution process can keep the amount of data to be saved and the simulation process time almost constant irrespectively of the hierarchical level of a hierarchical circuit to be simulated. It is possible to perform the hierarchical simulation according to the above-mentioned method shortening the simulation time. As described in <1-B> and <1-C>, it is possible to provide the simulation method including processes concerning a partial circuit so as to prevent voltage loops from forming.

[4] A simulation method according to still another aspect of the invention includes: a simulation execution process for performing a circuit simulation using hierarchical circuit data for a specified hierarchy; and a save process for saving result data that is obtained by the simulation execution process for a result output node and relates to an interface node between higher-level and lower-level hierarchies. The method further includes a simulation re-execution process for performing a circuit simulation for a circuit node reflecting modification of the hierarchical circuit data, when modified, using the saved result data concerning an interface node between the circuit node and an interfaced hierarchy one level higher or lower. In this manner, the method eliminates the need for redoing overall simulation and helps shorten the simulation time. The method can shorten the simulation time similarly to <1-A> and prevent the formation of a voltage source loop similarly to <1-B> and <1-C>.

[5] A simulation method according to an embodiment considering device simulation based on calculating values at mesh or grid points other than the circuit simulation includes: a first process for extracting a result output point in a specified higher-level hierarchy from an object under simulation; a second process for simulating an extracted result output point; and a third process for saving result data that is obtained by the simulation execution process for a result output grid or mesh node and relates to an interface node between higher-level and lower-level hierarchies. The method further includes a fourth process for using the saved result data concerning an interface node between a specified hierarchy and a hierarchy one level higher or lower and simulating a device mesh or grid node in the specified hierarchy so as to obtain simulation result data under a condition equivalent to that for a simulation by the second process.

[6] A simulation program according to the invention is executed by a computer so as to perform a data process for supporting circuit simulation. The data process includes: a first process for saving result data obtained from simulating an interface node between higher-level and lower-level hierarchies in accordance with a result of simulation using hierarchical circuit data hierarchized for multiple hierarchies; and a second process for using result data saved by the first process to reproduce internal node data not saved by the first process. A simulation program can easily embody the simulation method.

A simulation program according to another embodiment provides a computer-based data process including: an extraction process for extracting a circuit node in a specified hierarchy from hierarchical circuit data; a simulation execution process for executing a circuit simulation using a circuit node extracted by the extraction process as a result output node; a save process for saving result data that relates to an interface node between higher-level and lower-level hierarchies and is obtained by the simulation execution process for a result output node; and a simulation re-execution process for using the saved result data concerning an interface node between a specified hierarchy and a hierarchy one level higher or lower and obtaining simulation result data for a circuit node in the specified hierarchy.

A simulation program according to still another embodiment provides a computer-based data process including: a simulation execution process for performing a circuit simulation using a circuit node for a hierarchical circuit data in a specified hierarchy as a result output node; a save process for saving result data that relates to an interface node between higher-level and lower-level hierarchies and is obtained by the simulation execution process for a result output node; and a first display process for displaying result data retrieved from those saved by the save process as a result of the simulation execution process; a simulation re-execution process for using the saved result data concerning an interface node between a specified hierarchy and a hierarchy one level higher or lower and obtaining simulation result data for a circuit node in the specified hierarchy; and a second display process for displaying result data from the simulation re-execution process.

A simulation program according to yet another embodiment provides a computer-based data process including: a first process for extracting a result output point in a specified higher-level hierarchy from an object under simulation; a second process for simulating an extracted result output point; a third process for saving result data that relates to an interface node between higher-level and lower-level hierarchies and is obtained by the simulation execution process for a result output node; and a fourth process for using the saved result data concerning an interface node between a specified hierarchy and a hierarchy one level higher or lower and simulating a circuit node in the specified hierarchy so as to obtain simulation result data under a condition equivalent to that for a simulation by the second process.

The following summarizes effects provided by the representative aspects of the invention disclosed in this application.

It is possible to provide a simulation method capable of displaying data at any result output point without saving all simulation result data for a large-scale object under simulation and capable of keeping the amount of data to be saved and a simulation process time almost constant irrespectively of a hierarchical level of a hierarchical circuit to be simulated.

BRIEF DESCRIPTION OF THE DRAWINGS

FIG. 8 is a principle diagram showing a parallel process for a simulation similarly to the on-the-fly simulation for a partial area due to a circuit modification or the like;

FIG. 22 is an explanatory diagram showing node names with hierarchical information indicative of node information about all externally and internally connected nodes extracted from the circuit block information in FIG. 21;

DETAILED DESCRIPTION OF THE PREFERRED EMBODIMENTS

On-the-Fly Simulation

Figure 1:
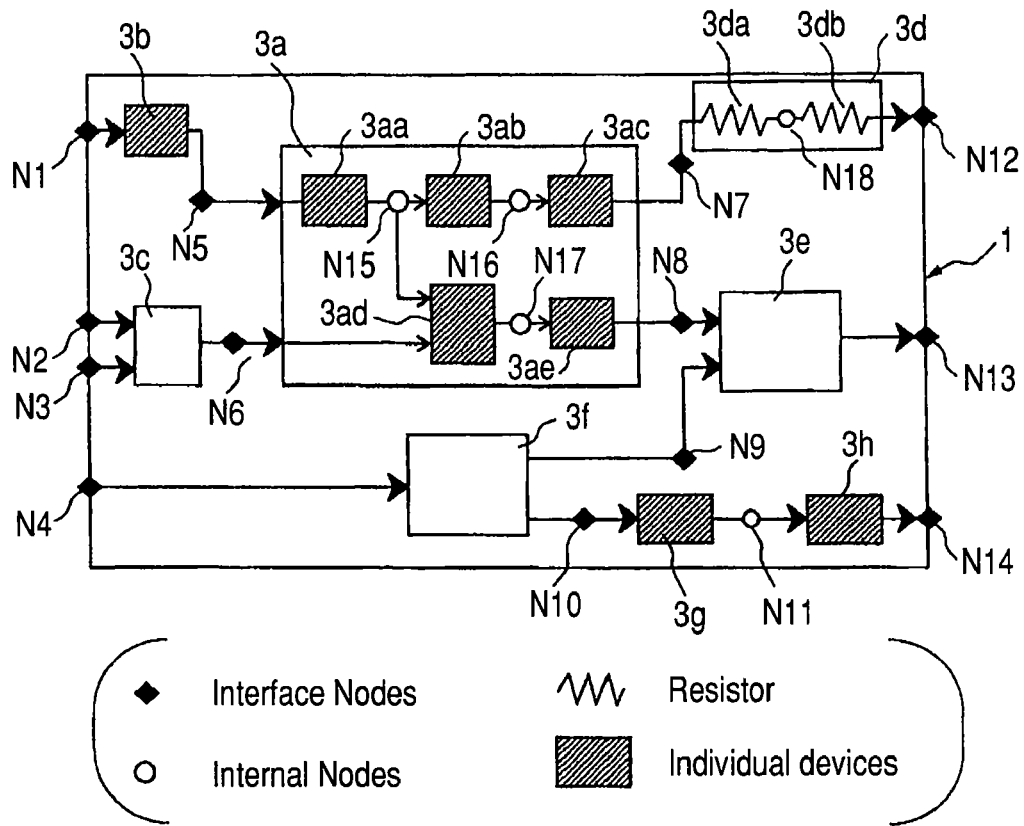
FIG. 1 is a conceptual diagram showing the concept as the basis for a simulation method according to the invention together with an example of result output division.

FIG. 1 shows the concept as the basis for a simulation method according to the invention together with an example of result output division.

In FIG. 1, reference numeral 1 denotes a circuit under simulation specified by design data. When a circuit simulation is performed, input waveform information is supplied to a signal terminal or a circuit to be specified. An initial circuit state is determined by solving a nonlinear equation and a circuit matrix based on the initial information. At this time, initial values for all circuit nodes are determined. Based on the initial circuit state, the nonlinear equation and the circuit matrix are solved through the input waveform information. While the circuit state is determined, transient waveform data for a circuit node is found. Data to be saved is result data for the circuit node specified as the result output node. The circuit node for saving result data is limited to an interface node between a higher-level hierarchy and a lower-level hierarchy in hierarchized circuit data (hierarchical circuit data). In FIG. 1, various rectangular areas 3a through 3h and 3aa through 3ae in the circuit area 1 represent areas for the hierarchical circuit data. The example provides no detailed distinction between hierarchy levels. The shaded circuit areas (individual devices) 3aa through 3ae, 3b, 3g, and 3h represent circuit areas for unit elements or unit devices. These are defined as hierarchized minimum unit areas. A circuit area represented by 3a or 3c is defined to be a subcircuit, i.e., a circuit area further having a lower-level hierarchy. A circuit area 3d exemplifies a circuit provided by serially connecting resistor elements 3da and 3db as minimum unit elements. In FIG. 1, N1 through N10 and N12 through N14 denote interface nodes between hierarchies. In FIG. 1, N11 and N15 through N18 denote internal nodes for which no result data is saved. Saving result data for the interface nodes also requires saving initial values of all the circuit nodes in the circuit under simulation 1. For example, let us suppose to obtain simulation results about the circuit nodes N15 through N17 in the circuit area 3a. In this case, the saved initial values are used to determine initial states of the circuit nodes N15 through N17 in the circuit area 3a. The saved result data is used to determine states of the interface nodes N5 through N8 interfaced with the circuit area 3a. In this manner, the circuit area 3a can be partially simulated under the initial condition equivalent to that used for simulating the entire circuit under simulation 1. The partial simulation can be used to display result data obtained for the circuit nodes N15 through N17 in the circuit area 3a. The partial simulation can be reexecuted for internal circuit nodes in the other circuit areas 3c through 3f as needed to display a result. The simulation for such data not-saving internal nodes is also referred to as "on-the-fly simulation." This signifies the simulation for immediately restoring information to be displayed when a result needs to be displayed.

Figure 2:
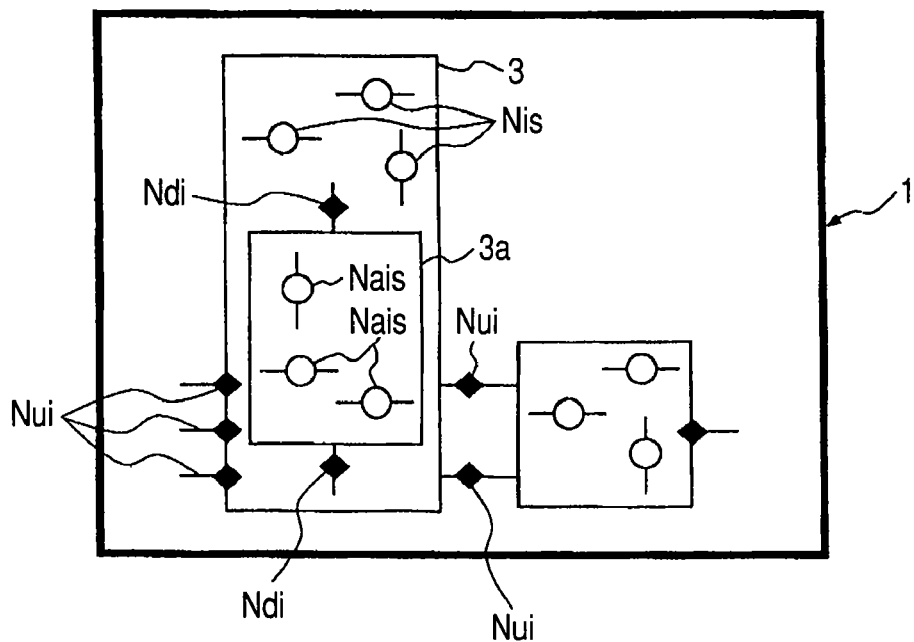
FIG. 2 is a principle diagram further showing the concept of the simulation method according to the invention.

FIG. 2 further schematically shows the concept of the simulation method according to the invention. The circuit under simulation 1 includes an area 3 for hierarchical circuit data. For the area 3, the method saves simulation result data for an interface node Nui interfaced with a higher-level hierarchy and simulation result data for an interface node Ndi interfaced with a lower-level hierarchy. In principle, the method does not save simulation result data for an internal node Nis in the area 3. Let us focus on the area 3a for hierarchical circuit data. The method saves simulation result data for the interface node Ndi interfaced with a higher-level hierarchy. In principle, the method does not save simulation result data for an internal node Nais in the area 3a. Simulation result data for saving an interface node is also referred to as saved result data. Simulation result data for not saving an interface node is also referred to as result data that are not saved.

Figure 3:
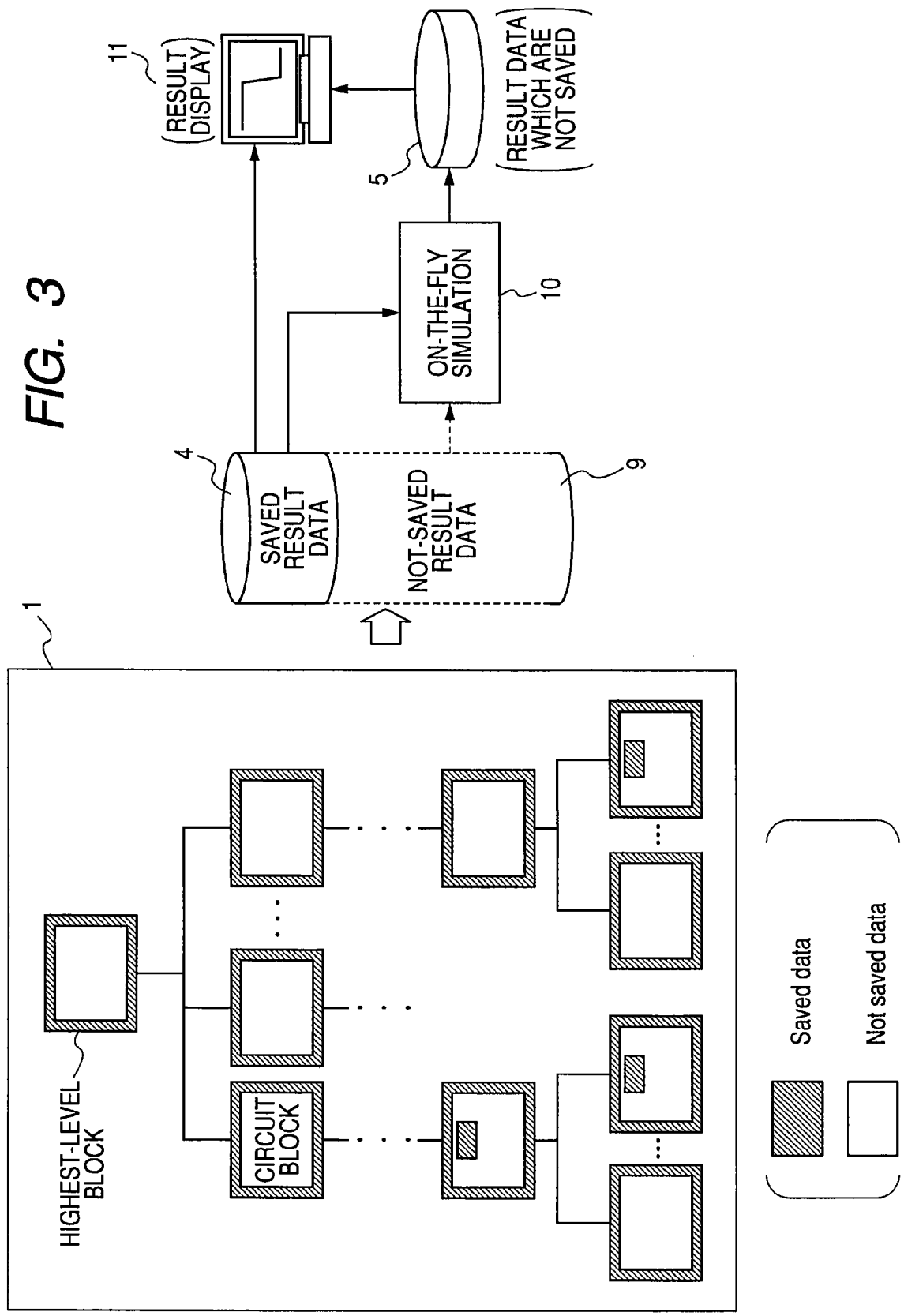
FIG. 3 is a principle diagram showing the principle of the simulation method according to the invention in terms of a hierarchical structure of hierarchical circuit data.

FIG. 3 shows the principle of the simulation method according to the invention in terms of a hierarchical structure of hierarchical circuit data. The circuit under simulation 1 is defined by hierarchized circuit blocks. The circuit blocks are hierarchized from the highest to the lowest. Saved result data 4 and result data 9 that is not saved are available for each circuit block from the highest to the lowest block. In each block, a shaded portion signifies an interface node corresponding to saved result data. The other portions signify internal nodes. There may be a display request for an internal node corresponding to result data that is not saved by the simulation. In response to such display request, a display unit 11 may be used to display the result data 5 obtained by the on-the-fly simulation 10.

As clearly understood from FIG. 3, the simulation method decreases the amount of simulation result data to be saved. For a node with no result data saved, it is possible to use the simulation method of displaying the result data 5 obtained by the on-the-fly simulation 10 as needed. Even though the storage capacity required is small, it is possible to achieve the data display performance equivalent to saving all the simulation result data for a large-scale simulation object such as a large-scale integrated circuit. Decreasing the amount of result data to be saved can shorten the time for retrieving result data.

After the saved result data 4 is obtained, a partial circuit modification or an element parameter modification may be made to the circuit under simulation 1. The following describes the method of obtaining a simulation result reflecting the modification.

Figure 4:
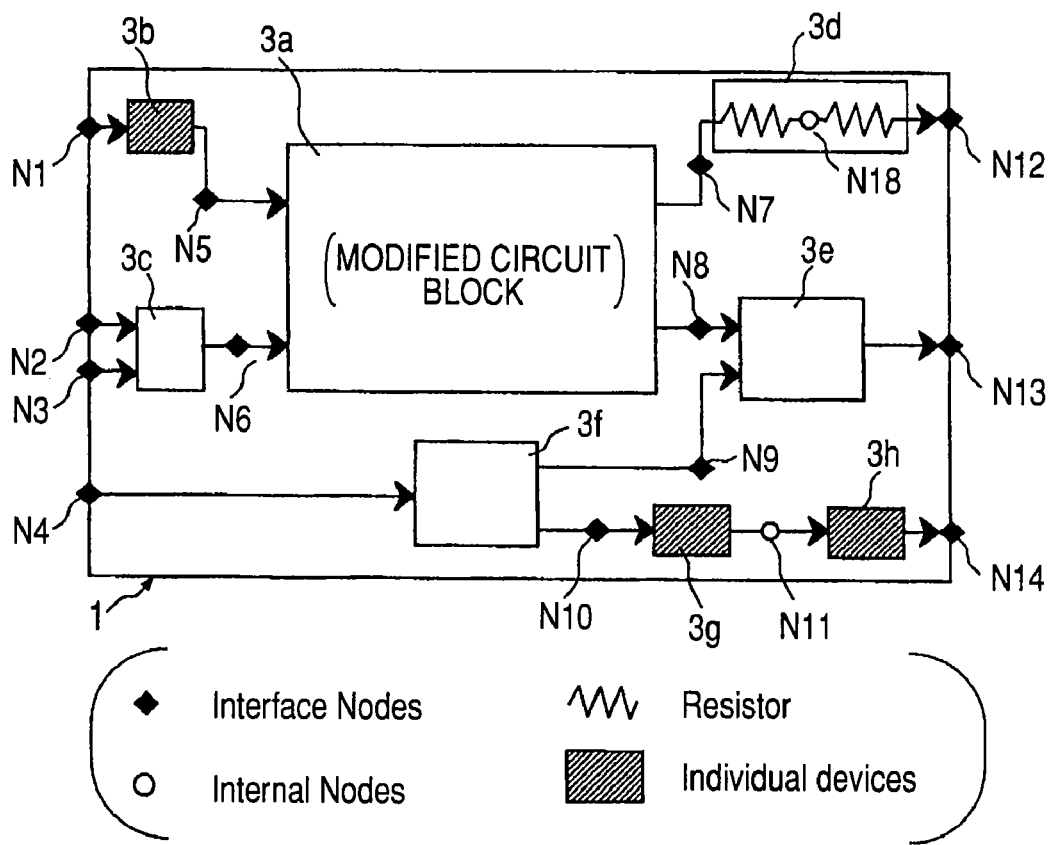
FIG. 4 is an explanatory diagram exemplifying a state where a circuit under simulation is subject to a partial circuit modification or an element parameter modification.

FIG. 4 exemplifies a state where a circuit under simulation is subject to a partial circuit modification or an element parameter modification. In FIG. 4, for example, the circuit area 3a is modified. Before this modification, it is assumed that the circuit under simulation is simulated to already save result data for the interface nodes N1 through N10 and N12 through N14. The modification made to the circuit area 3a influences circuit nodes N7, N8, N12, and N13 receiving output from the circuit area 3a downstream along the signal propagation and influences circuit nodes in the circuit areas 3d and 3e.

Figure 5:
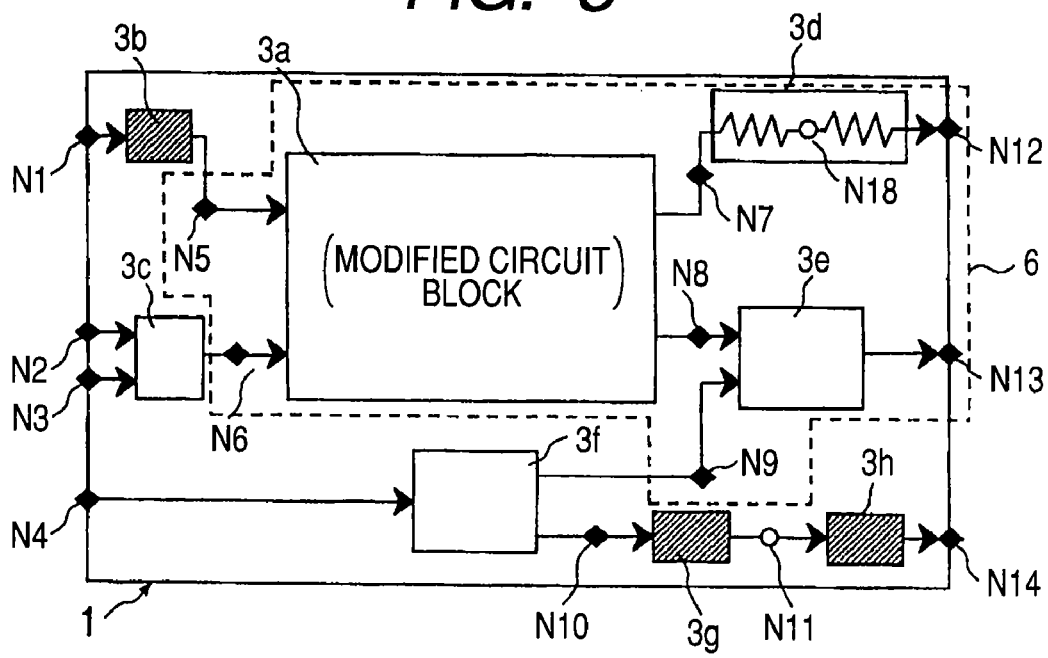
FIG. 5 is an explanatory diagram exemplifying a method of providing a simulation result reflecting a partial circuit modification or an element parameter modification, if any.

FIG. 5 exemplifies a method of providing a simulation result reflecting a partial circuit modification or an element parameter modification, if any. When the saved result data 4 is obtained, a modification in the circuit area 3a influences the circuit nodes N7, N8, N12, and N13 receiving output from the circuit area 3a upstream along the signal propagation and the circuit nodes in the circuit areas 3d and 3e. Let us focus on an area influenced by such modification as indicated by reference numeral 6. The area includes an interface node for the circuit area to be modified and an interface node for another influenced circuit area. The simulation is performed for the circuit area 6 according to a technique similar to the on-the-fly simulation. The simulation uses the saved result data to determine states of the circuit nodes N5, N6, and N9 externally connected to the modified circuit area 3a. Based thereon, the simulation also determines an initial value for the internal node of the modified circuit area 3a. According to the modification in the circuit area 3a, the simulation determines initial values for the circuit nodes N7, N8, N12, and N13 receiving output from the circuit area 3a downstream along the signal propagation and for the circuit nodes in the circuit areas 3d and 3e. Concerning the circuit area 3e, the simulation also uses result saving data for the node N9. In this manner, the circuit area 6 can be partially simulated under the initial condition equivalent to that used for simulating the entire circuit under simulation 1. It is only necessary to replace result data obtained for the circuit nodes N7, N8, N12, and N13 in the area 6 with the result data for the circuit node before the modification.

Figure 6:
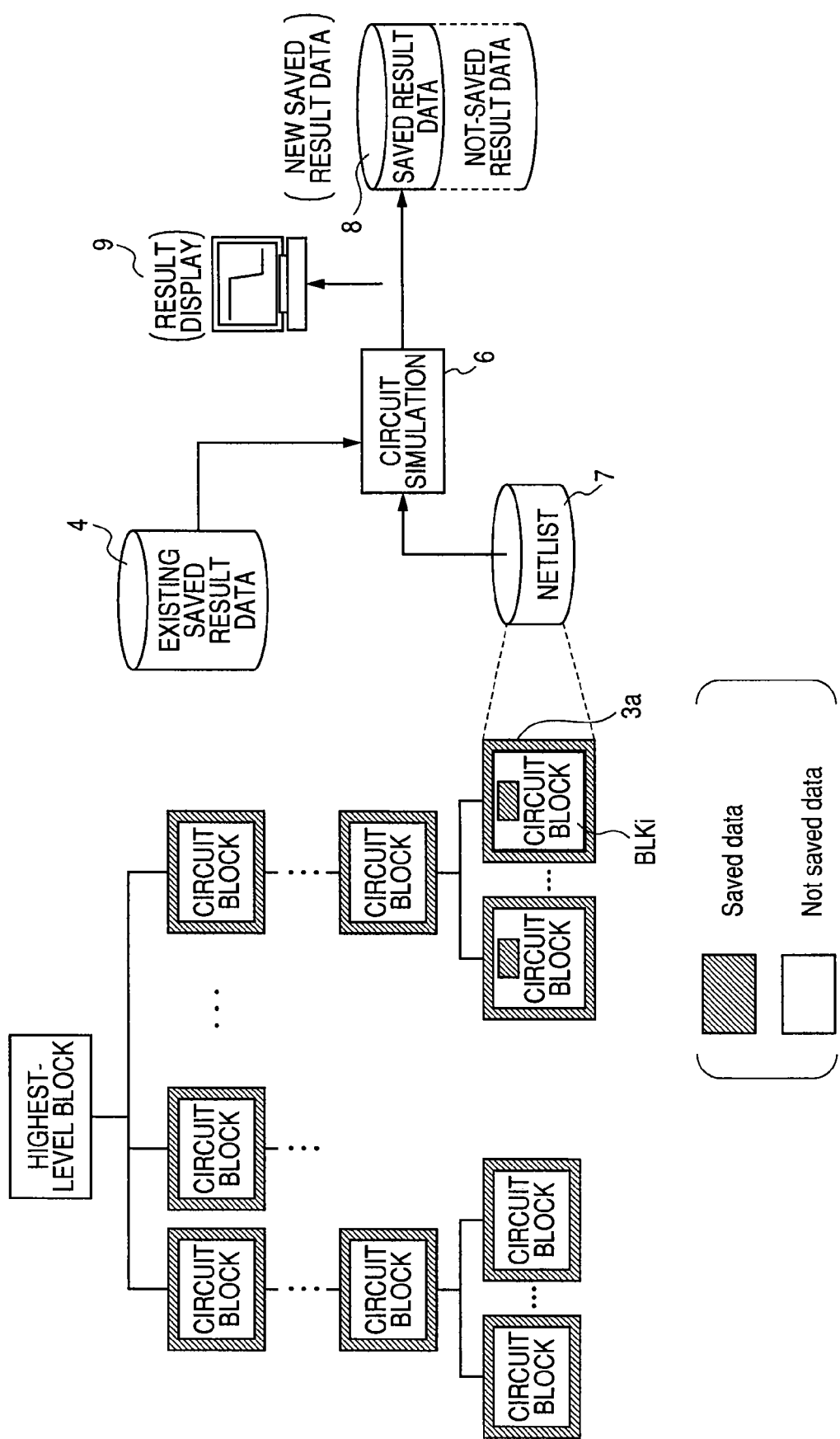
FIG. 6 is a principle diagram showing the principle of the simulation method for solving a partial modification in FIG. 5 in terms of the hierarchical structure of hierarchical circuit data.

FIG. 6 shows the principle of the simulation method for solving the partial modification in FIG. 5 in terms of the hierarchical structure of hierarchical circuit data. The inside of BLKi in FIG. 6 generically represents the circuit portion where the partial circuit modification or the element parameter modification is made to the circuit area 6. When the circuit simulation is performed using a netlist 7 for the area 6 and part of the saved result data 4, new saved result data 8 concerning the circuit area 6 is generated.

A technique similar to the on-the-fly simulation can be used to simulate the circuit area 6 that is influenced by the partial circuit modification or the like. Accordingly, the scale of a circuit to be simulated can be reduced. It is possible to shorten the re-simulation time for making a partial circuit modification or an element parameter modification to a large-scale circuit.

Figure 7:
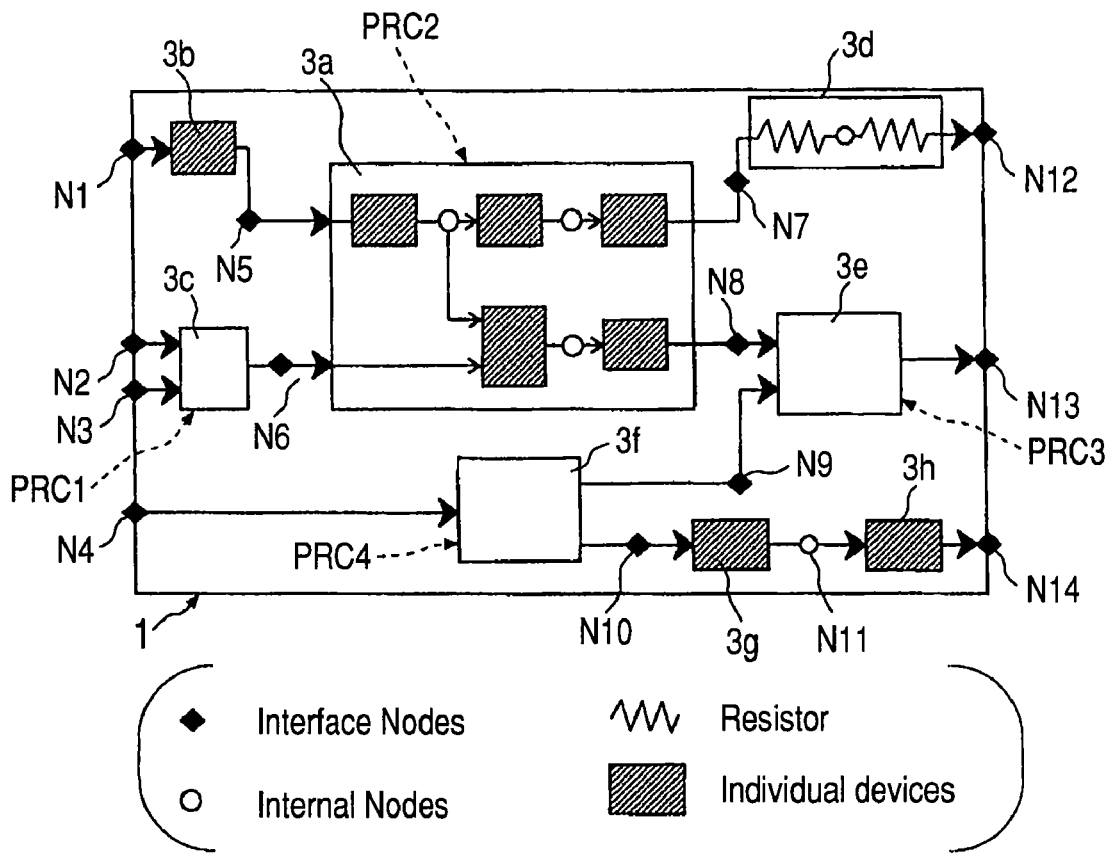
FIG. 7 is a conceptual diagram showing the concept of parallel processing of an on-the-fly simulation.

FIG. 7 exemplifies parallel processing of the on-the-fly simulation. When the on-the-fly simulation described in FIG. 1 is performed for multiple circuit areas, a simulator may simulate in parallel the circuit areas 3a, 3c, 3e, and 3f by means of parallel arithmetic processes PRC1 through PRC4. In this manner, it is possible to accelerate an arithmetic process and a display operation in response to a display instruction for multiple circuit areas.

Figure 8:
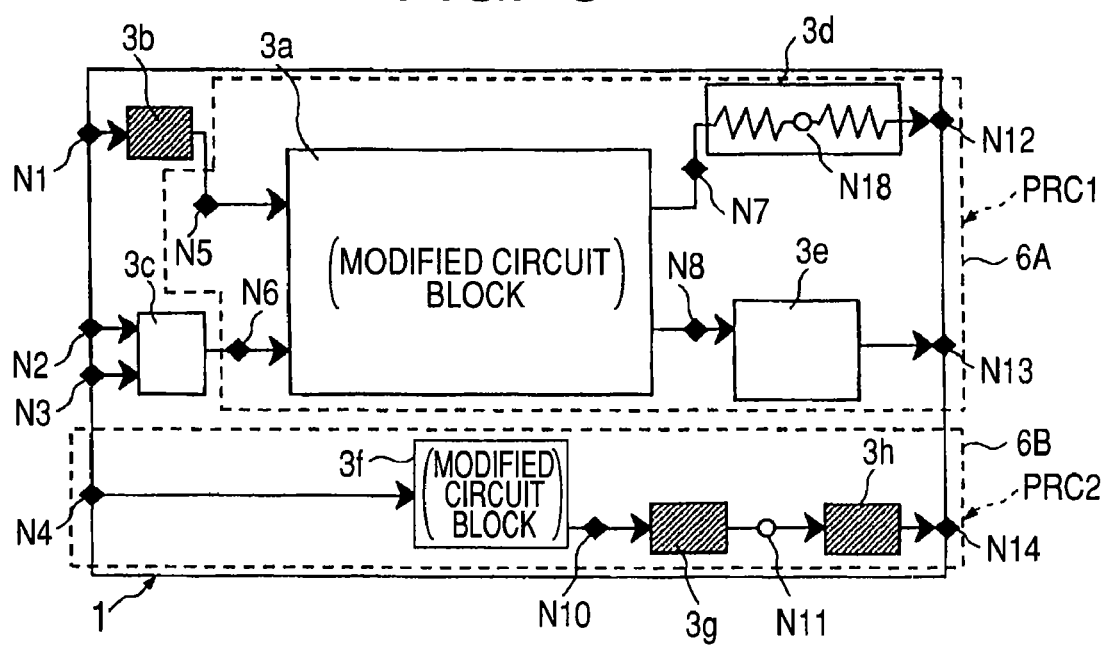

FIG. 8 exemplifies a parallel process for a simulation similarly to the on-the-fly simulation for a partial area due to a circuit modification or the like. Let us suppose that a partial circuit modification influences multiple partial areas 6A and 6B in FIG. 8. The simulator may parallel process the partial areas 6A and 6B using parallel arithmetic processes PRC1 and PRC2. Even when multiple circuit modification locations cover the partial areas 6A and 6B that share no signal path, the resimulation for the areas can be accelerated.

Figure 24:
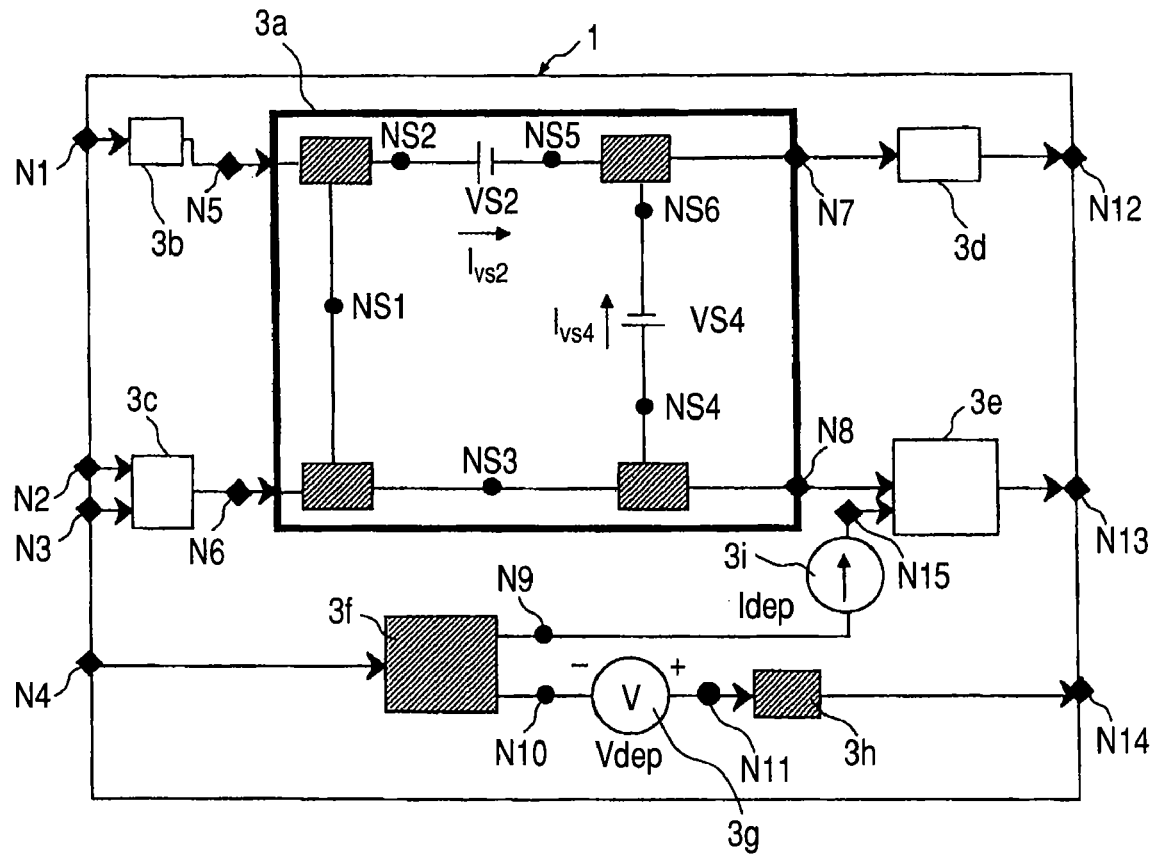
FIG. 24 exemplifies dependency in which result data from an internal node directly influences values of a current source and a voltage source.

The following describes a case of using data for an internal node or an element as result saving data. According to an example in FIG. 24, current value Idep of a current source 3i depends on voltage VNS3 of an internal node NS3 and current value IVS4 flowing through a voltage source VS4. Voltage Vdep for a voltage source 3g is a difference voltage between nodes N1 and N10. This voltage depends on voltage VNS1 for an internal node NS1 and current INS2 flowing through a voltage source VS2. Although the internal nodes NS1 and NS3 in the circuit area 3a are not interface nodes between higher and lower hierarchies, simulation result data for the internal nodes NS1 and NS3 and the voltage sources VS2 and VS4 as elements may determine values for a voltage source 3i and a current source 3g in another hierarchy. In this case, the simulation also saves simulation result data for the internal nodes NS1 and NS3 and the voltage sources VS2 and VS4. The above-mentioned hierarchical simulation is available despite such dependency that a simulation result from an internal node or an element such as the voltage source in a given hierarchy determines a value for a voltage source or a current source in another hierarchy.

The simulation method described with reference to FIG. 1 will be more specifically described.

Figure 9:
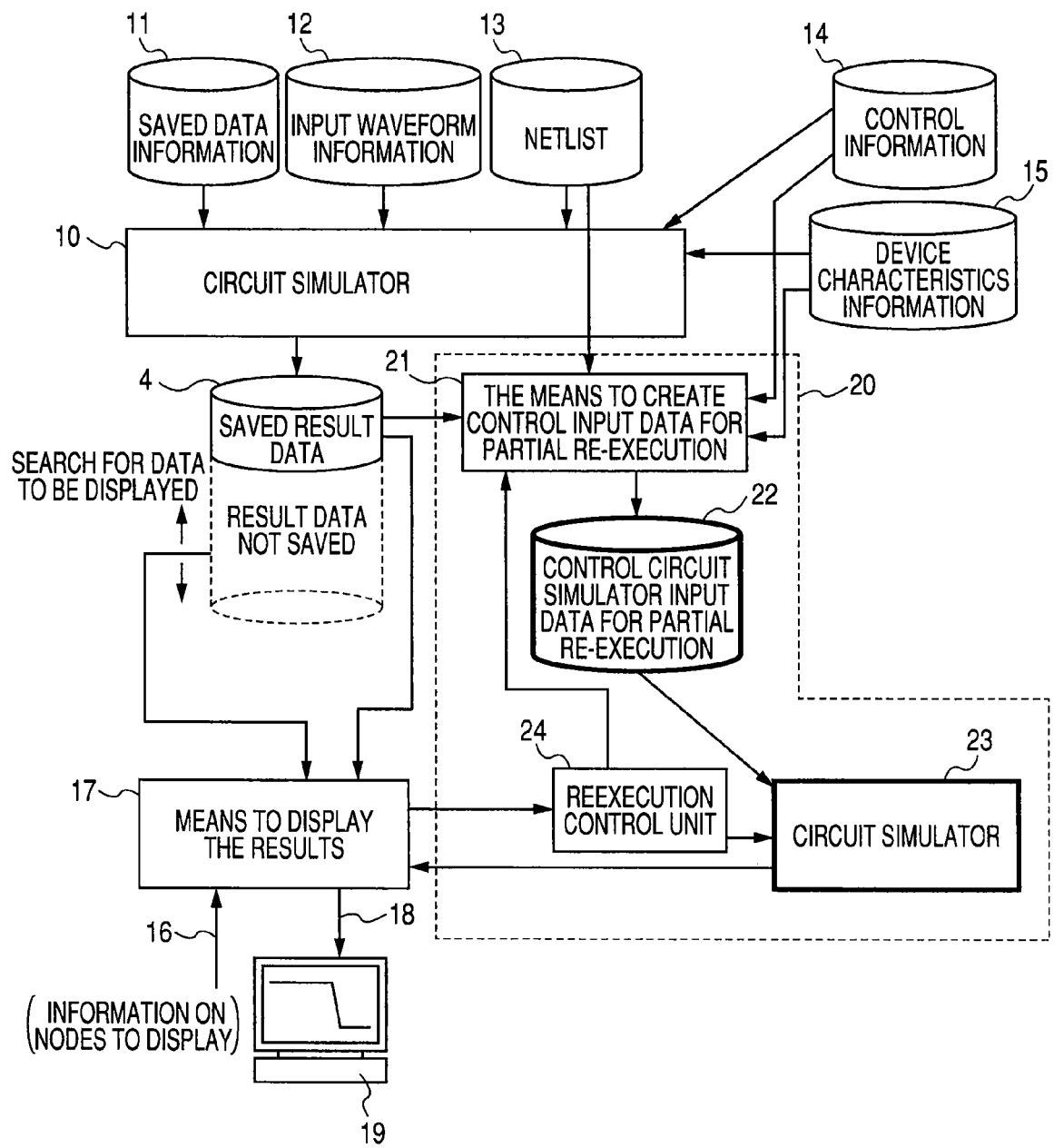
FIG. 9 is a system diagram exemplifying a data processing system for implementing the simulation method according to the invention.

FIG. 9 exemplifies a data processing system for implementing the simulation method according to the invention. A netlist 13 provides hierarchical circuit data for specifying a circuit under simulation. Information 11 on which data to save is used for determining a circuit node to be extracted as a result output node from the hierarchical circuit data. For example, the information 11 on which data to save is used to distinguish an interface node from an internal node. Input waveform information 12 prescribes a signal terminal specified by hierarchical circuit data or a signal waveform supplied to a circuit node. The input waveform information 12 or the like determines an initial value and external input stimuli for the circuit nodes in the circuit under simulation. Device characteristics information 15 signifies device model parameters for prescribing circuit characteristics of a circuit element specified by hierarchical circuit data. Control information 14 signifies the other control information for controlling operations of a circuit simulator 10 to perform simulation. The circuit simulator 10 is supplied with the information 11 on which data to save, the input waveform information 12, the netlist 13, the control information 14, and the device characteristics information 15. As described in FIG. 1, the circuit simulator 10 performs a circuit simulation using a result output node that is a higher-level circuit node provided with hierarchical circuit data. The circuit simulator 10 saves simulation results as the saved result data 4.

When supplied with display node specification information 16, simulation result display control means 17 retrieves whether or not the saved result data 4 contains the circuit node specified by the information. When the specified circuit node is contained, the result display control means 17 controls a display 19 to display data for the retrieved circuit node as result waveform information 18.

When the saved result data 4 does not contain data for the circuit node specified by the display node specification information 16, the on-the-fly simulation is performed and the display 19 displays waveform information about the necessary circuit node. This process is controlled by partial circuit simulation control means 20 that controls the on-the-fly simulation and the like. When the saved result data 4 does not contain data for the specified circuit node, a re-execution control unit 24 allows the means to create control input data for partial re-execution 21 to generate information needed for the circuit simulation that uses the circuit node as a result output node. To do this, the re-execution control unit 24 references the netlist 13, the control information 14, the device characteristics information 15, and the saved result data 4. Generated control circuit simulator input data for partial re-execution 22 includes, for example, saved information for the nodes N5 through N8 for partially simulating the circuit area 3a in FIG. 1, initial value information about the circuit nodes N15 through N17 in the area 3a, logic constitution information, characteristics information about a device constructing the logic, and the like. These pieces of information are converted into a format the simulator can process. A circuit simulator 23 uses the control circuit simulator input data for partial re-execution 22 to perform a simulation to generate waveform data for the specified result output node. The generated waveform data is displayed on the display 19 via the result display control means 17. Though not shown in the drawings, a conventional simulation system performs a simulation using circuit nodes for the entire circuit to be simulated as result output nodes. The system produces the total amount of data including the saved result data 4 and the result data that is not saved in FIG. 9 without distinction. The conventional simulation system lacks means for providing partial circuit simulation control based on the on-the-fly simulation control as shown in FIG. 9. When there is no waveform information about a circuit node specified by a display instruction, the system simply returns an error response to the instruction.

Figure 10:
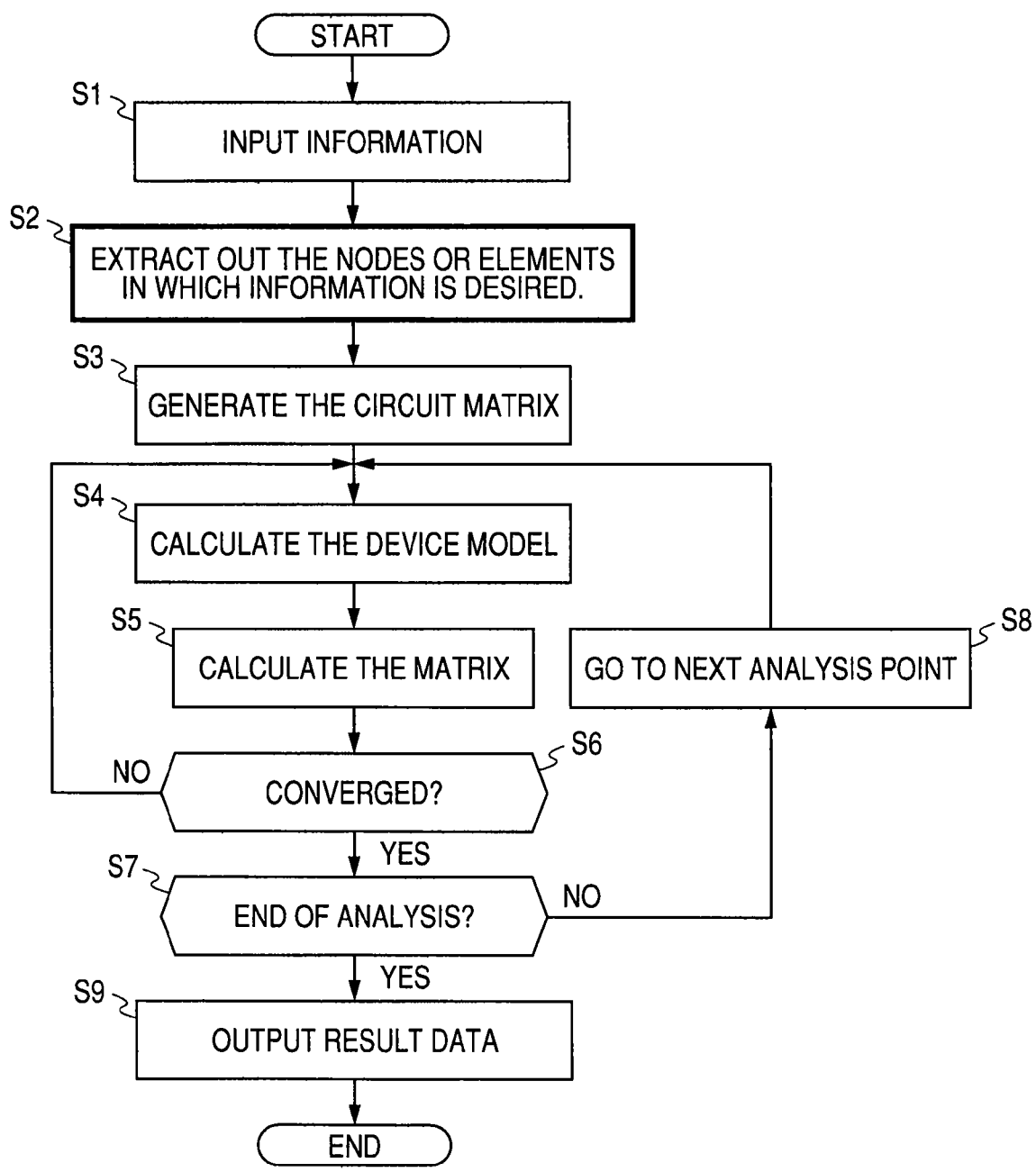
FIG. 10 is a flowchart showing a circuit simulation process of a circuit simulator in FIG. 9.
Figure 11:
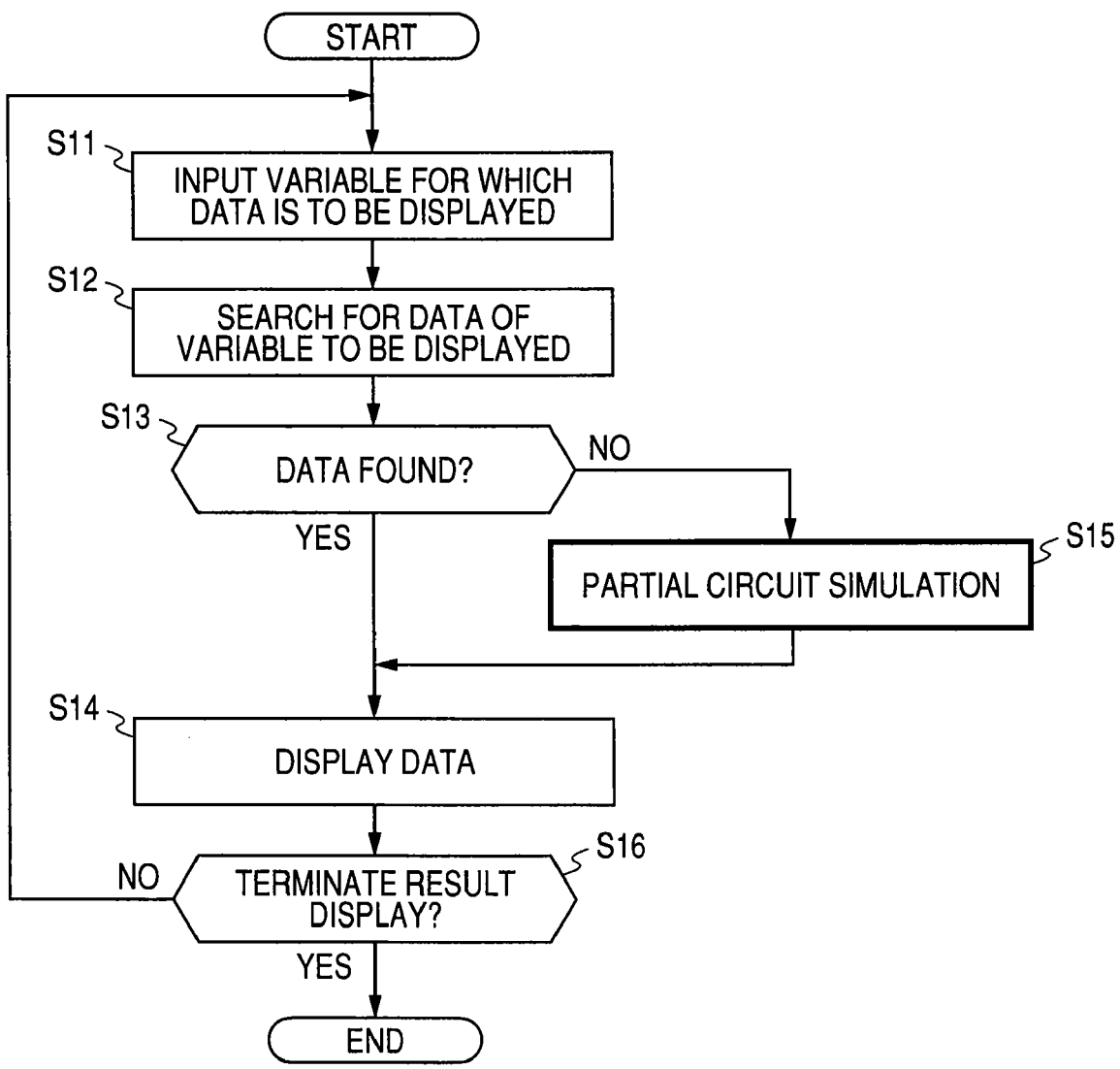
FIG. 11 is a flowchart showing control over displaying a simulation result by result display control means and partial circuit simulation control means in FIG. 9.

FIG. 10 exemplifies a circuit simulation process flow of the circuit simulator 10 in FIG. 9. The process is supplied with necessary information such as the netlist 13 (S1). Based on the supplied information, the process extracts a circuit node in the specified hierarchy from a circuit node under simulation and specifies the extracted circuit node as a result output node (S2). As result output nodes, the process extracts not only interface nodes, but also internal nodes which are used directly by other circuit areas such as for dependent voltage and current sources. Based on the supplied information, the process generates a circuit matrix for the simulation (S3), calculates a device model (S4), and calculates a matrix (S5). The process then determines whether or not solutions are converged according to the Newton-Raphson method (S6). The above-mentioned process is repeated until the convergence is obtained within a specified error range. The converged value is assumed to be one value in a transition state of the result output node at the time. The process repeats the model calculation, the matrix calculation, and the convergence determination (S7 and S8) until the analysis is complete for all the result output nodes. The process outputs (S9) and saves result data supplied from these steps to the result output nodes FIG. 11 exemplifies a flowchart showing control over displaying a simulation result by the result display control means 17 and the partial circuit simulation control means 20 in FIG. 9. The process is supplied with a variable for which data is to be displayed indicating the circuit node specified by the information 16 on nodes to display (S11). The process searches data of variable to be displayed (S12). The process determines whether or not the corresponding result data is available (S13). When the corresponding result data is available, the process displays the data (S14). Where no corresponding result data is available, the partial circuit simulation control means 20 performs a partial circuit simulation process (S15). The obtained result data is displayed (S14). The above-mentioned process steps are repeated to control the result display until the termination of result display is specified (S16).

Figure 12:
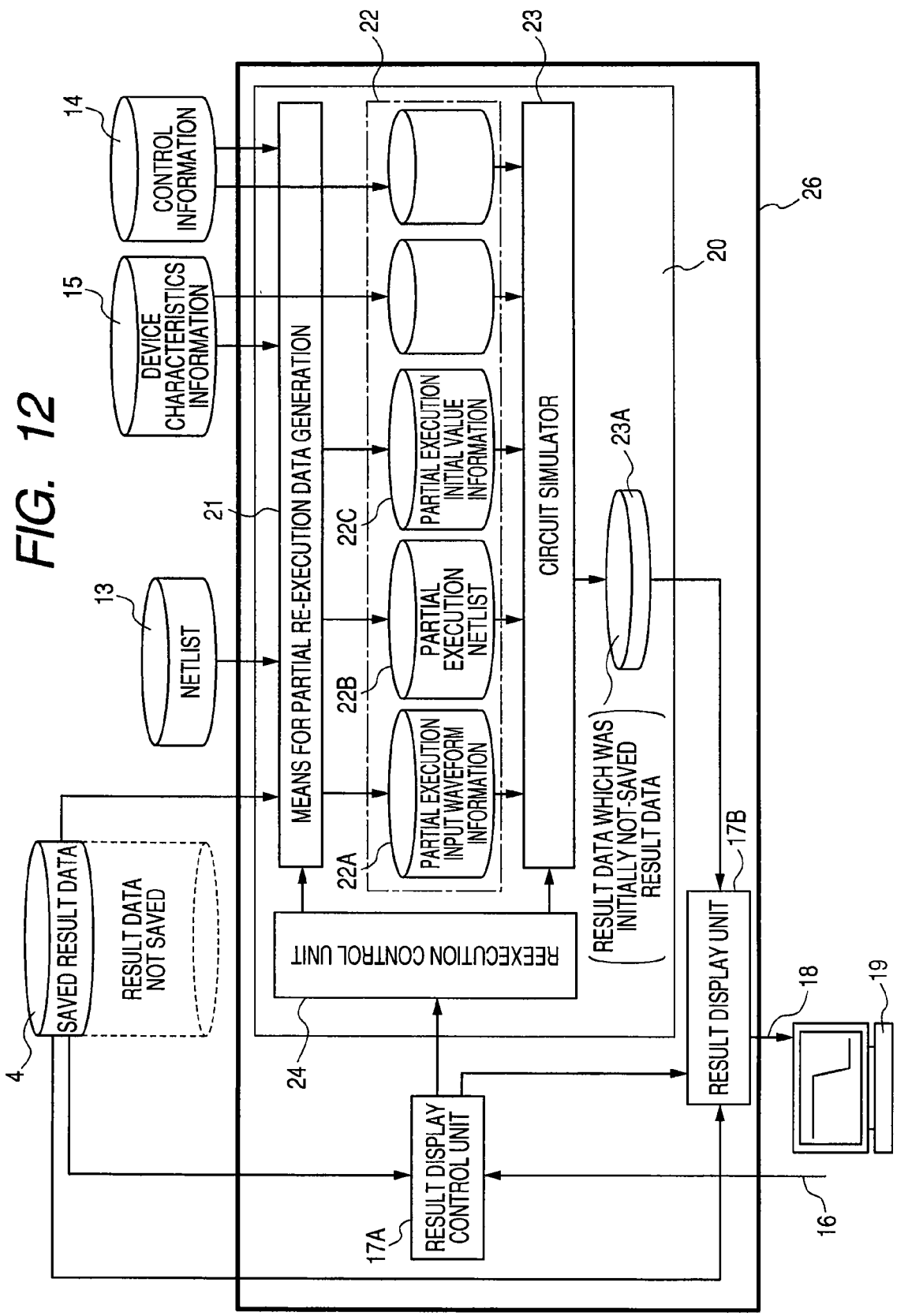
FIG. 12 is a system diagram exemplifying details of result display control means that includes the partial circuit simulation control means and the result display control means in FIG. 9 and has an on-the-fly simulation function.

FIG. 12 exemplifies details of result display control means 26 that includes the partial circuit simulation control means 20 and the result display control means 17 in FIG. 9 and has an on-the-fly simulation function. The partial re-execution data 22 generated by the means to create control input data for means for partial re-execution data generation 21 includes partial execution input waveform information 22A, a partial execution netlist 22B, and partial execution initial value information 22C. Let us assume that the on-the-fly simulation is to be re-executed for the circuit area 3a in FIG. 1. The partial execution input waveform information 22A provides information about the circuit nodes N5 through N8 in FIG. 1 included in the saved result data, for example. The partial execution netlist 22B specifies the circuit construction of the circuit area 3a in FIG. 1, for example. The partial execution initial value information 22C is saved with the simulation result data 4, for example, and concerns the circuit nodes N15 through N17 in the circuit area 3a. Result data 23A is information about one or more specific circuit nodes determined to be result data not saved by the circuit simulation using the partial re-execution data.

The following describes a process for extracting a result output node whose data is to be saved. This process corresponds to the result output node extraction process at Step S2 in FIG. 10.

Figure 13:
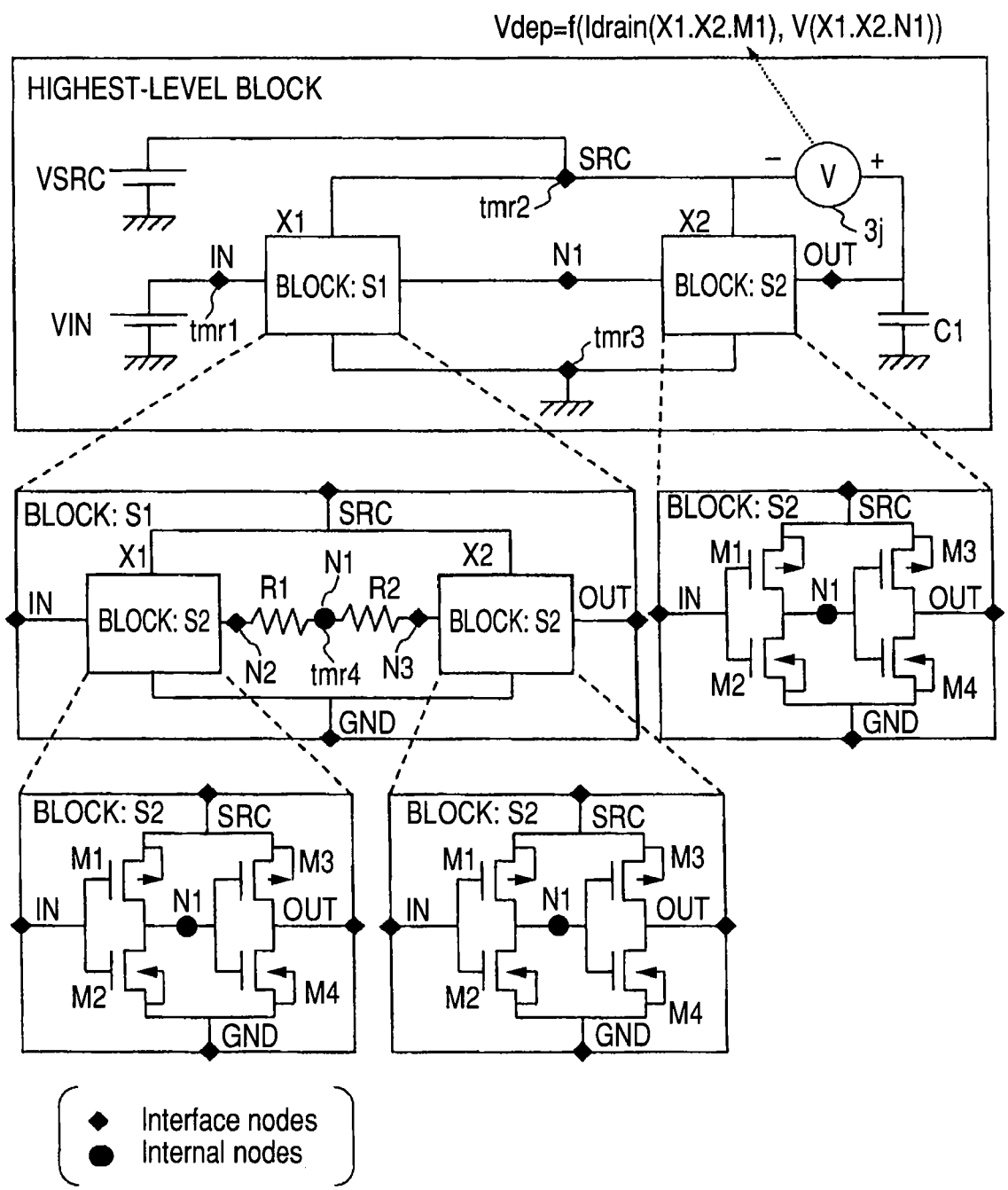
FIG. 13 is an explanatory diagram exemplifying a hierarchical structure of circuit data having a dependent voltage source where the value of the voltage of one block depends on the current or voltage of branches or nodes of other blocks (either interface or internal to the block)

FIG. 13 exemplifies a hierarchical structure of circuit data having a hierarchical structure (hierarchical circuit data). Symbol ● denotes an internal node in a circuit node included in a circuit block (also referred to simply as a block). Symbol ◆ denotes an interface node interfaced upstream or downstream in a circuit node included in the block. Specifically, the example also presents a case where a result data in the internal node directly affects another circuit area. For example, voltage source 3j in the highest-level block depends on states of an internal node and a circuit element of a block X2 in a lower block X1. Voltage Vdep of the voltage source 3j depends on drain current Idrain(X1.X2.M1) flowing through an element M1 of the block X2 in the block X1 and voltage V(X1.X2.N1) for a node N1 of the block X2 in the block X1. That is, the current Idrain(X1.X2.M1) signifies a drain current flowing through the element M1 of the block X2 in the block X1. The voltage V(X1.X2.N1) signifies a voltage for the node N1 of the block X2 in the block X1.

Figure 14:
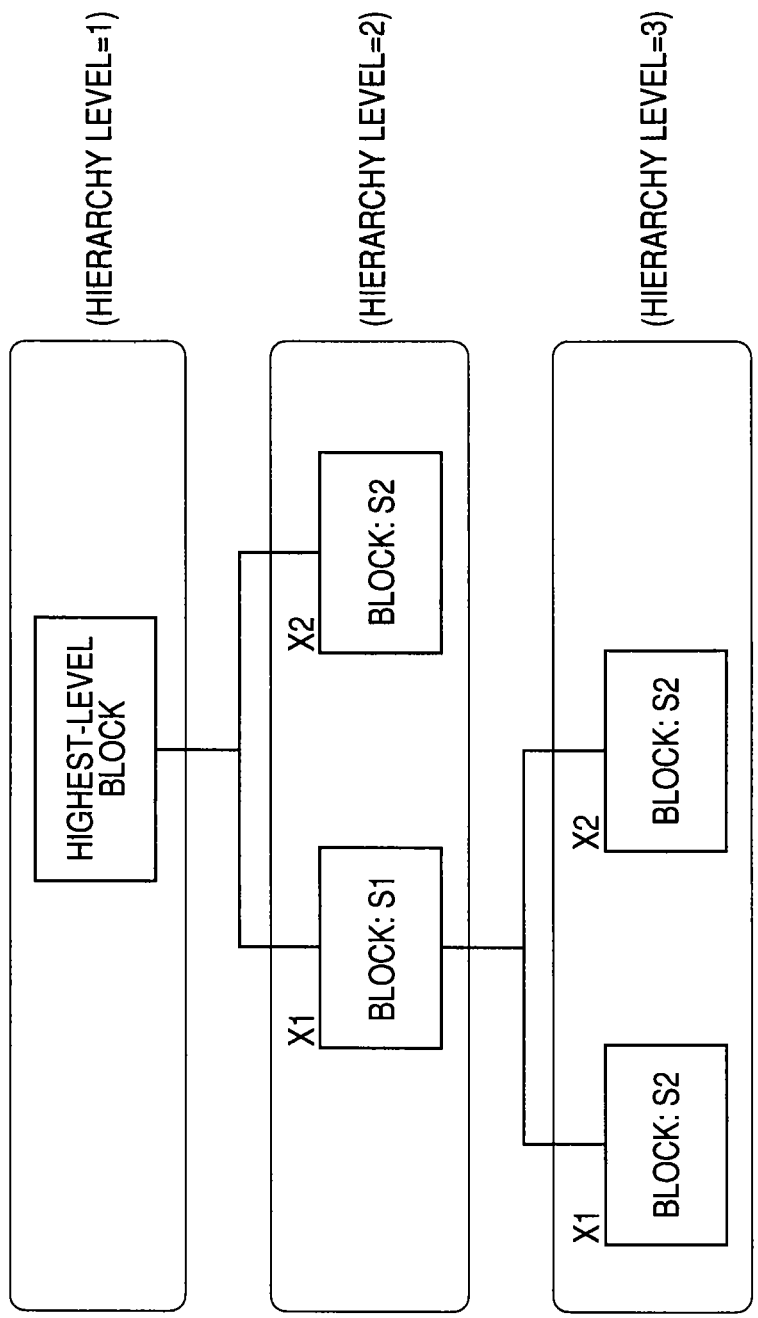
FIG. 14 is a schematic explanatory diagram showing relationship between a hierarchical structure and a hierarchical level for circuit blocks in FIG. 13.

FIG. 14 schematically shows the relationship between a hierarchical structure and a hierarchical level for circuit blocks in FIG. 13. According to FIGS. 13 and 14, the highest-level block references lower blocks S1 and S2. The block S1 at hierarchy level 2 references the block S2. The block S2 at circuit level 3 has no reference to lower blocks.

Figure 15:
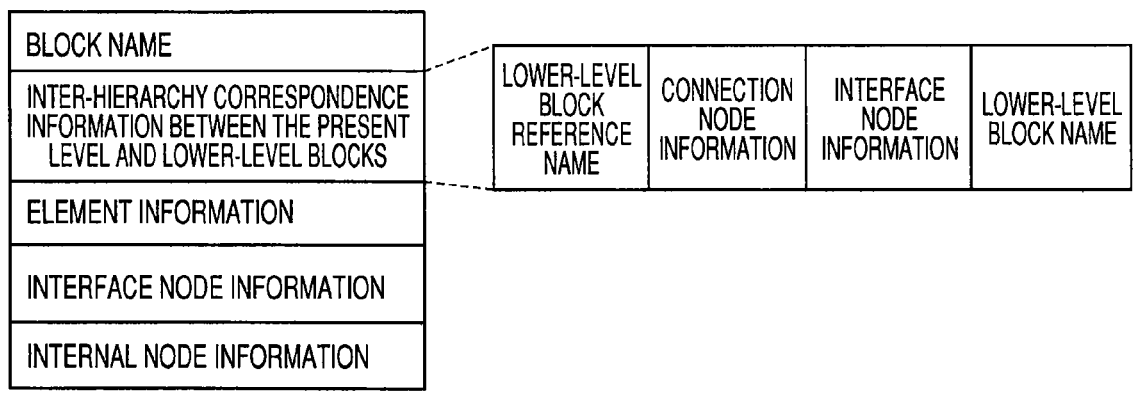
FIG. 15 is an explanatory diagram exemplifying information stored in a circuit block for each hierarchy in hierarchical circuit data.

FIG. 15 exemplifies information stored in a circuit block for each hierarchy in the hierarchical circuit data as described with reference to FIG. 3. The circuit block contains a block name, inter-hierarchy correspondence information between the present level and lower-level blocks, element information, interface node information, and internal node information. The inter-hierarchy correspondence information between the present level and lower-level blocks and the element information may or may not be needed. The inter-hierarchy correspondence information between the present level and lower-level blocks contains a lower-level block reference name, connection node information, interface node information, and a lower-level block name. For example, let us focus attention on the highest-level block in FIG. 13. The lower-level block reference name denotes the blocks X1 and X2 that define the reference. The lower-level block name denotes S1 referenced correspondingly to X1 and S2 referenced correspondingly to X2.

Figure 16:
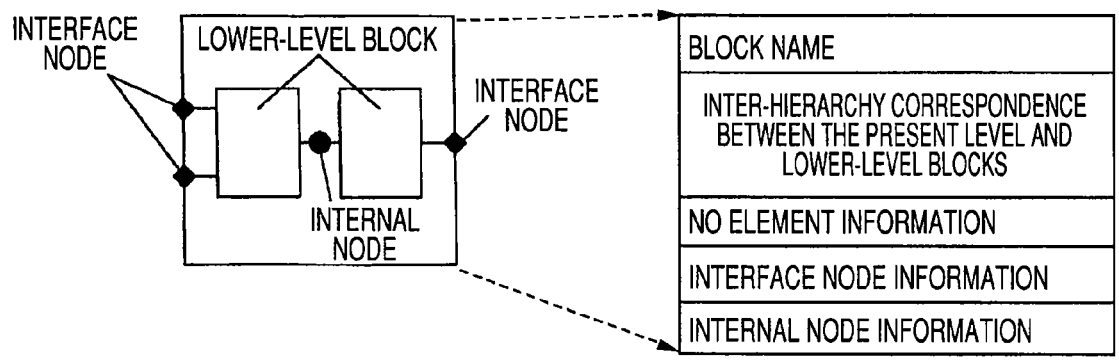
FIG. 16 is an explanatory diagram showing data modes for a circuit block including only lower-level blocks.
Figure 17:
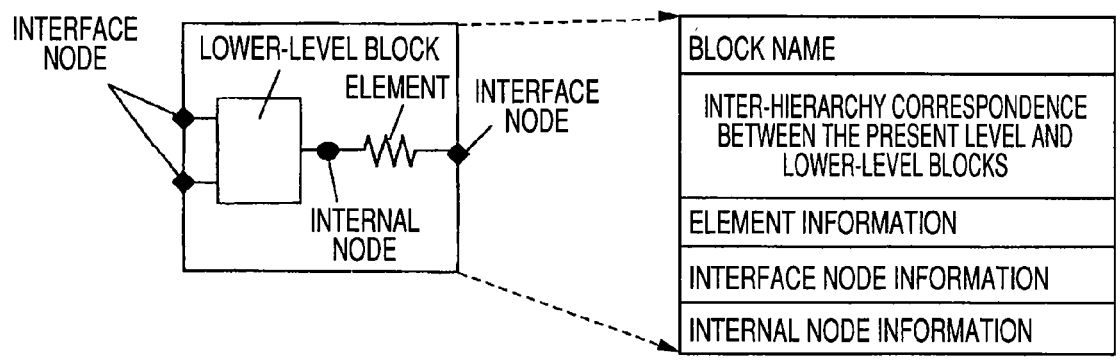
FIG. 17 is an explanatory diagram showing data modes for a circuit block including a lower-level block and an element.
Figure 18:
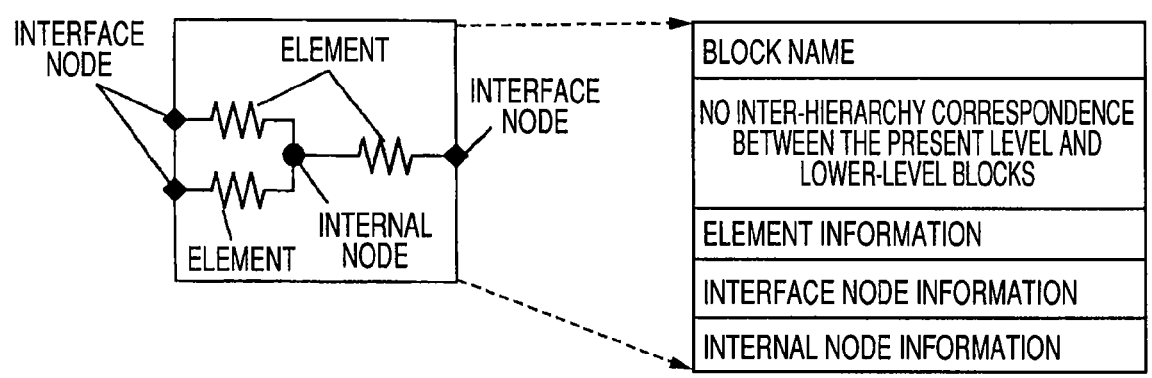
FIG. 18 is an explanatory diagram showing data modes for a circuit block including only elements.

The following describes modes of the circuit block. The circuit block modes include: a mode containing only lower-level blocks as shown in FIG. 16; a mode containing a lower-level block and an element as shown in FIG. 17; and a mode containing only elements as shown in FIG. 18. The element signifies a circuit component as the lowest concept. The element includes a transistor, resistor, capacitor, and mathematical element represented by a transfer function. The block is considered to be a set of multiple circuit elements. The circuit block in FIG. 16 has no element information as the circuit information. The circuit block in FIG. 18 has no inter-hierarchy correspondence information between the present level and lower-level blocks. The element is a unit element or a unit device (Individual Device) as described with reference to FIG. 1 and the like.

Figure 19:
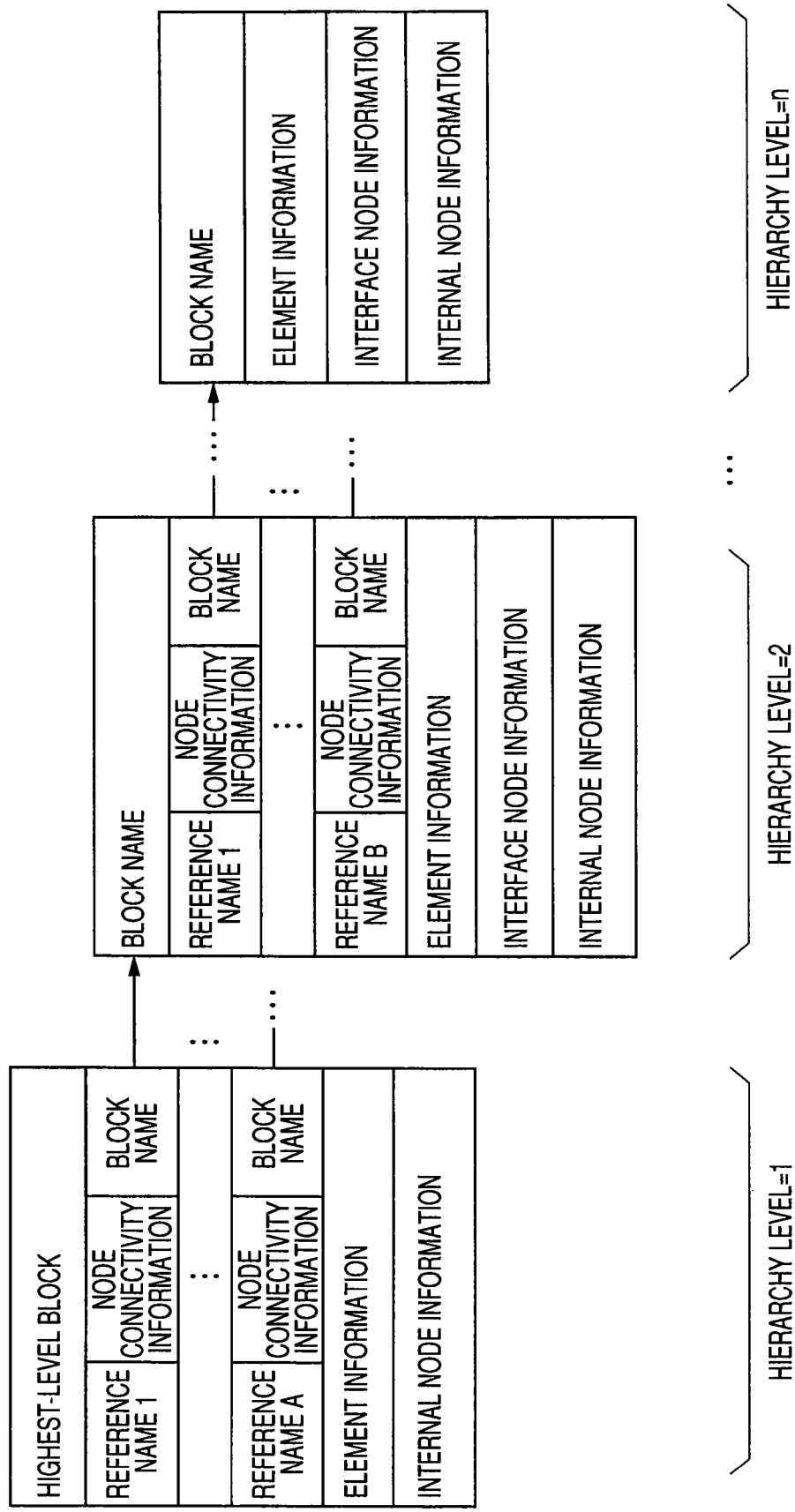
FIG. 19 is an explanatory diagram exemplifying a general data mode of hierarchized circuit block information and hierarchical levels for an entire circuit under simulation.
Figure 20:
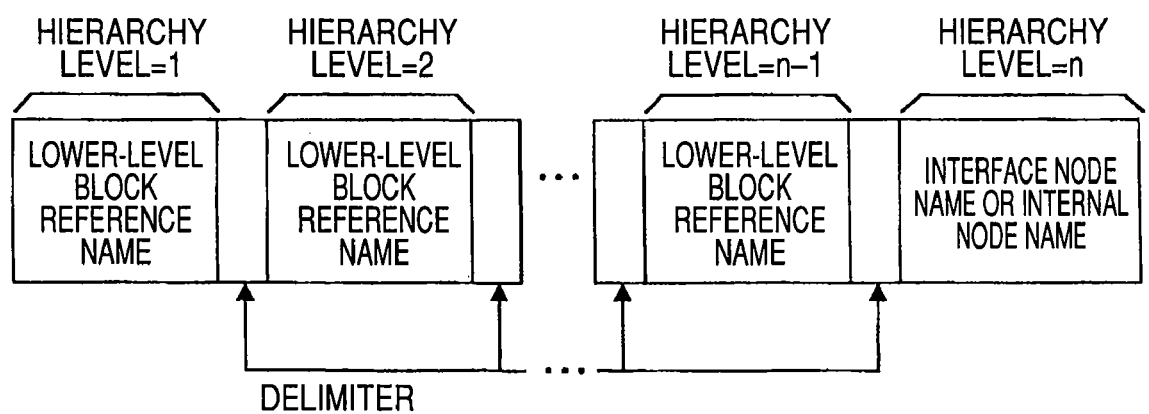
FIG. 20 is an information format diagram showing node information extracted from the circuit block information in the data mode as exemplified in FIG. 19.

FIG. 19 exemplifies a general data mode of hierarchized circuit block information and hierarchical levels for an entire circuit under simulation. The inter-hierarchy correspondence information between the present level and lower-level blocks is used to link circuit block information between hierarchy levels. Let us suppose to extract node information about an interface node and an internal node from the circuit block information in the data mode as shown in FIG. 19. In this case, an information format as shown in FIG. 20 is used but not limited thereto. The information format provides a node name including hierarchical information. The information format is categorized into hierarchy levels from the highest and is separated by a delimiter to provide a lower-level block reference name. The information format ends with an interface node name or an internal node name.

Figure 21:
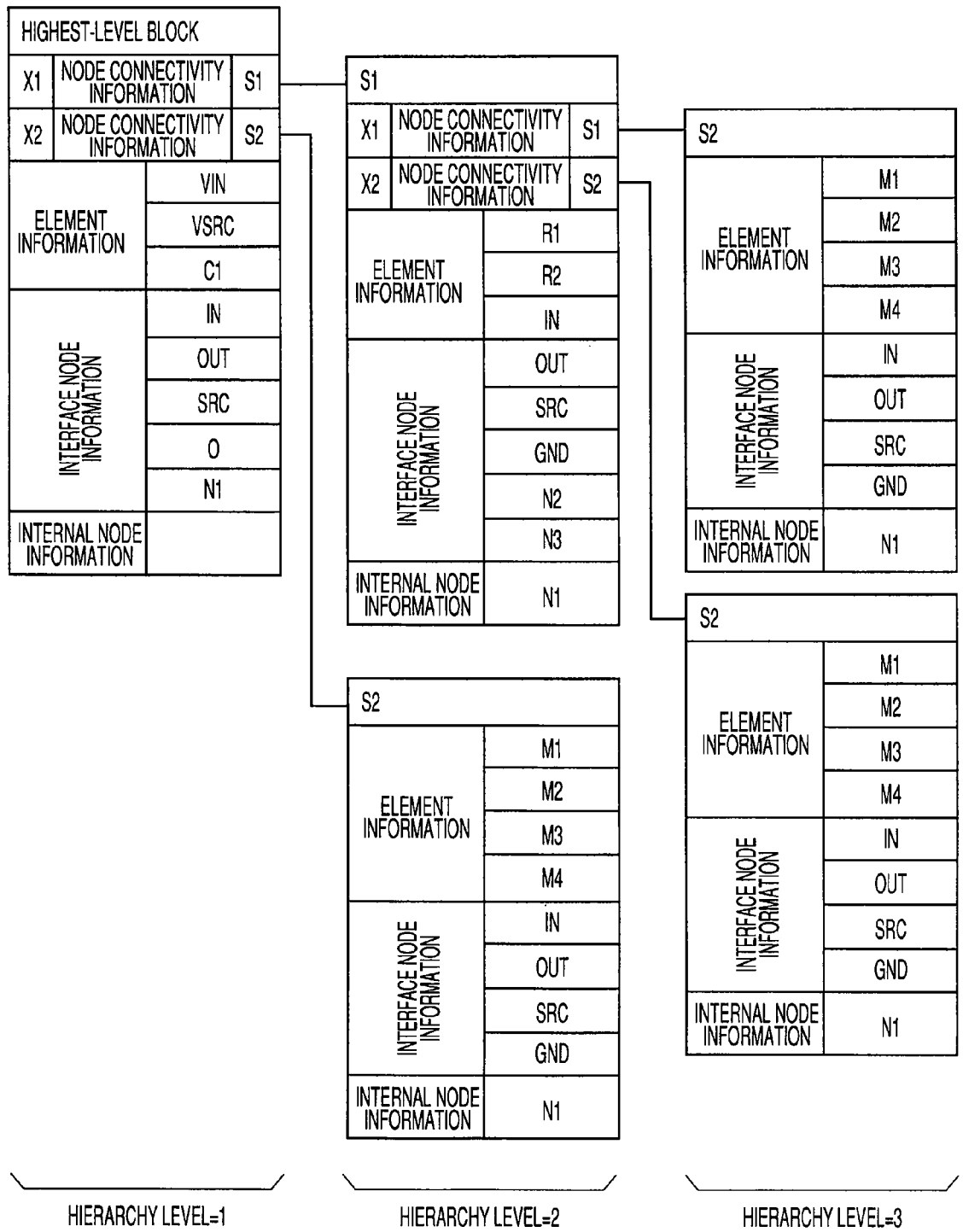
FIG. 21 is a data structure explanatory diagram exemplifying hierarchized circuit block information and hierarchical levels for the entire hierarchical circuit under simulation as exemplified in FIG. 13.

FIG. 21 exemplifies hierarchized circuit block information and hierarchical levels for the entire hierarchical circuit under simulation as exemplified in FIG. 13. FIG. 22 shows node names with hierarchical information indicative of node information about all externally and internally connected nodes extracted from the circuit block information in FIG. 21.

Figure 23:
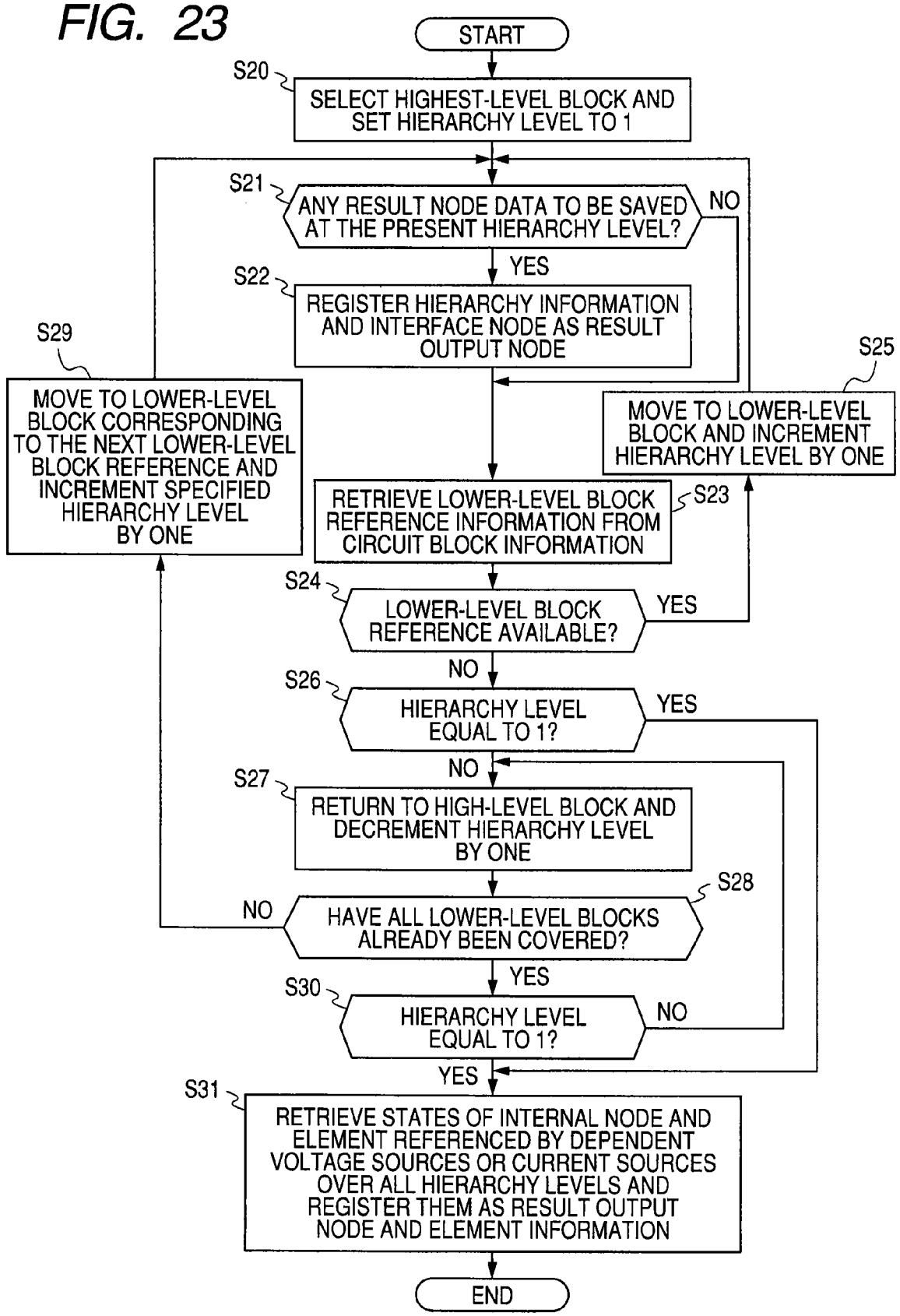
FIG. 23 is a control flowchart showing a result output node extraction process.

FIG. 23 exemplifies a control flowchart of the result output node extraction process. The process selects the highest-level block and sets the hierarchy level to 1 (S20). The process determines whether or not there is a result node data to be saved such as an interface node at the present hierarchy level (S21). When there is a node to be saved, the process registers it to the result output node using the hierarchy information about the specified hierarchy level and an internal node as the node name with hierarchical information (S22). After Step S22 or when it is determined at Step S21 that there is no result output node to be saved, the process retrieves lower-level block reference information from the circuit block information (S23). The process then determines the presence or absence of lower-level block reference (S24). When the lower-level block reference is available, the process moves to a lower-level block associated with the reference and increments the specified hierarchy level by one (S25). For the moved lower-level block, the process performs Steps S21 through S24 above. The above-mentioned process is repeated until the specified hierarchy level reaches a targeted hierarchy level or until there is no reference to a lower-level block.

When the reference to a lower-level block becomes unavailable, the process determines whether or not the specified hierarchy level is equal to "1" (S26). Otherwise, the process returns to one block higher than the specified hierarchy level and decrements the specified hierarchy level by one (S27). For the block at the specified hierarchy level, the process determines whether or not the reference to all lower-level blocks have been covered (S28). That is, the process determines whether or not there is another lower-level block reference to be linked to the lower level. When there is another lower-level block reference as a result of the determination, the process moves to a lower-level block corresponding to the next lower-level block reference and increments the specified hierarchy level by one (S29). The process then returns to Step S21 and repeats the succeeding steps. When it is determined at Step S28 that there is not another lower-level block reference to be linked to the lower level from that specified hierarchy level, the process determines whether or not the specified hierarchy level is equal to "1" (S30). Otherwise, the process returns to Step S27. The process is repeated until the specified hierarchy level is determined to be "1" at Step S26 or S30. Finally, the process retrieves states of lower-level internal nodes and elements referenced by dependent voltage sources or current sources over all the hierarchy levels. The process adds a retrieved node to the result output node and registers the state of a retrieved element as the element information (S31).

Figure 25:
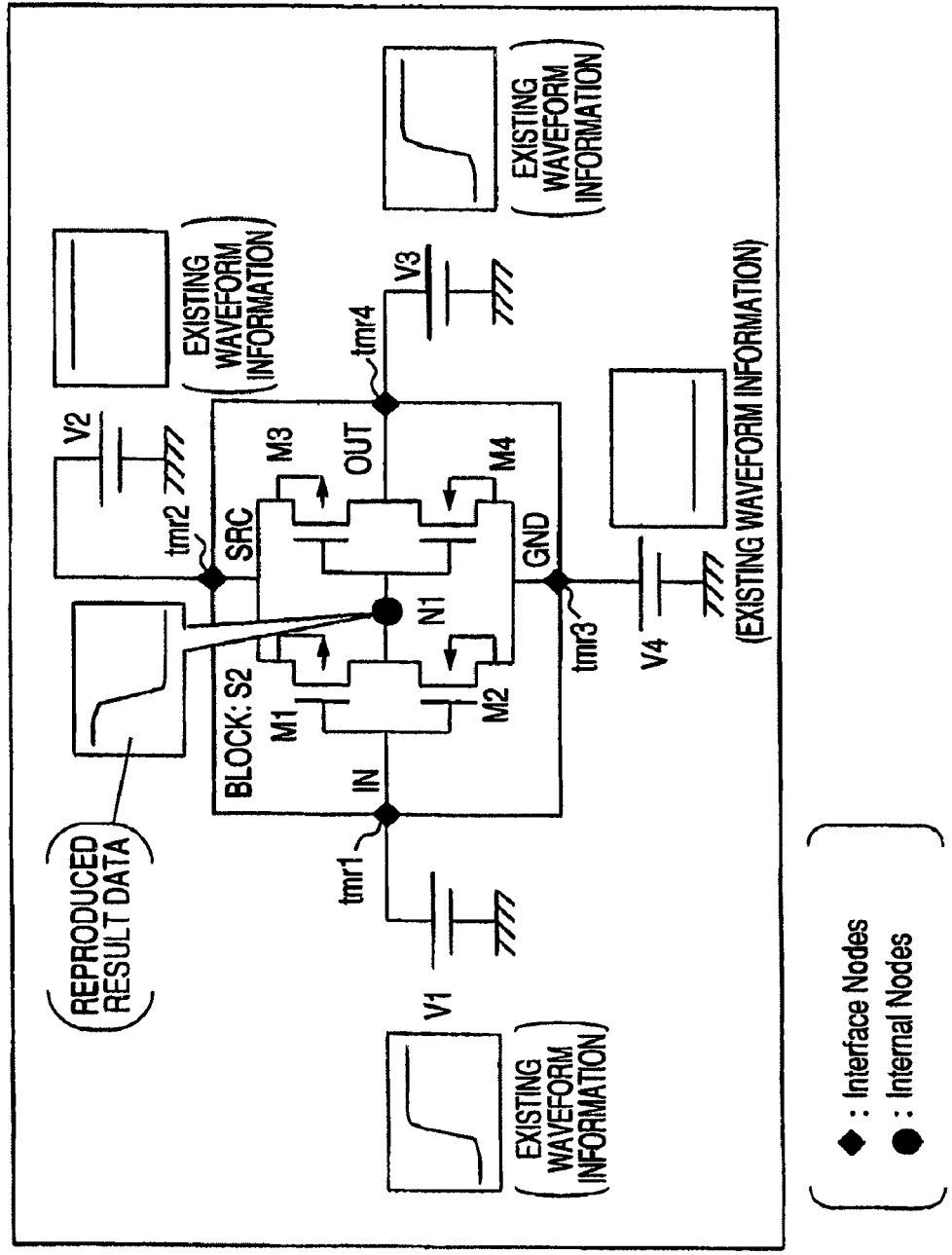
FIG. 25 is a conceptual diagram showing that the on-the-fly simulation generates a simulation result for a node with hierarchical information in the circuit of FIG. 13.

FIG. 25 exemplifies a conceptual diagram showing that the on-the-fly simulation generates a simulation result for node X1.X1.N1 with hierarchical information in the circuit of FIG. 13. Reference symbols tmr1, tmr2, tmr3, and tmr4 denote the corresponding nodes in FIG. 13. An existing waveform is specified by already saved result saving data for an interface node.

Figure 26:
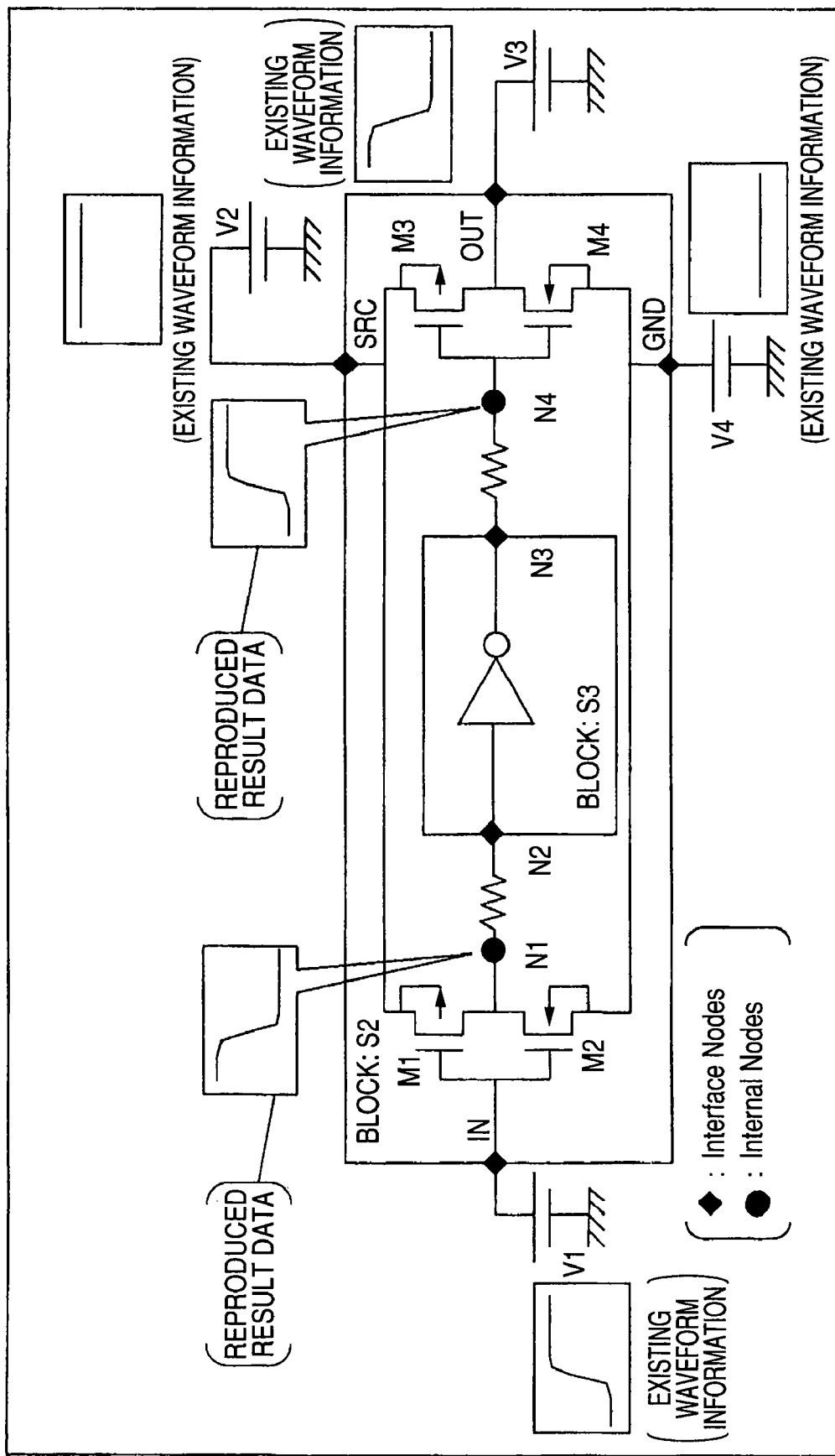
FIG. 26 is a conceptual diagram showing that the on-the-fly simulation generates a simulation result for an internal node when there is a lower level hierarchical block.
Figure 27:
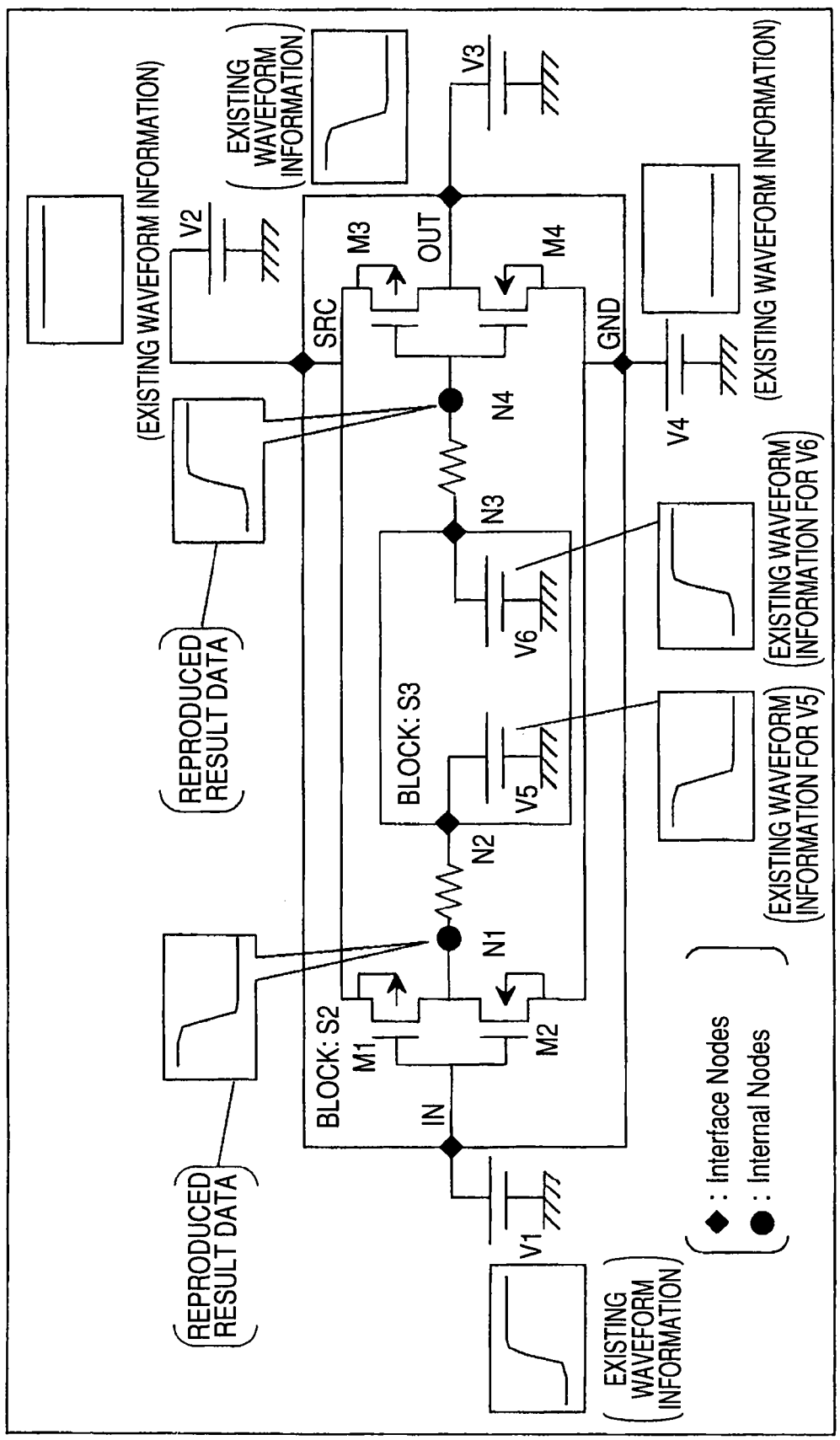
FIG. 27 is a conceptual diagram showing that the on-the-fly simulation generates a simulation result for an internal node when there is a lower level hierarchical block.

FIGS. 26 and 27 exemplify conceptual diagrams showing that the on-the-fly simulation generates simulation results for internal nodes N1 and N4 in another circuit with a lower level block. As exemplified in FIG. 27, nodes N2 and N3 in FIG. 26 are specified by simulation result data for the interface node to the lower-level block S3. The existing waveform is specified by already saved result saving data for the interface node.

Figure 28:
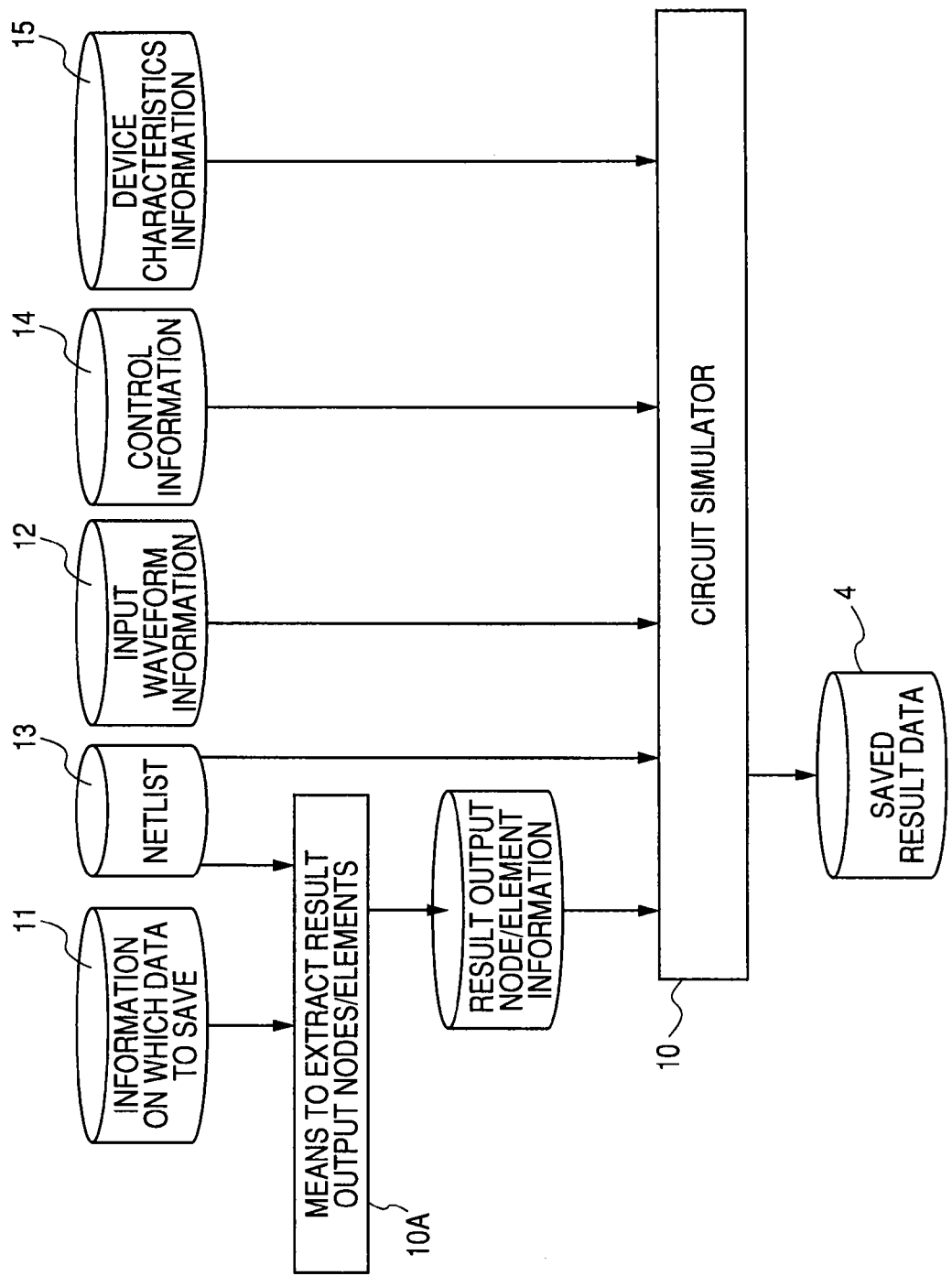
FIG. 28 is an outlined system diagram showing an example of obtaining the proper result output node data from the circuit simulator.

According to the above-mentioned description, the extraction function of the result output node is provided as part of functions of the circuit simulator 10 in FIG. 9. As exemplified in FIG. 28, means 10A to extract result output nodes/elements may be separated from the simulator 10. In short, it may be preferable to use a result output node extraction program provided independently of the circuit simulator. FIG. 28 omits means for the on-the-fly simulation.

<Preventing a Voltage Source Loop>

A method of previously preventing the on-the-fly simulation from generating a voltage source loop will be described. Referring now to FIGS. 29 through 42, the following describes prevention of the voltage source loop concerning higher-level interface nodes N1 through NN interfaced with a higher hierarchy.

Figure 29:
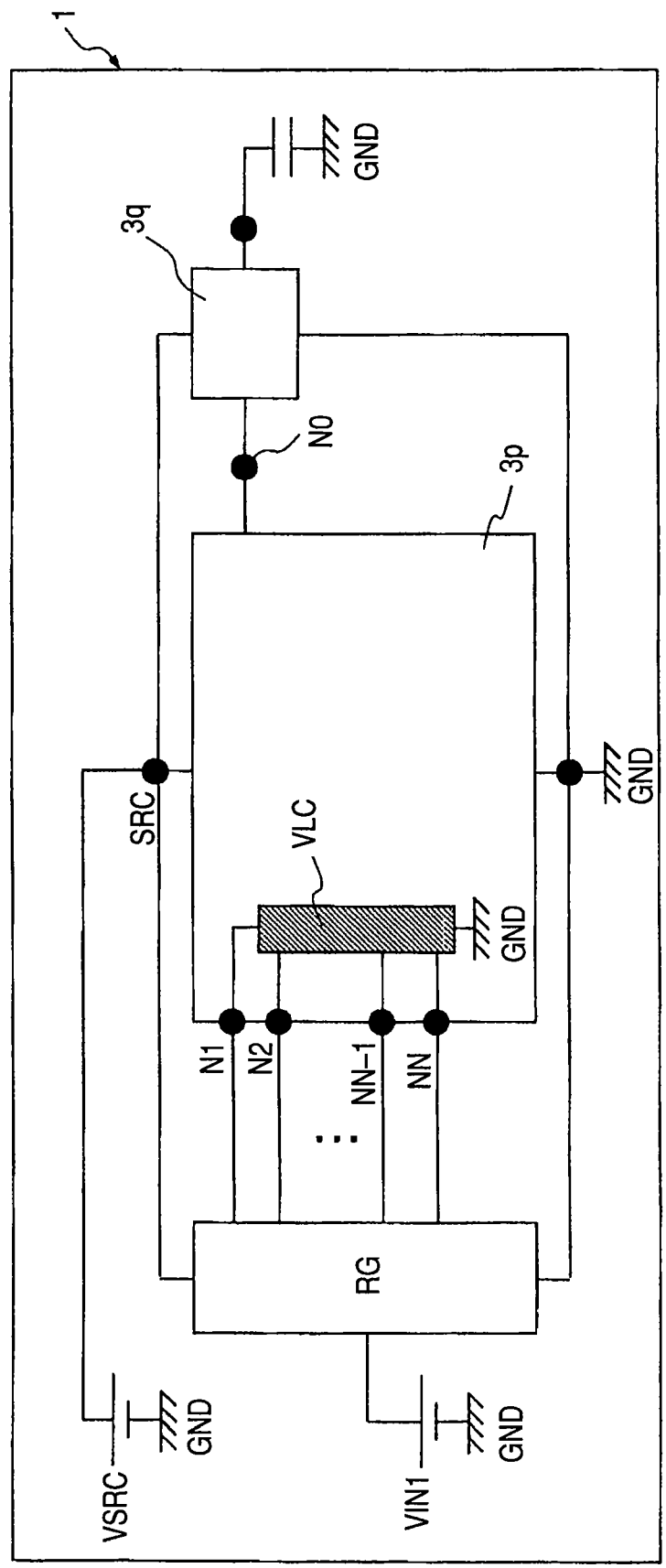
FIG. 29 is an explanatory diagram exemplifying a mode where there is a possibility of voltage source loop formation if the standard voltage source assignment to interface nodes is used for the second process.

FIG. 29 shows a first example as a mode that may generate a voltage source loop. Reference symbols 3$p$ and 3$q$ represent hierarchical circuit data areas (simply referred to as circuit areas) in the circuit under simulation 1. The circuit area 3$p$ includes a partial circuit VLC and higher-level interface nodes N1 through NN. The partial circuit VLC includes one of elements such as a voltage source and an inductor, or includes at least two connected elements such as the voltage source and the inductor. The higher-level interface nodes N1 through NN provide one or more specific nodes that interface the partial circuit VLC with a higher hierarchy. The partial circuit VLC is connected to ground potential GND. That the circuit area 3$p$ includes such elements and nodes can be understood from the element information, the external connection node (interface node) information, and the internal connection node (internal node) information as described in FIGS. 15 through 18. Reference symbol RG denotes a resistor circuit. Reference symbols VIN1 and VSRC denote external power supplies. Reference symbol SRC denotes a power supply terminal supplied with the external power supply VSRC.

Figure 30:
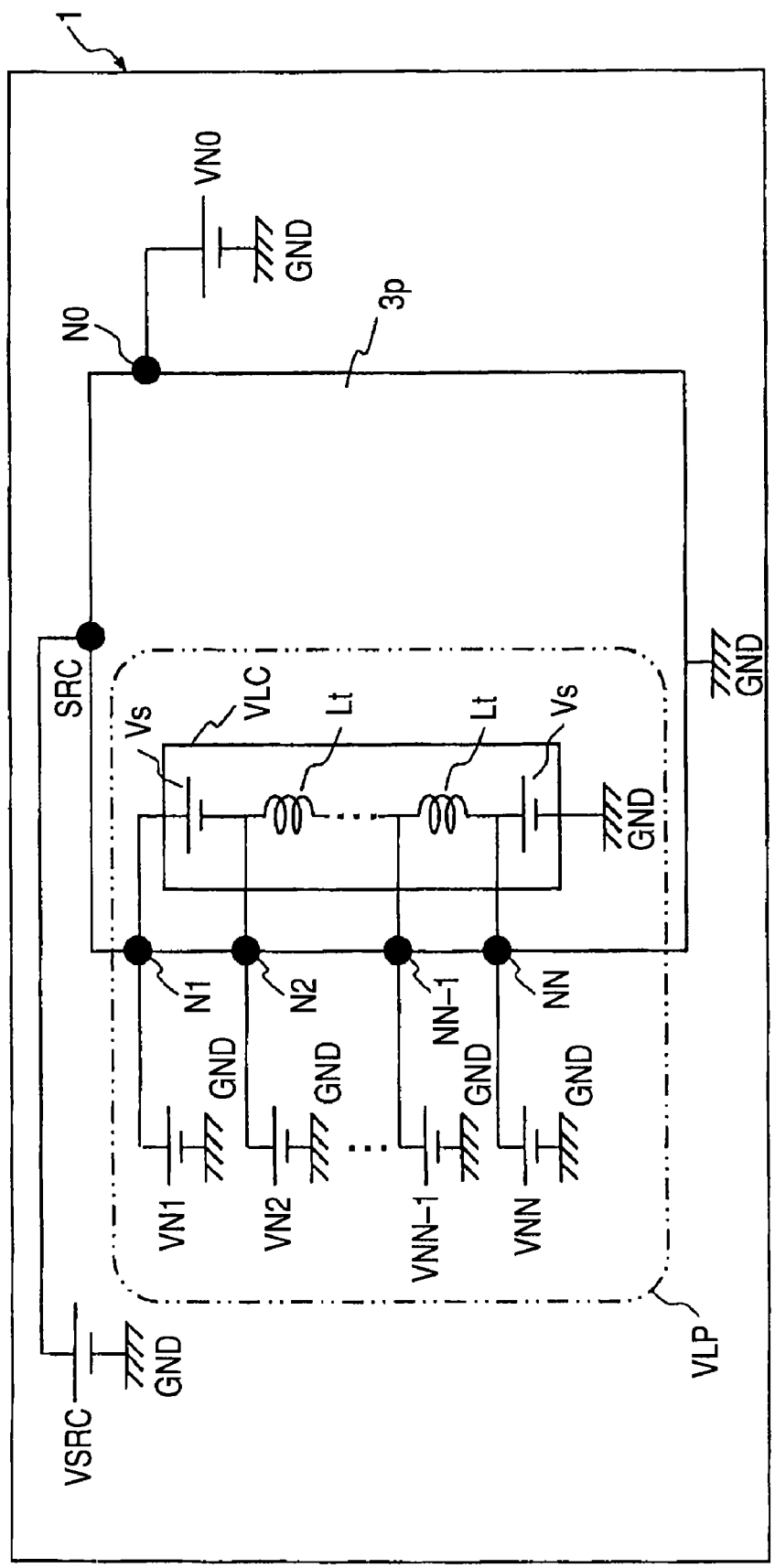
FIG. 30 is a circuit diagram exemplifying a case where a partial circuit in the circuit area of FIG. 29 forms a voltage source loop.

FIG. 30 exemplifies a case where the partial circuit VLC in the circuit area 3$p$ of FIG. 29 forms a voltage source loop. The partial circuit VLC has a voltage source Vs and an inductor Lt. During the on-the-fly simulation, the higher-level interface nodes N1 through NN are provided with simulation result data corresponding to required time slots. Let us assume that the supplied simulation result data is equivalent to data for the voltage sources VN1 through VNN. A voltage source loop VLP is formed between the ground potential GND connected with the voltage sources VN1 through VNN and the ground potential GND connected with the partial circuit VLC. The voltage source loop VLP is a closed circuit only composed of one or more voltage sources or inductors. During the simulation, the presence of a voltage source loop may cause an problems in simulation such as an inconsistent voltage for a node included in the path or incapability to obtain an electric current value. No simulation result may be obtained.

Figure 31:
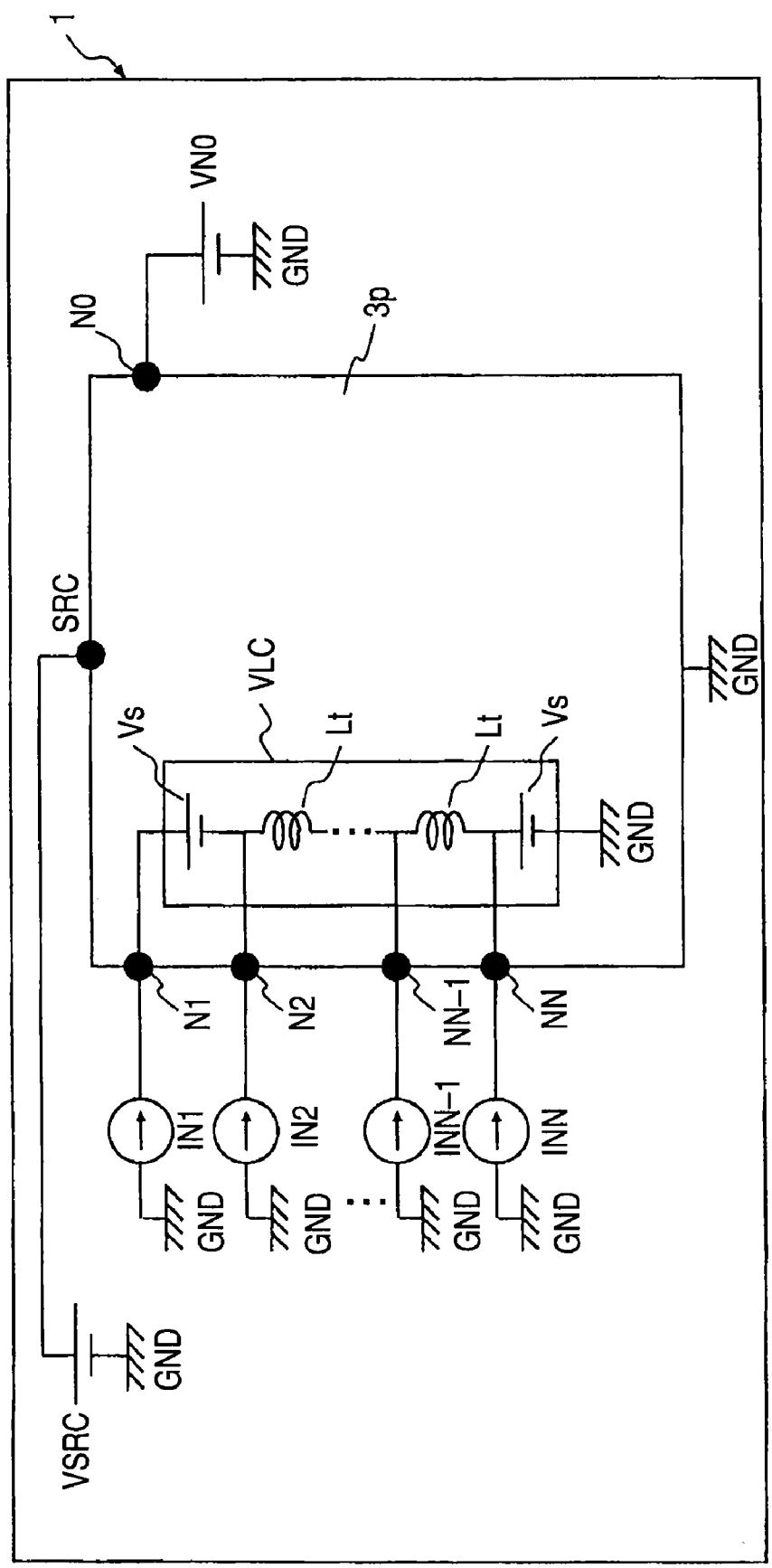
FIG. 31 is a circuit diagram exemplifying a circuit state that prevents the formation of a voltage source loop during the on-the-fly simulation for the circuit area of FIG. 29.

FIG. 31 exemplifies a circuit state that prevents the generation of a voltage source loop during the on-the-fly simulation for the circuit area 3p of FIG. 29. When the state in FIG. 29 is detected, the on-the-fly simulation uses the electric current information as input/output information supplied to the interface nodes N1 through NN. That is, the on-the-fly simulation connects the current sources IN1 through INN to the interface nodes N1 through NN. Even when the partial circuit VLC is connected to only at least one of the voltage source and the inductor as circuit elements during the simulation, the ground potential GND can be used to specify the potential reference for the partial circuit VLC. In addition, the current sources IN1 through INN can be connected to higher-level interface nodes N1 through NN of the partial circuit VLC. The targeted on-the-fly simulation can be performed for the circuit 3p including the partial circuit VLC.

Figure 32:
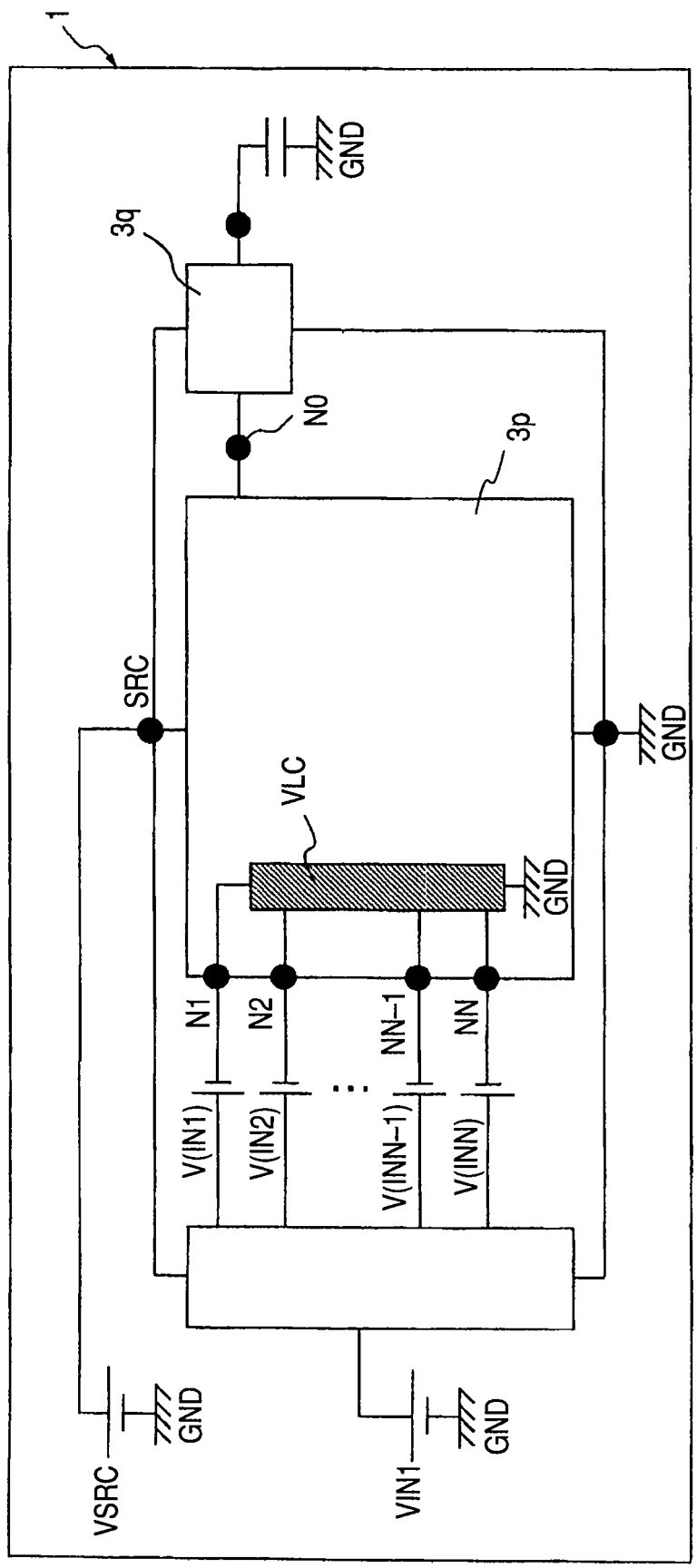
FIG. 32 is a circuit diagram exemplifying a method of finding electric current information about a higher-level interface node for which a voltage source loop should be suppressed.

FIG. 32 shows a method of finding the electric current information for the nodes N1 through NN. That is, the simulation for the circuit under simulation 1 adds voltage sources V(IN1) through V(INN) of zero voltage as elements to the nodes N1 through NN and saves a value of current flowing through the elements as one piece of result data 4. The on-the-fly simulation in FIG. 31 only needs to supply the nodes N1 through NN with the current sources IN1 through INN corresponding to the current value. Let us consider a case of expansively applying the example in FIG. 32, not limited to the case in FIG. 32. Voltage values and current values may be used to save simulation result data for multiple circuit nodes in a data saving area 2. The example can be further expanded to save values of a voltage source and a current source not interfaced with a circuit node in the data saving area in the data not-saving area 3. It is convenient to save these values as an initial condition as well as saving circuit simulation result data for the data saving area. In this case, it is more preferable to save a current value for the voltage source and a voltage value for the current source.

Figure 33:
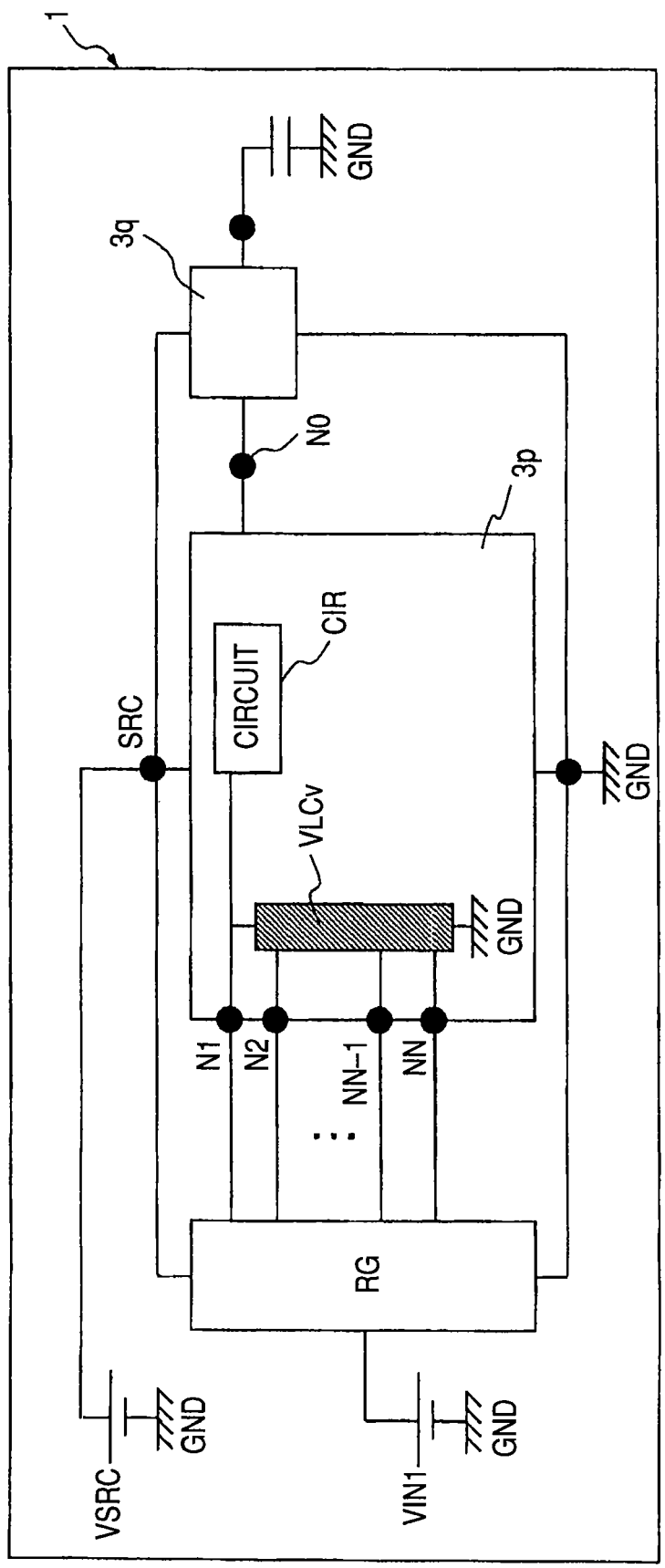
FIG. 33 is a circuit diagram exemplifying another circuit state where the internal partial circuit is connected to another internal circuit other than the higher-level interface node and there is a possibility of voltage source loop formation if the standard voltage source assignment to interface nodes is used for the second process.
Figure 34:
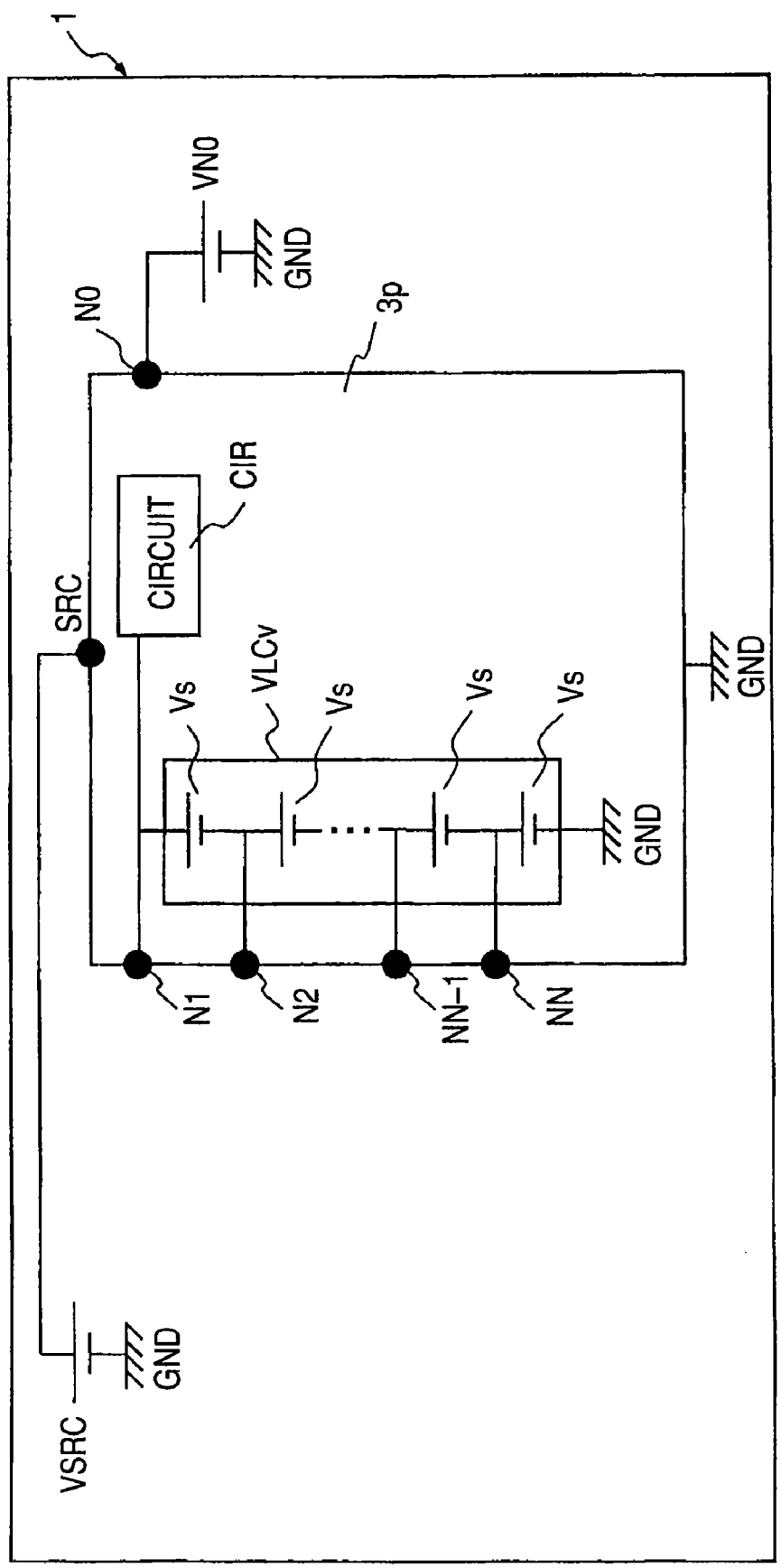
FIG. 34 is a circuit diagram showing a case of floating all higher-level interface nodes as a solution for the case in FIG. 33.
Figure 35:
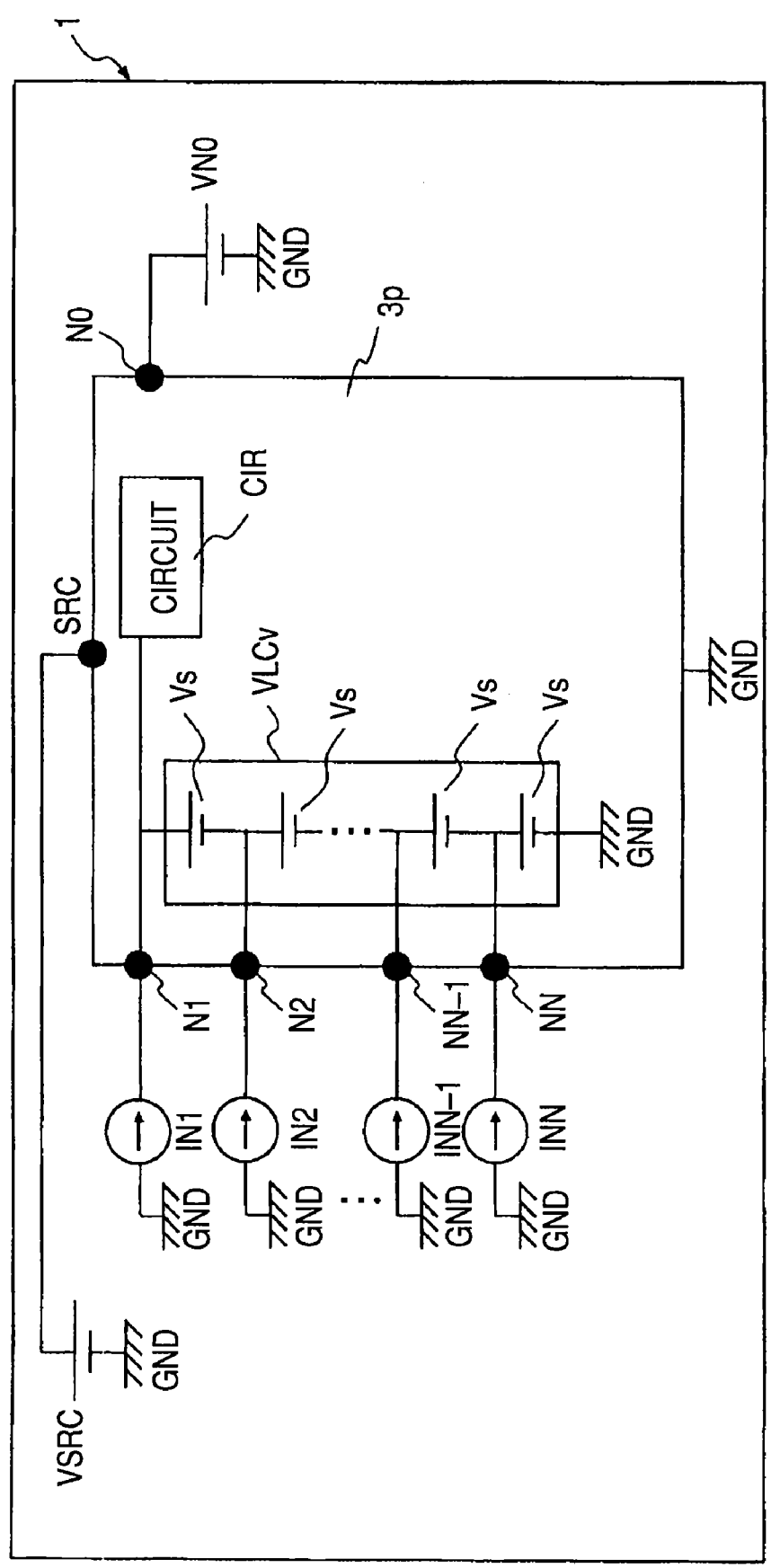
FIG. 35 is a circuit diagram showing a case of supplying electric current information as input/output information for all the higher-level interface nodes when the on-the-fly simulation in FIG. 33 is performed to verify electric currents flowing through voltage sources of the partial circuit.

A second example will be described. As shown in FIG. 33, let us consider a case where the partial circuit VLC in the circuit area 3p is connected to another internal circuit CIR in addition to the higher-level interface node N1. A partial circuit VLCv is assumed to include one voltage source Vs or at least two connected voltage sources Vs. The partial circuit VLCv is connected to the ground potential similarly to the above-mentioned case. When another circuit CIR is connected to the partial circuit VLCv, the state of the other circuit CIR determines the current values through the partial circuit VLCv; however the voltage values of the higher-level interface nodes N1 through NN are determined by the partial circuit VLCv if VLCv consists only of voltage sources or inductors. Originally, the on-the-fly simulation for the circuit area 3p only needs to float all the higher-level interface nodes N1 through NN as shown in FIG. 34. The goal of this is to prevent the formation of voltage source loop in all cases. There may be a need to perform the on-the-fly simulation for the circuit area 3p to verify an electric current flowing through the voltage source for the partial circuit VLCv. In this case, as shown in FIG. 35, electric current information as input/output information only needs to be supplied to all the higher-level interface nodes N1 through NN. The electric current information can be found as mentioned above. The method in FIG. 34, when viewed differently, allows to float all the higher-level interface nodes when the simulation need not verify a current flowing through the voltage source for the partial circuit VLCv.

Figure 36:
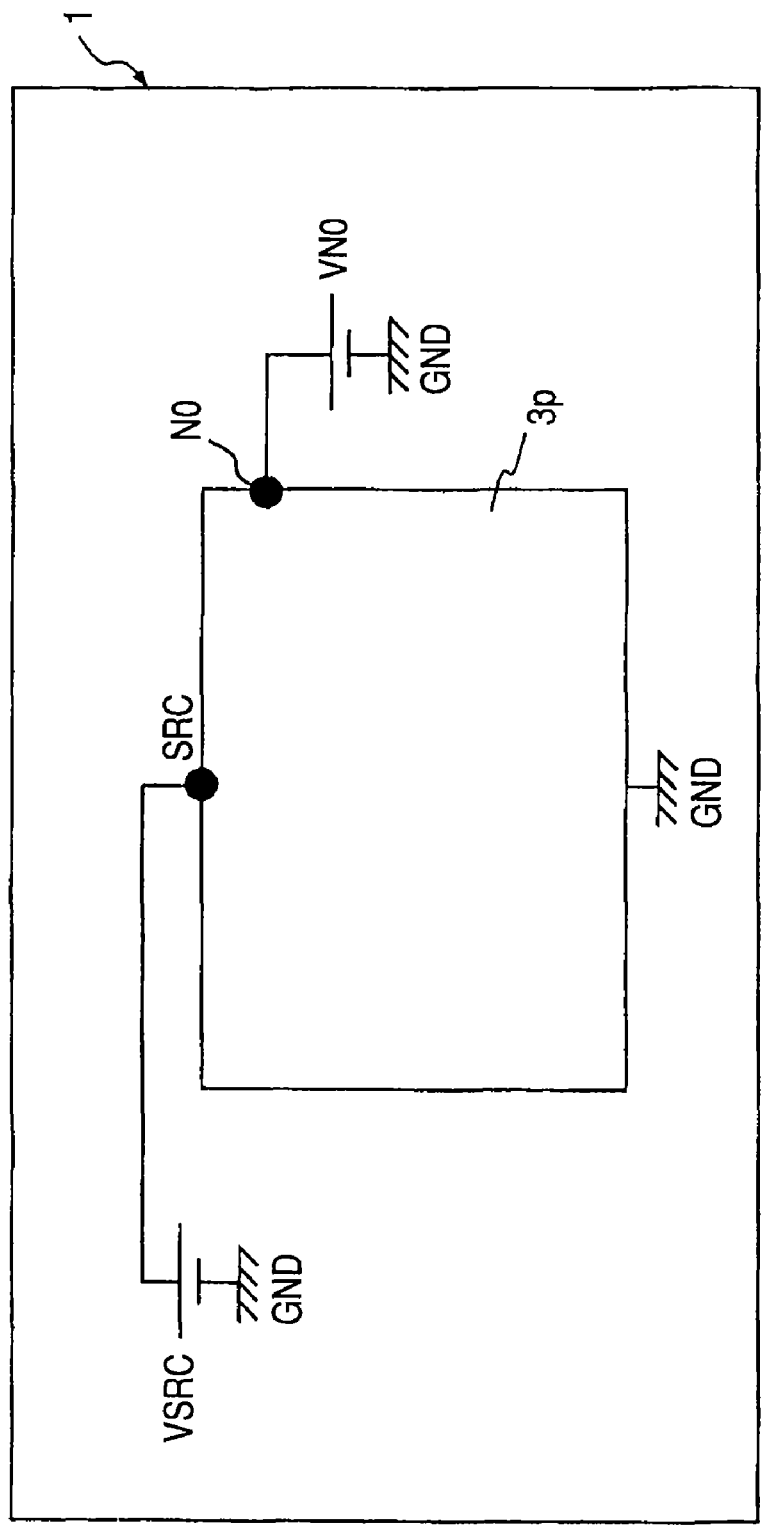
FIG. 36 is a circuit diagram showing a case of performing the on-the-fly simulation by removing a partial circuit VLC when the on-the-fly simulation need not verify an electric current flowing through all elements in the partial circuit.

A third example will be described. A condition is that the partial circuit VLC includes one of the elements such as voltage source Vs and inductor Lt or at least two connected elements such as voltage source Vs and inductor Lt. Another condition is that there are provided one or more higher-level interface nodes N1 through NN externally connected with the partial circuit VLC. Still another condition is that the partial circuit VLC is connected to the ground potential GND. Yet another condition is that the on-the-fly simulation for the circuit area 3p eliminates consideration for electric currents flowing through all elements in the partial circuit VLC. Under these conditions, it is only necessary to perform the on-the-fly simulation by removing the partial circuit VLC as shown in FIG. 36. In short, when it is unnecessary to simulate an electric current flowing through all elements of the partial circuit VLC for verification, the simulation only needs to be performed by eliminating the partial circuit. This contributes to deleting circuit information for the simulation and shortening the computation time.

Figure 37:
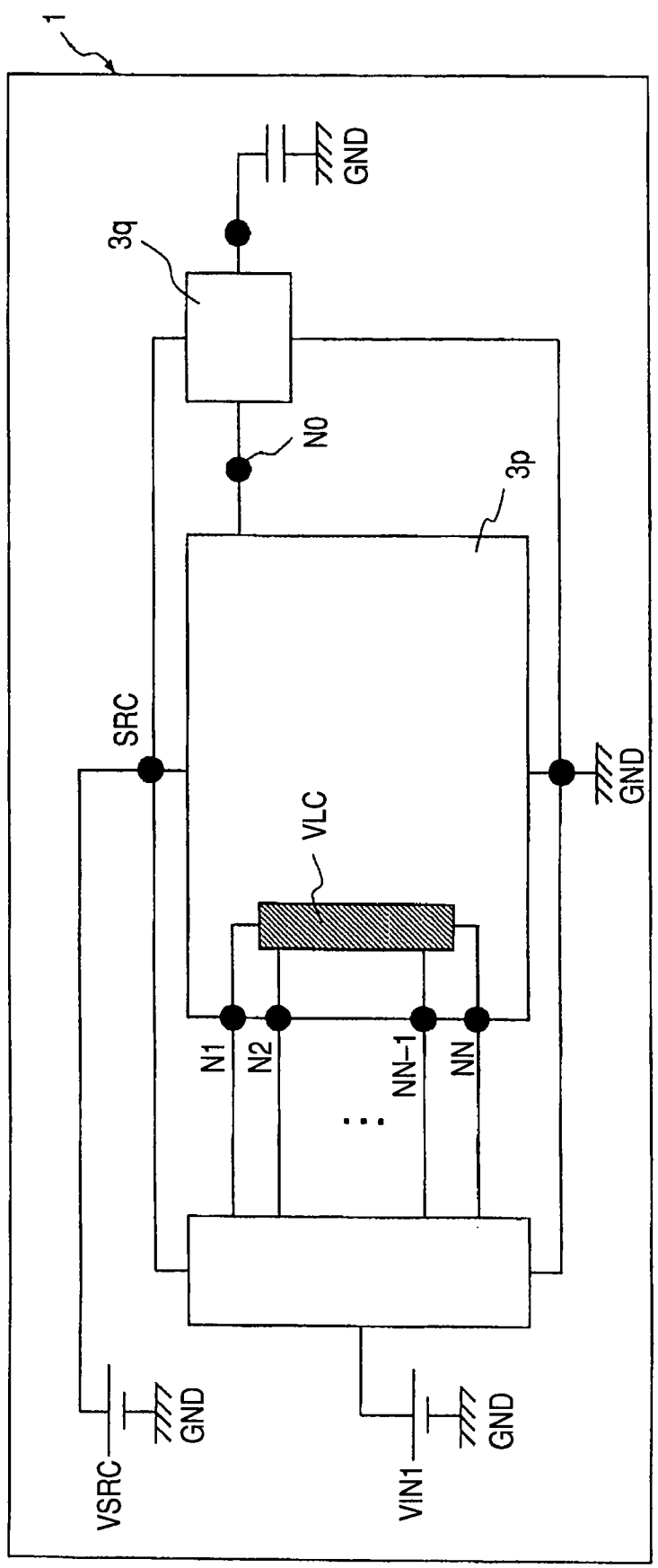
FIG. 37 is a circuit diagram exemplifying a circuit state where voltage loop formation is possible during the on-the-fly simulation when the partial circuit is not connected to a ground potential.
Figure 38:
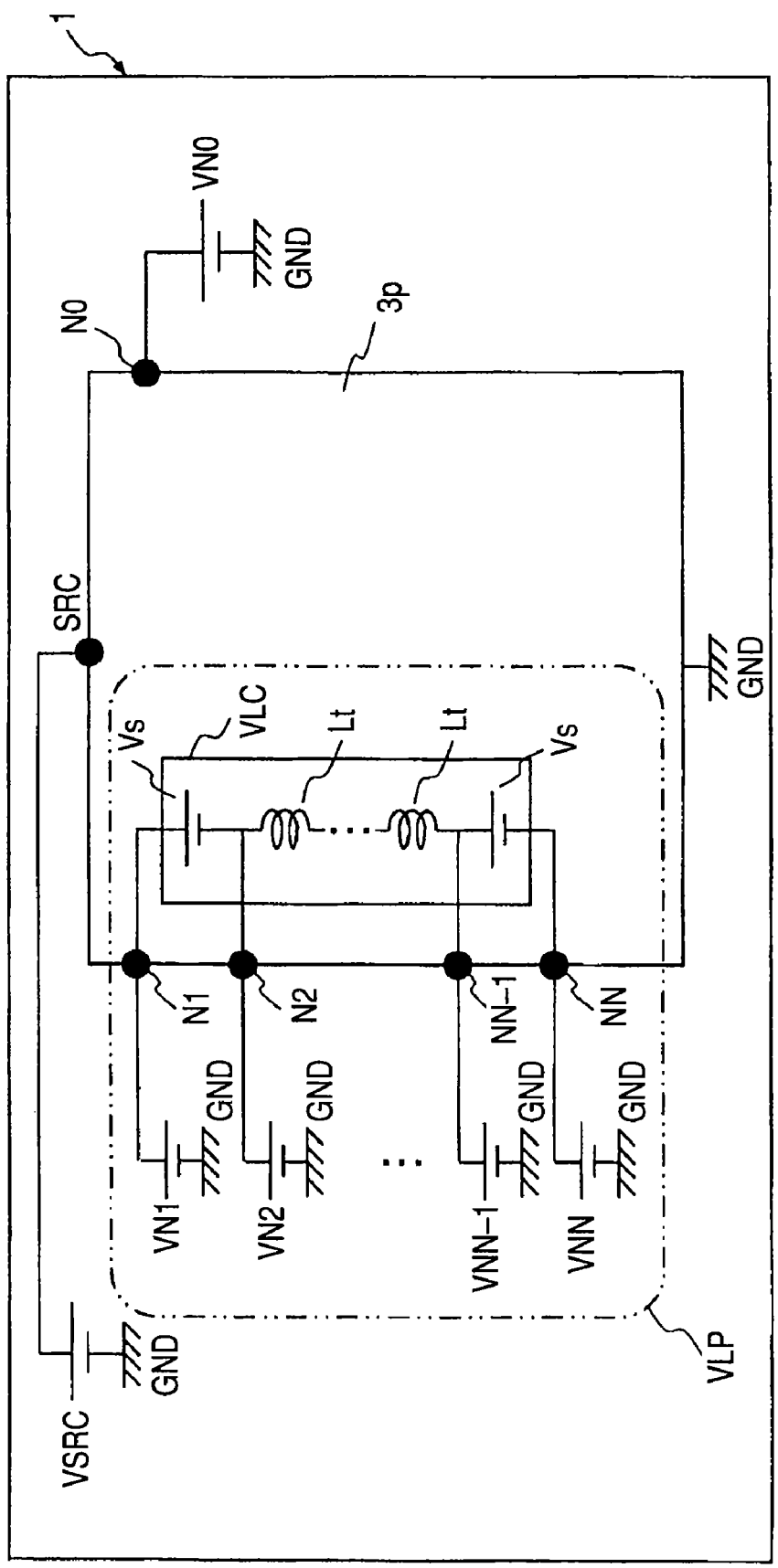
FIG. 38 is a circuit diagram showing a state of forming voltage source loops by supplying voltage source information for all higher-level interface nodes in FIG. 37.
Figure 39:
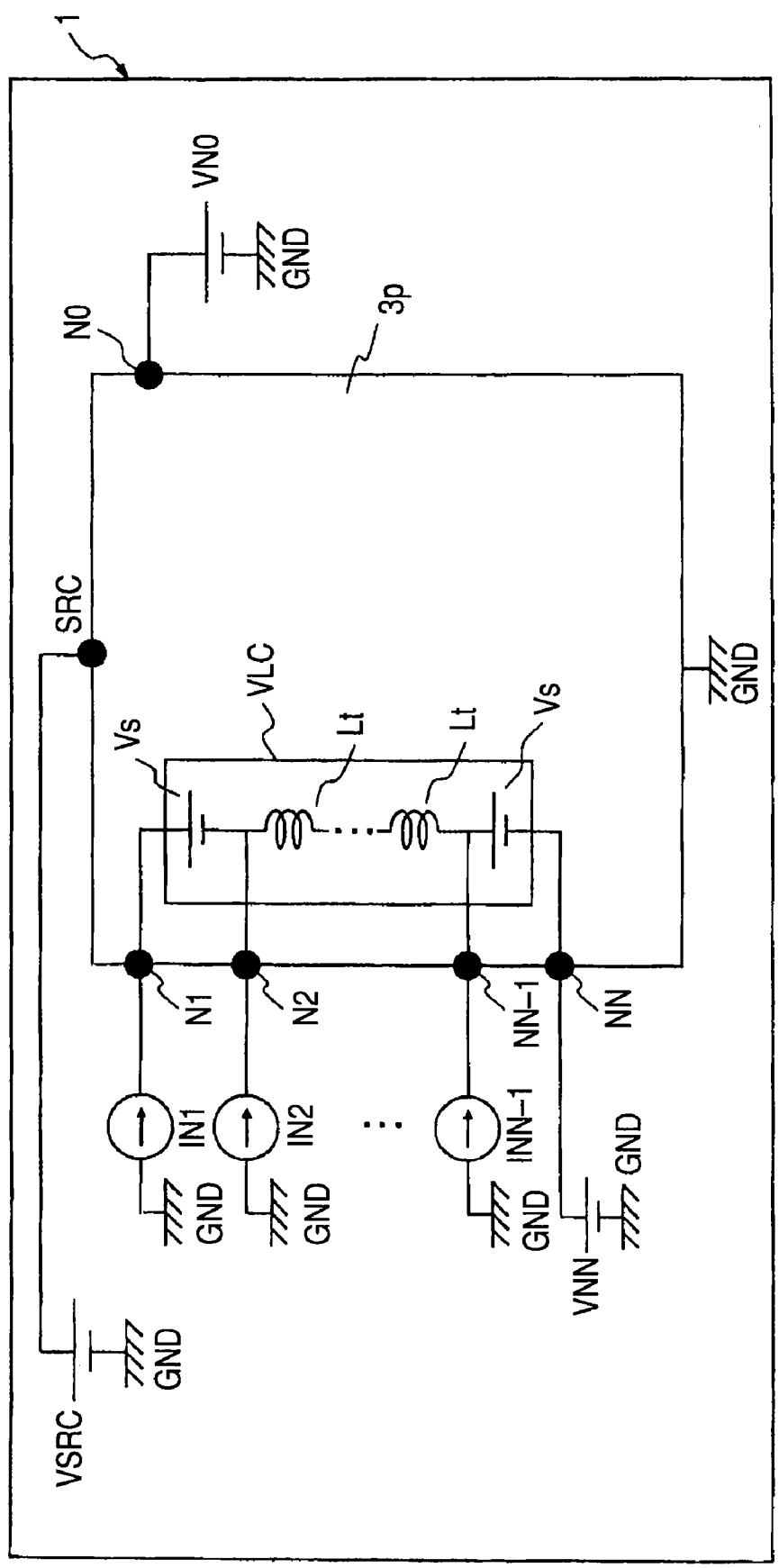
FIG. 39 is a circuit diagram showing a solution for suppressing generation of the voltage source loop in FIG. 38 when current flow data is required.
Figure 40:
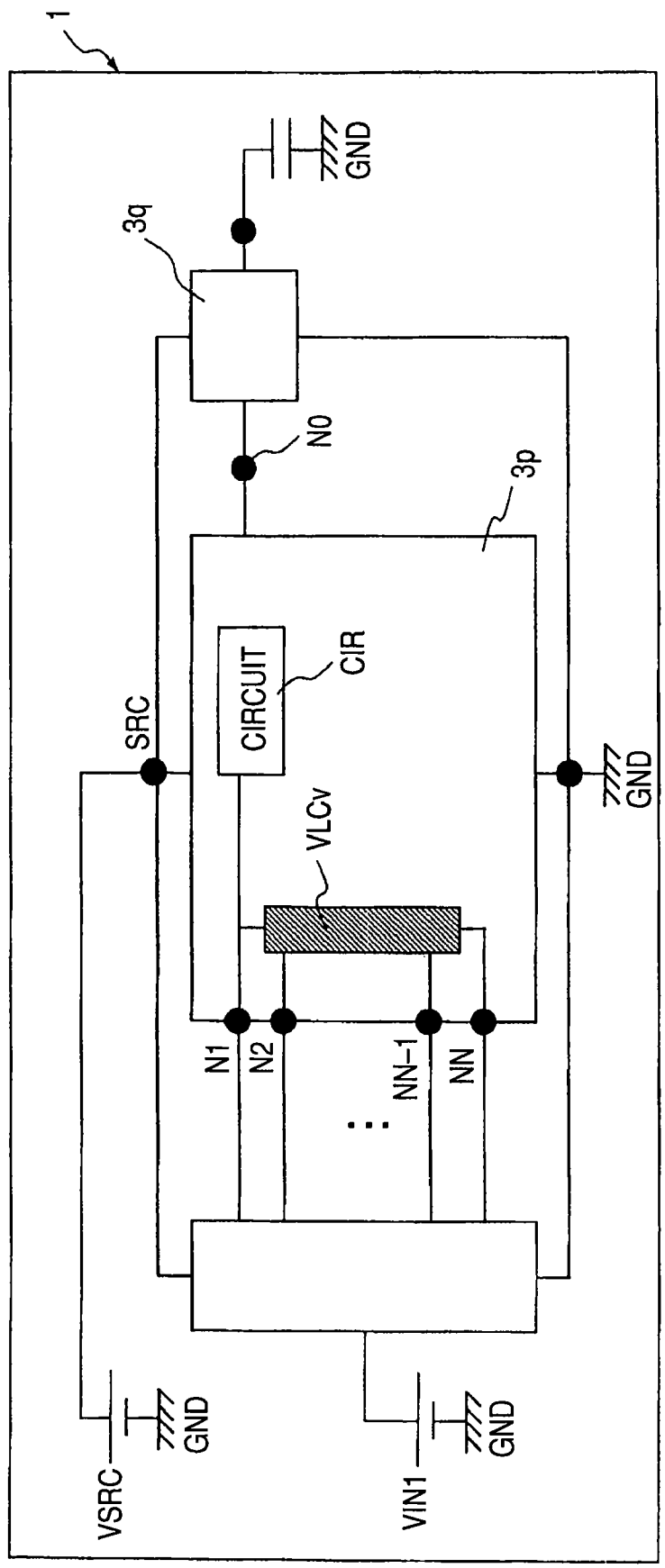
FIG. 40 is a circuit diagram exemplifying a circuit state where voltage loop formation is possible during the on-the-fly simulation in consideration for a ground potential not connected to a partial circuit, but with the partial circuit also connected to another internal circuit.

A fourth example will be described. According to the above-mentioned description, the partial circuit VLC is connected to the ground potential GND. This is not mandatory. Let us assume a circuit in FIG. 37 in comparison with the circuit in FIG. 29. A difference from FIG. 29 is that the partial circuit VLC is not connected to the ground potential. When the on-the-fly simulation for the circuit area 3p provides voltage source information VN1 through VNN to all the higher-level interface nodes N1 through NN as shown in FIG. 38, a voltage source loop VLP is formed as mentioned above with reference to FIG. 30. FIG. 39 shows how to prevent the voltage source loop from occurring. The on-the-fly simulation for the circuit area 3p supplies voltage source information VNN as input/output information to one higher-level interface node NN of the higher-level interface nodes N1 through NN. The on-the-fly simulation supplies current source information IN1 through INN−1 as input/output information to the remaining higher-level interface nodes N1 through NN−1. The voltage source information VNN as input/output information supplied to the higher-level interface node NN is equivalent to the ground potential GND in FIG. 31, for example. The voltage source information VNN can be used to specify the potential reference for the partial circuit VLC that is not connected to the ground potential GND in the circuit area 3p. In addition, the current sources IN1 through INN−1 can be connected to the higher-level interface nodes N1 through NN of the partial circuit VLC. The targeted on-the-fly simulation can be performed for the circuit 3p including the partial circuit VLC. The same method as described in FIG. 32 can be used to obtain current sources IN1 through INN−1 for the higher-level interface nodes N1 through NN−1.

Figure 41:
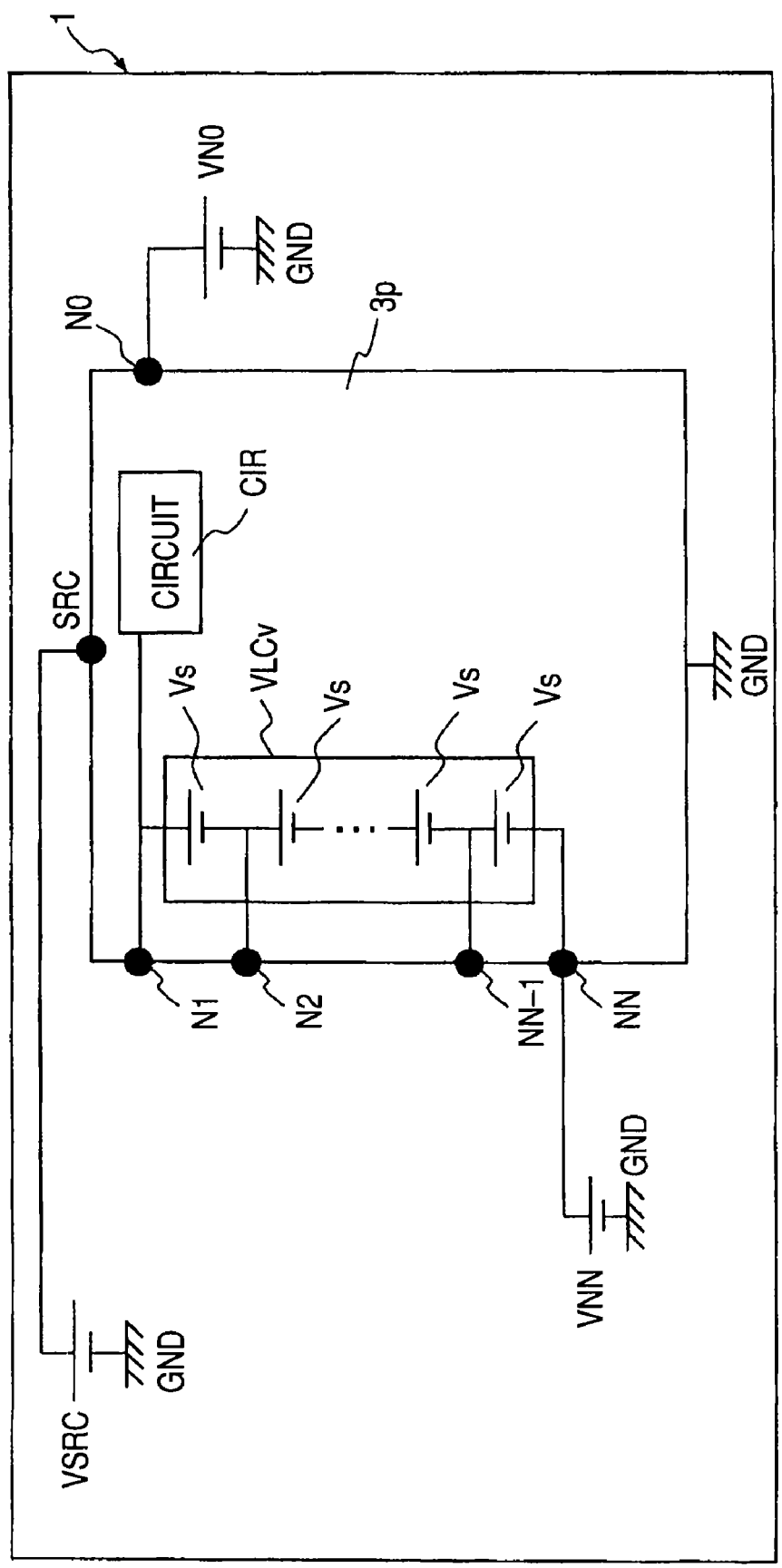
FIG. 41 is a circuit diagram showing a specific solution for the state in FIG. 40, i.e., supplying one lower-level interface node with voltage source information and supplying the partial circuit with one potential reference instead of the ground potential, where current flow data is not required.
Figure 42:
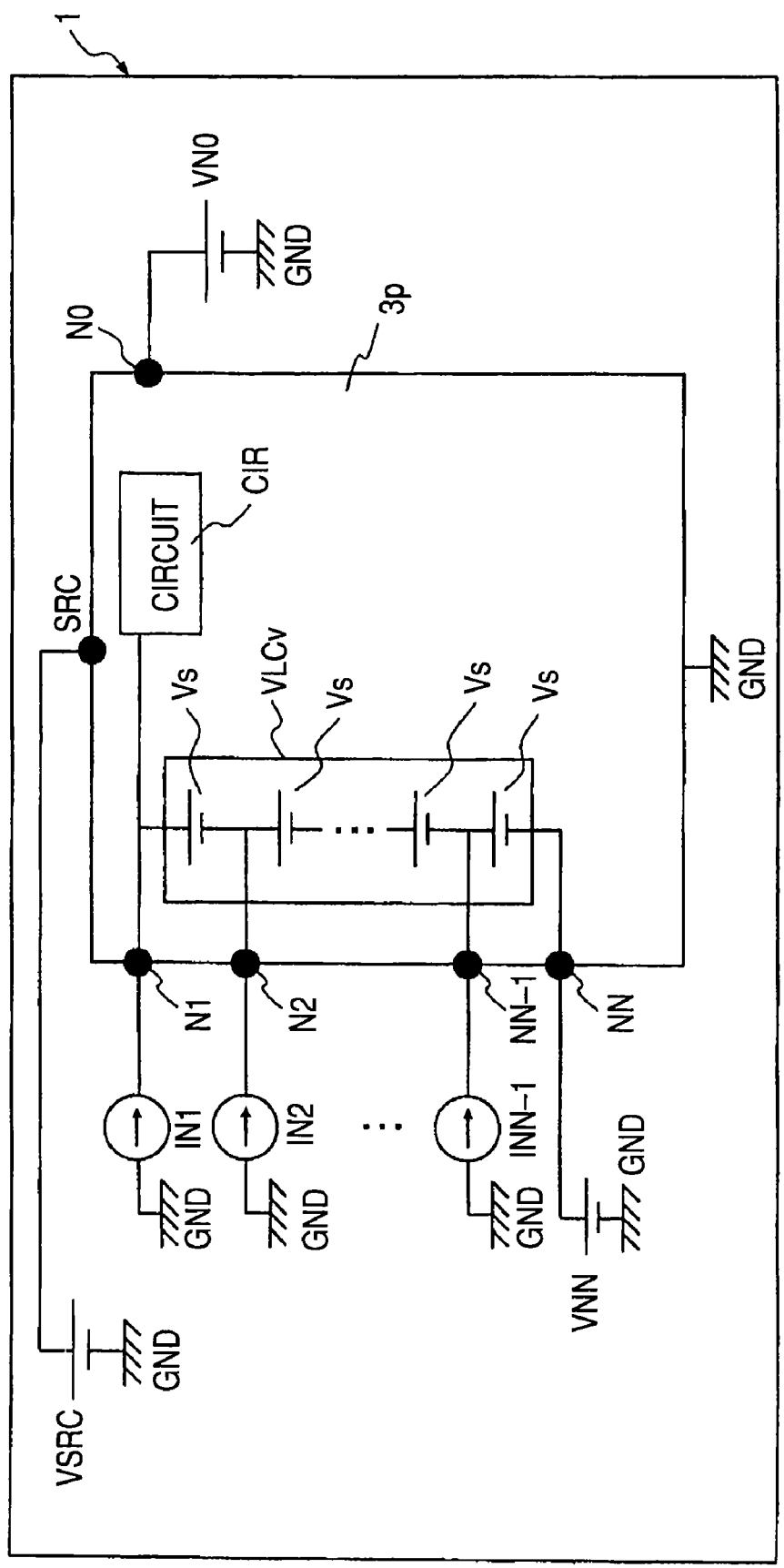
FIG. 42 is a circuit diagram showing a solution for performing the simulation to verify an electric current flowing through the voltage source of the partial circuit in FIG. 41.

A fifth example will be described. According to the above-mentioned description, the partial circuit VLCv is connected to the ground potential GND. This is not mandatory. Let us assume a circuit in FIG. 40 in comparison with the circuit in FIG. 30. A difference from FIG. 33 is that the partial circuit VLCv is not connected to the ground potential. As mentioned above, the partial circuit VLCv is assumed to include one voltage source Vs or at least two connected voltage sources Vs. As exemplified in FIG. 41, the on-the-fly simulation for the circuit area 3p supplies voltage source information VNN as input/output information to one higher-level interface node NN of the higher-level interface nodes N1 through NN. The voltage source information VNN supplies one potential reference to the partial circuit VLCv instead of the ground potential GND. When another circuit CIR is connected to the partial circuit VLCv, the state of the other circuit CIR determines the current flow through the partial circuit VLCv. However, voltage values of the higher-level interface nodes N1 through NN−1 for the partial circuit VLCv are already determined by the voltage sources themselves. Accordingly, the on-the-fly simulation for the circuit area 3p only needs to float the other higher-level interface nodes N1 through NN−1 than the higher-level interface node NN as shown in FIG. 41. The goal for this is to prevent the formation of voltage source loops in all cases. There may be a need to perform the on-the-fly simulation for the circuit area 3p to verify an electric current flowing through the voltage source Vs for the partial circuit VLCv. In this case, as shown in FIG. 42, only electric current information as input/output information needs to be supplied to the higher-level interface nodes N1 through NN−1 other than the higher-level interface node NN. The electric current information can be found as mentioned above. The method in FIG. 42, when viewed differently, allows floating the higher-level interface nodes other than the higher-level interface node NN for input of the voltage information VNN when the simulation need not verify a current flowing through the voltage source for the partial circuit VLCv.

FIGS. 35 and 42 are also effective when the partial circuit VLCv includes an inductor in FIGS. 33 and 41. When an inductor is included, the electric current needs to be reproduced correctly. The higher-level interface nodes cannot be floated as shown in FIG. 41.

A sixth example will be described. A condition is that the partial circuit VLC is not connected to the ground potential GND as shown in FIG. 37. Similarly to the third example, another condition is that the on-the-fly simulation for the circuit area 3p eliminates consideration for electric currents flowing through all elements in the partial circuit VLC. Under these conditions, it is only necessary to perform the on-the-fly simulation by removing the partial circuit VLC as shown in FIG. 36. In short, when it is unnecessary to simulate an electric current flowing through all elements of the partial circuit VLC for verification, the simulation only needs to be performed by eliminating the partial circuit. This contributes to deleting circuit information for the simulation and shortening the computation time.

With reference to FIGS. 43 through 58, the following describes prevention of forming a voltage source loop concerning lower-level interface nodes M1 through MN interfacing with a lower-level hierarchy.

Figure 43:
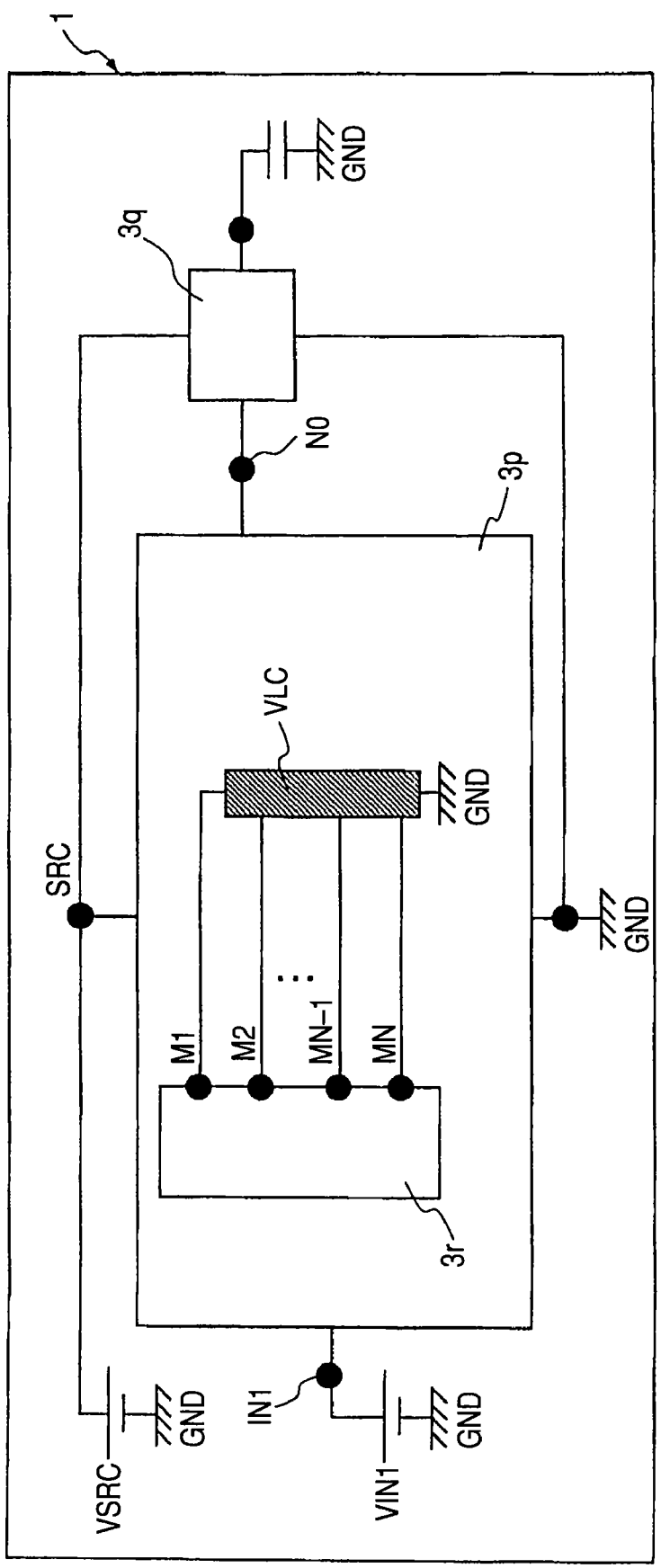
FIG. 43 is a circuit diagram showing a mode of performing the on-the-fly simulation for the partial circuit VLC using data stored in a lower-level interface node interfaced with a low hierarchy.
Figure 44:
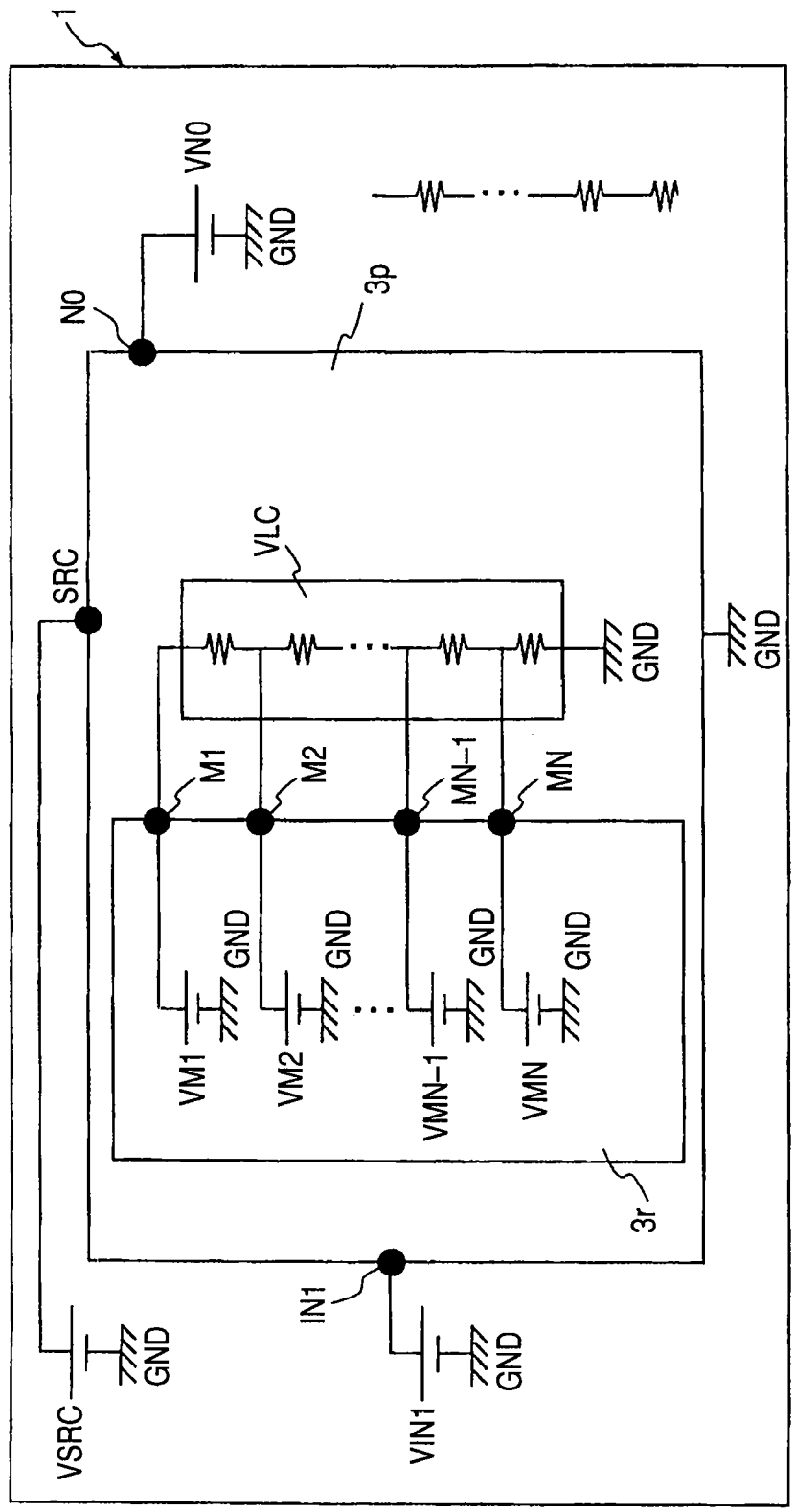
FIG. 44 is a circuit diagram showing a state of supplying voltage source data as simulation result data prestored in the lower-level interface node in FIG. 43.
Figure 45:
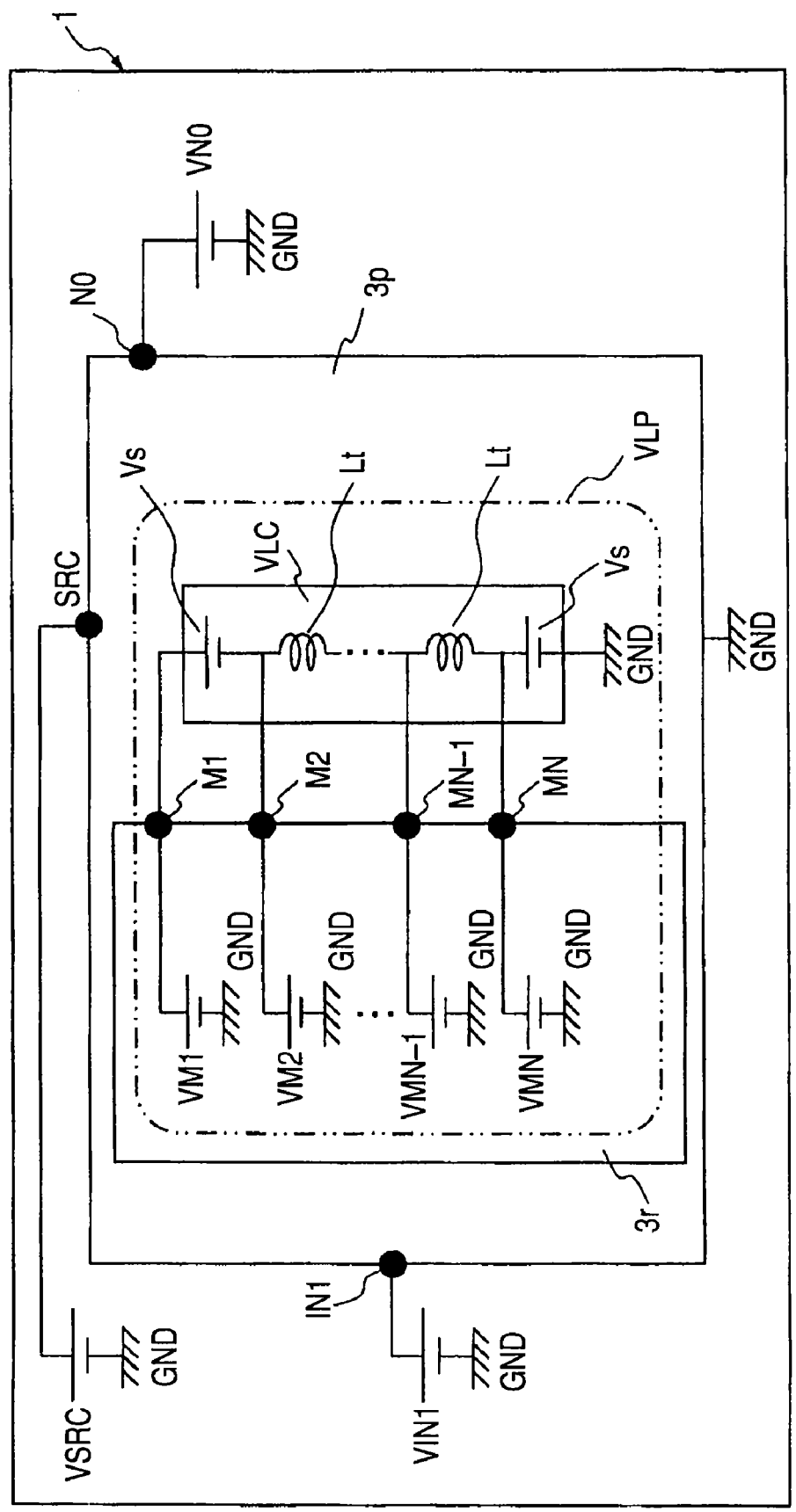
FIG. 45 is a circuit diagram showing a state of forming a voltage source loop when the partial circuit is configured to include one of the voltage source and an inductor or to include at least two connected elements such as the voltage source and the inductor and, in this case, has a serial circuit of the voltage source and the inductor.

FIG. 43 exemplifies a mode of performing an on-the-fly simulation for the partial circuit VLC using saved data for lower-level interface nodes M1 through MN as one or more specific nodes that interface the partial circuit VLC with the lower-level hierarchy. Reference symbols 3p, 3q, and 3r represent hierarchical circuit data areas (simply referred to as circuit areas) in the circuit under simulation 1. As shown in FIG. 44, the partial circuit VLC includes elements other than the voltage source and the inductor, e.g., resistor elements. In this case, the lower-level interface nodes M1 through MN only need to be supplied with data for voltage source VM1 through VMN based on pre-stored simulation result data. No voltage source loop is formed. An accurate simulation result can be obtained. On the other hand, the partial circuit VLC may include one of elements such as a voltage source and an inductor, or includes at least two connected elements such as the voltage source and the inductor. When the partial circuit VLC includes a serial circuit of voltage sources Vs and inductors Lt, as shown in FIG. 45, for example, a voltage source loop is formed. Let us assume that the saved result data supplied to the lower-level interface nodes M1 through MN is equivalent to data for the voltage sources VM1 through VMN. A voltage source loop VLP is formed between the ground potential GND connected with the voltage sources VM1 through VMN and the ground potential GND connected with the partial circuit VLC. The voltage source loop VLP is a closed circuit only composed of one or more voltage sources or inductors. The following describes a mode of preventing generation of such voltage loops concerning the lower-level interface nodes M1 through MN.

Figure 46:
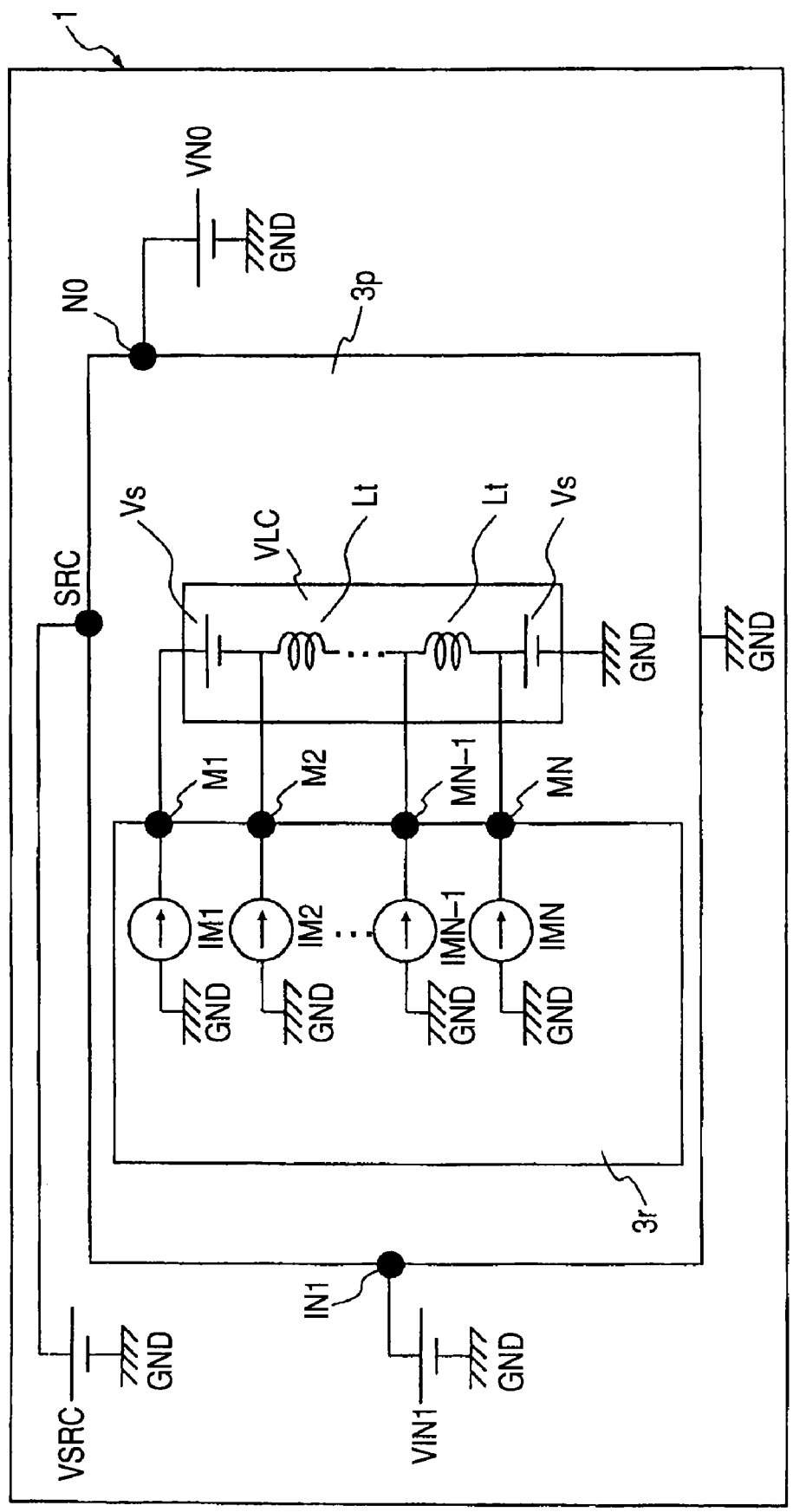
FIG. 46 is a circuit diagram exemplifying a circuit state preventing the formation of voltage loops during the on-the-fly simulation in FIG. 45 where internal current flow data is required.

FIG. 46 exemplifies a circuit state for preventing generation of a voltage source loop during the on-the-fly simulation for the circuit area 3p in FIG. 43. When the state in FIG. 46 is detected, the on-the-fly simulation uses the electric current information as input/output information supplied to the lower-level interface nodes M1 through MN. That is, the on-the-fly simulation connects the current sources IM1 through IMN to the lower-level interface nodes M1 through MN. Even when the partial circuit VLC is connected to only at least one of the voltage source and the inductor as circuit elements during the simulation, the ground potential GND can be used to specify the potential reference for the partial circuit VLC. In addition, the current sources IM1 through IMN can be connected to lower-level interface nodes M1 through MN of the partial circuit VLC. The targeted on-the-fly simulation can be performed for the circuit 3p including the partial circuit VLC.

Figure 47:
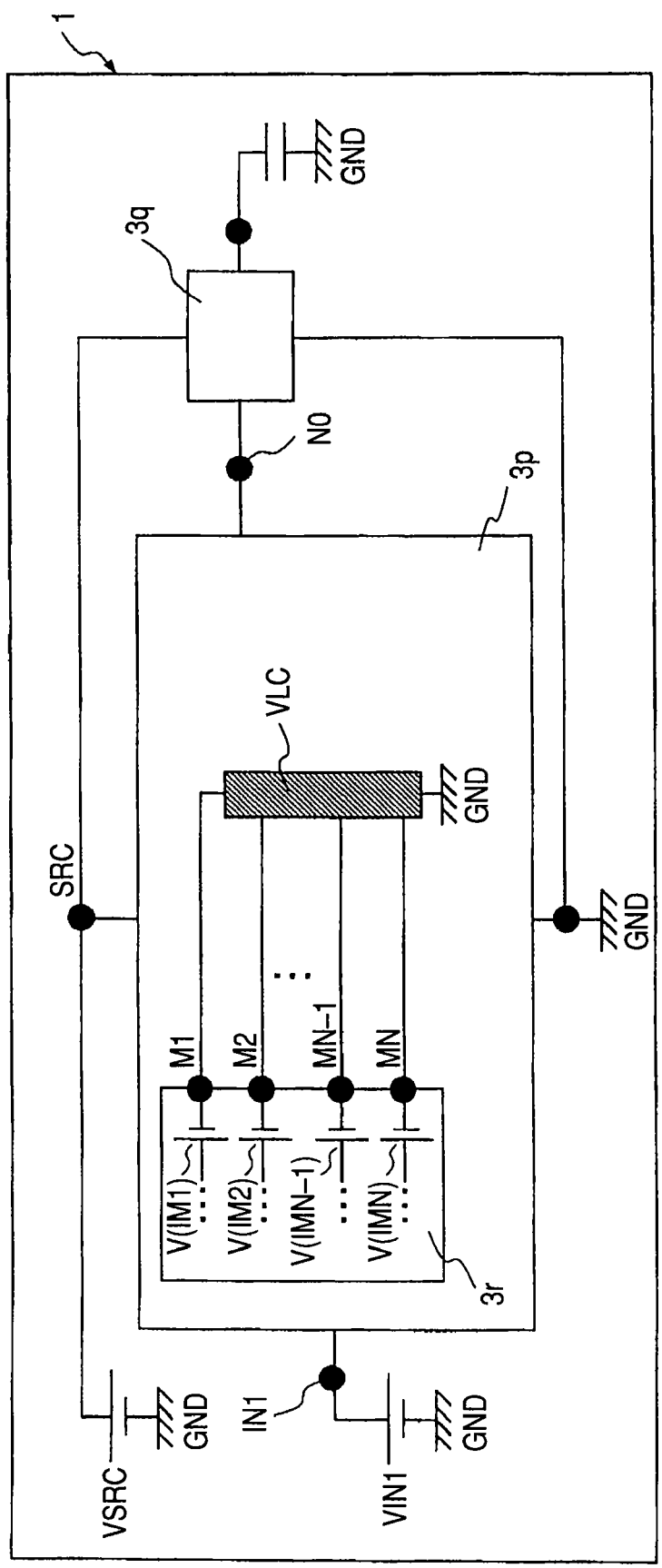
FIG. 47 is a circuit diagram exemplifying a method of finding electric current information about the lower-level interface nodes.

FIG. 47 shows a method of finding the electric current information for the nodes M1 through MN. That is, the simulation for the circuit under simulation 1 adds voltage sources V(IM1) through V(IMN) of zero voltage as elements to the nodes M1 through MN and saves a value of current flowing through the elements as one piece of result data 4. The on-the-fly simulation in FIG. 46 only needs to supply the nodes M1 through MN with the current sources IM1 through IMN corresponding to the current value. When used extensively, the example in FIG. 32 is not limited to the case in FIG. 47. A voltage value and an electric current may be used to save simulation result data for specified multiple circuit nodes in an area under simulation.

Figure 48:
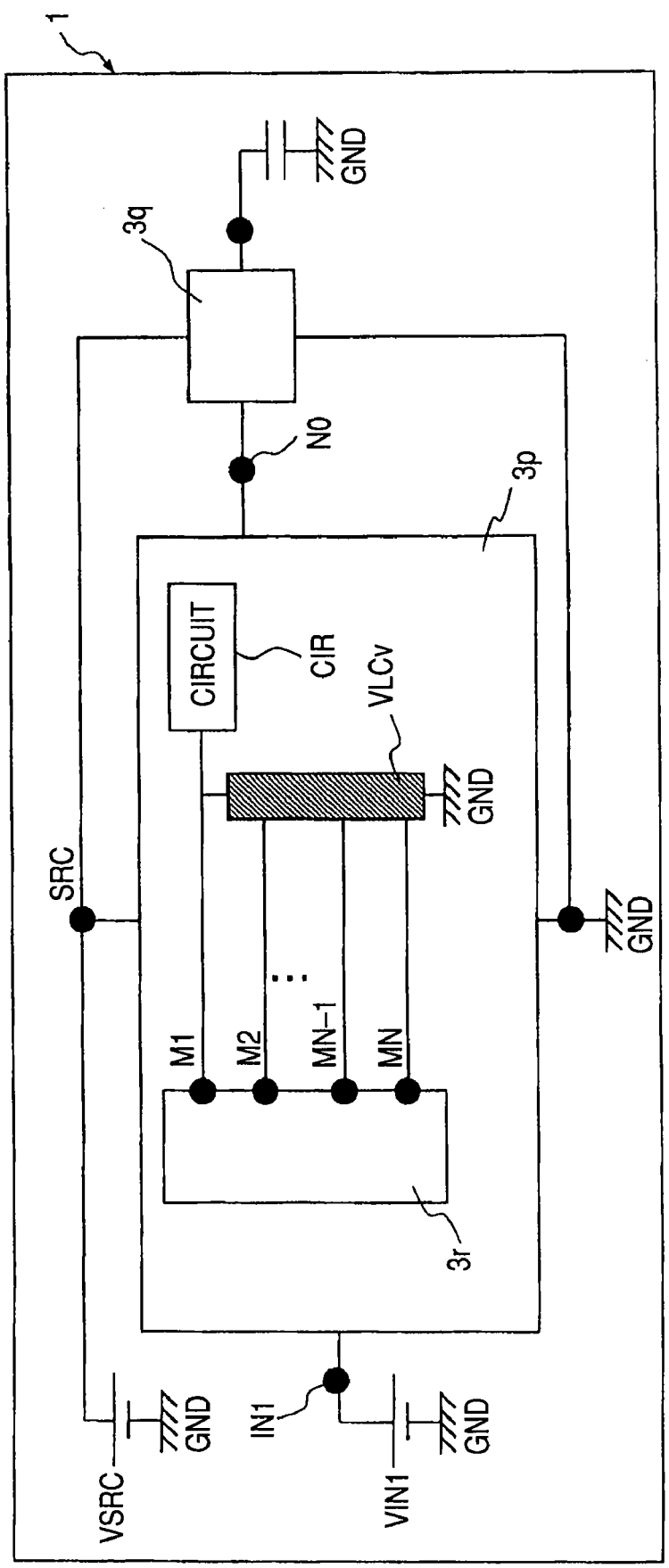
FIG. 48 is a circuit diagram exemplifying a circuit state where voltage loop formation is possible during the on-the-fly simulation when the circuit configuration consists of the partial circuit connected to another internal circuit other than the lower-level interface node.
Figure 49:
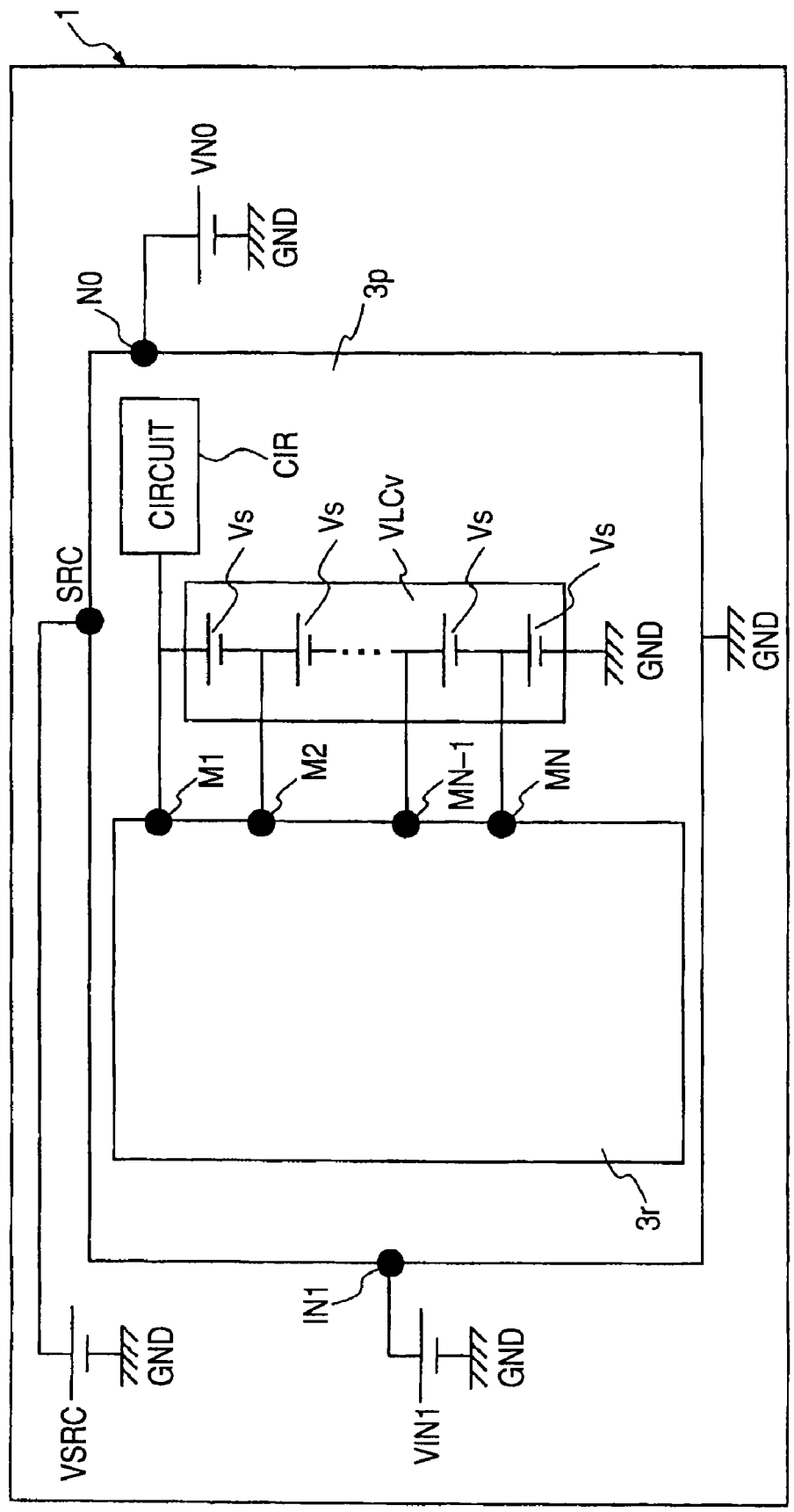
FIG. 49 is a circuit diagram showing a case of floating all higher-level interface nodes as a solution for the case in FIG. 48 where internal current flow is not required.
Figure 50:
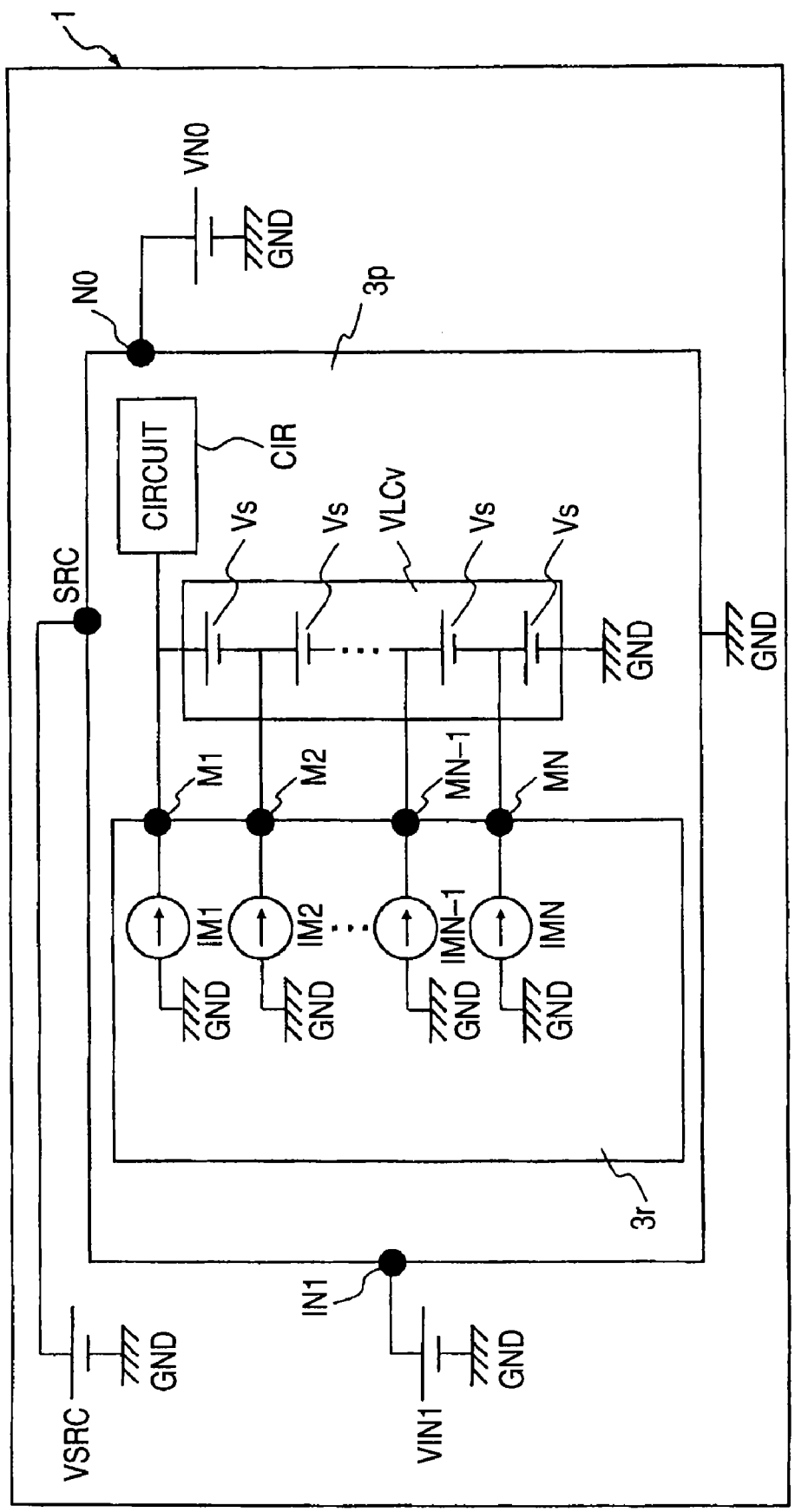
FIG. 50 is a circuit diagram showing a case of supplying electric current information as input/output information for all the lower-level interface nodes when the on-the-fly simulation in FIG. 49 is performed to verify an electric current flowing through a voltage source of the partial circuit.

A second example will be described. As shown in FIG. 48, let us consider a case where the partial circuit in the circuit area 3r is connected to another internal circuit CIR in addition to the lower-level interface node. A partial circuit VLCv is assumed to include one voltage source Vs or at least two connected voltage sources Vs. The partial circuit VLCv is connected to the ground potential similarly to the above-mentioned case. When another circuit CIR is connected to the partial circuit VLCv, the state of the other circuit CIR determines the current flow through the partial circuit VLCv. However, voltage values of the lower-level interface nodes M1 through MN for the partial circuit VLCv are determined by the voltage sources in VLCv itself. Originally, the on-the-fly simulation for the circuit area 3p only needs to float all the lower-level interface nodes M1 through MN as shown in FIG. 49. The goal is to prevent the formation of voltage source loops in all cases. There may be a need to perform the on-thefly simulation for the circuit area 3p to verify an electric current flowing through the voltage source for the partial circuit VLCv. In this case, as shown in FIG. 50, only electric current information IM2 through IMN as input/output information needs to be supplied to all the lower-level interface nodes M1 through MN. The electric current information IM2 through IMN can be found as mentioned above. The method in FIG. 49, when viewed differently, allows to float all the lower-level interface nodes M1 through MN when the simulation need not verify a current flowing through the voltage source for the partial circuit VLCv.

Figure 51:
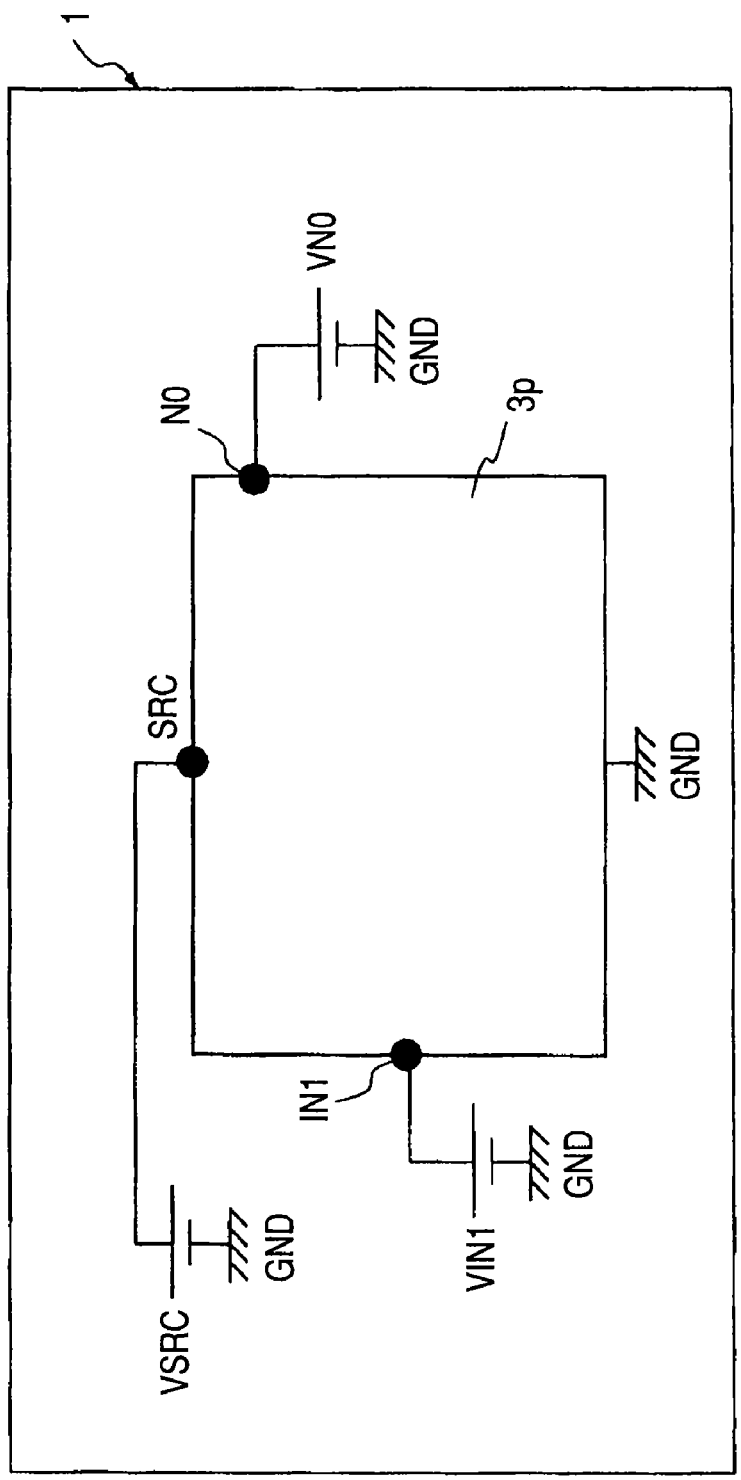
FIG. 51 is a circuit diagram showing a case of performing the on-the-fly simulation by removing a partial circuit when the on-the-fly simulation need not verify an electric current flowing through all elements in the partial circuit.

A third example will be described. As shown in FIG. 50, a condition is that the partial circuit VLC includes one of the elements such as voltage source Vs and inductor Lt or at least two connected elements such as voltage source Vs and inductor Lt. Another condition is that there are provided one or more lower-level interface nodes M1 through MN connecting the partial circuit VLC to the lower-level hierarchy. Still another condition is that the partial circuit VLC is connected to the ground potential GND. Yet another condition is that the on-the-fly simulation for the circuit area 3p eliminates consideration for electric currents flowing through all elements in the partial circuit VLC. Under these conditions, it is only necessary to perform the on-the-fly simulation by removing the partial circuit VLC as shown in FIG. 51. In short, when it is unnecessary to simulate an electric current flowing through all elements of the partial circuit VLC for verification, the simulation only needs to be performed by eliminating the partial circuit. This contributes to deleting circuit information for the simulation and shortening the computation time.

Figure 52:
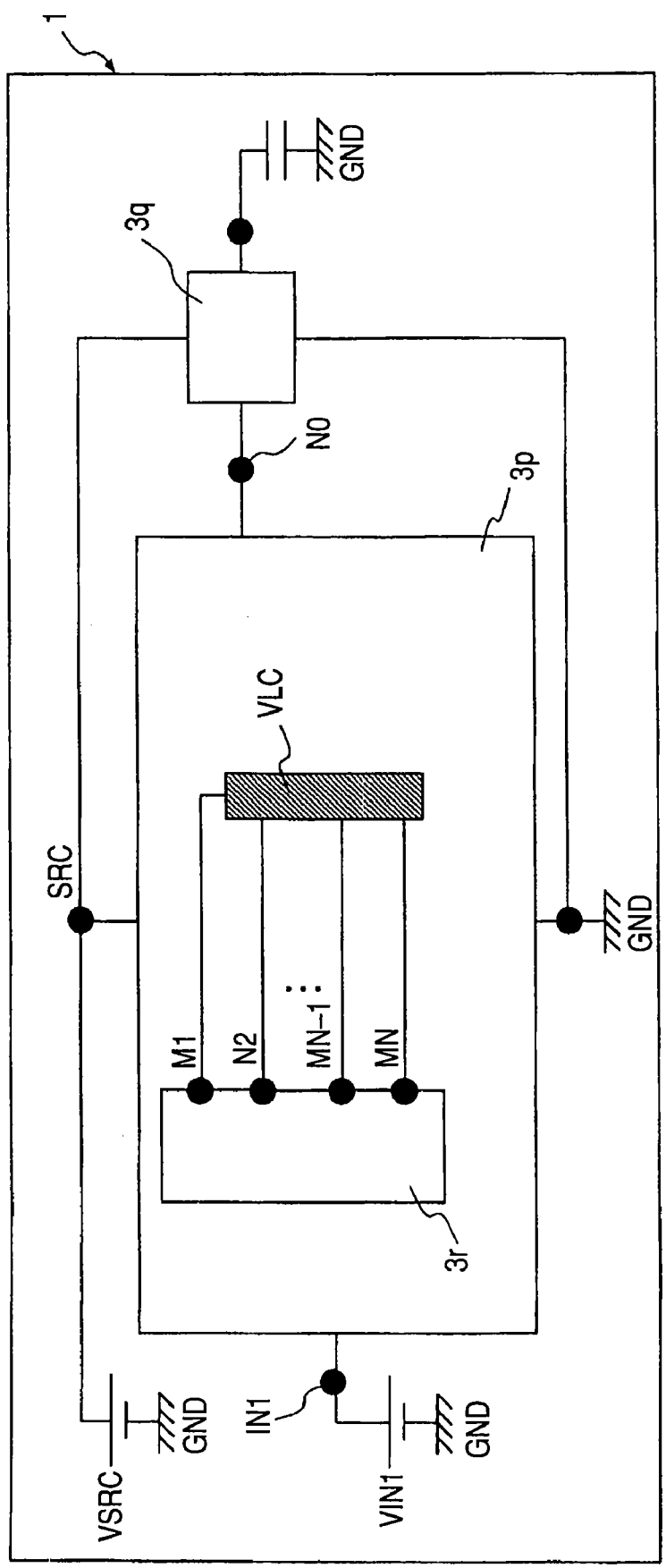
FIG. 52 is a circuit diagram exemplifying a circuit state where voltage loop formation is possible during the on-the-fly simulation when considering a partial circuit not connected to a ground potential.
Figure 53:
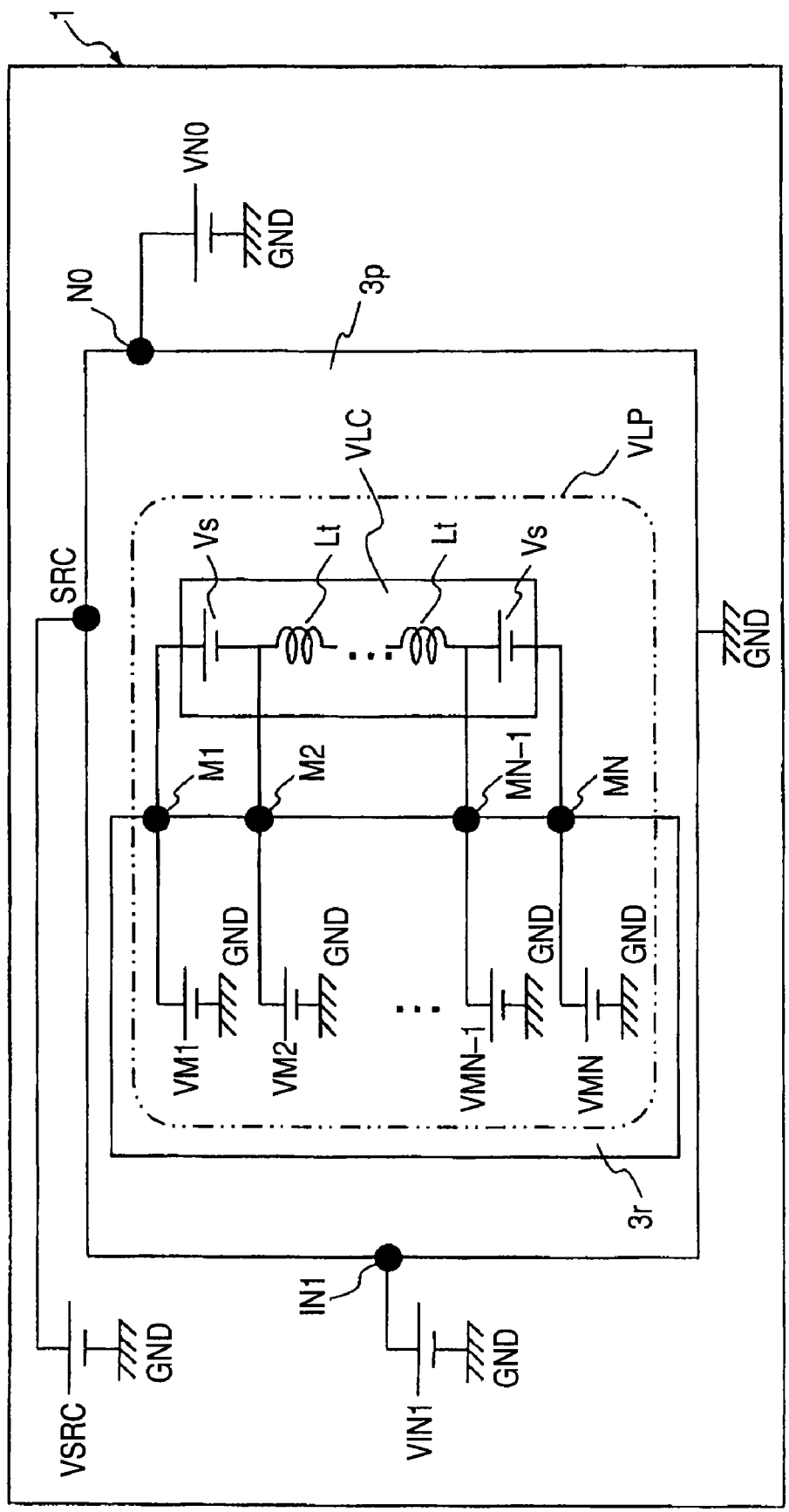
FIG. 53 is a circuit diagram showing a state of forming voltage source loops by supplying voltage source information for all higher-level interface nodes in FIG. 52.
Figure 54:
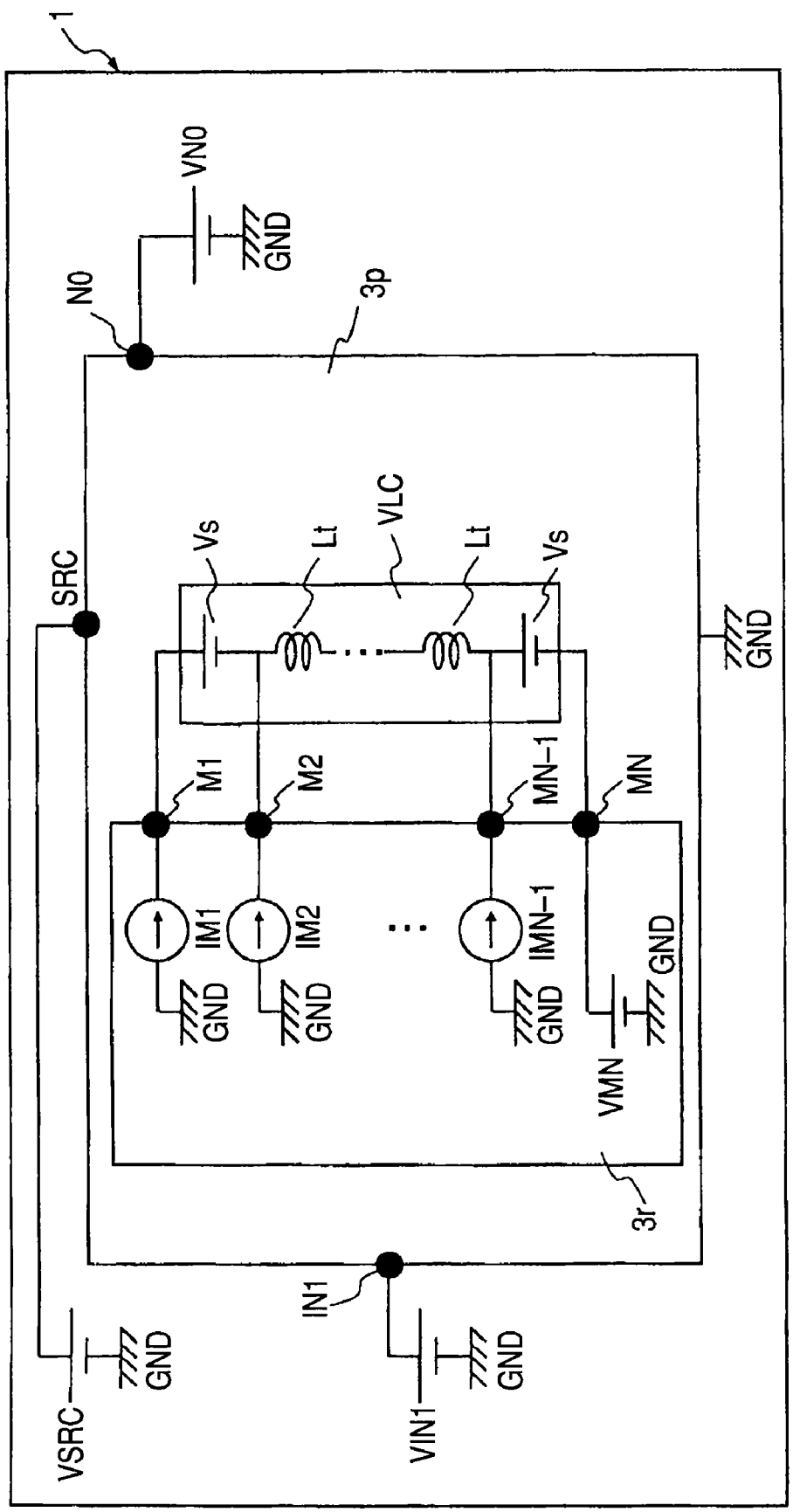
FIG. 54 is a circuit diagram showing a solution for suppressing generation of the voltage source loop in FIG. 53.
Figure 55:
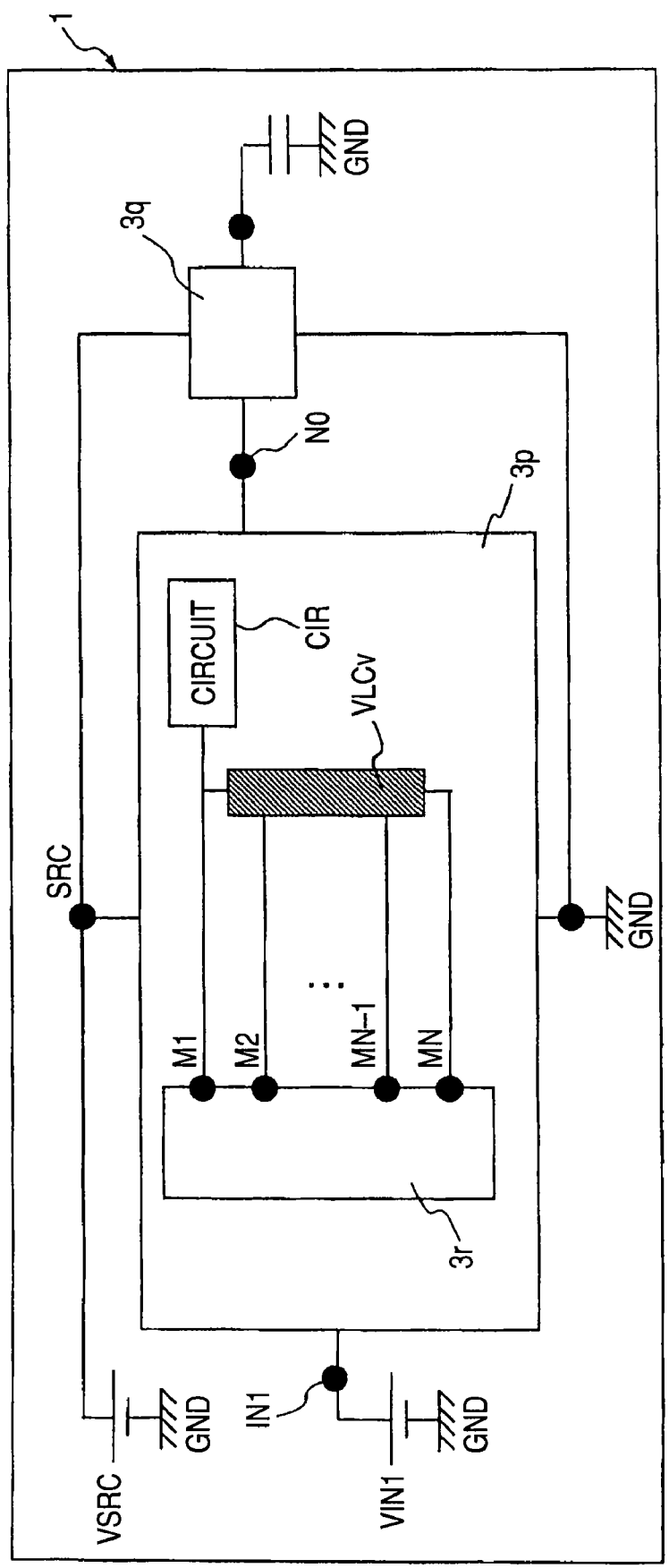
FIG. 55 is a circuit diagram exemplifying a circuit state where voltage loop formation is possible during the on-the-fly simulation when considering a ground potential not connected to a partial circuit, but with the partial circuit connected to another circuit.

A fourth example will be described. According to the above-mentioned description, the partial circuit VLC is connected to the ground potential GND. This is not mandatory. Let us assume a circuit in FIG. 52 in comparison with the circuit in FIG. 43. A difference from FIG. 43 is that the partial circuit VLC is not connected to the ground potential. When the on-the-fly simulation for the circuit area 3p provides voltage source information VM1 through VMN to all the lower-level interface nodes M1 through MN as shown in FIG. 53, a voltage source loop VLP is formed as mentioned above with reference to FIG. 45. FIG. 54 shows how to prevent the voltage source loop from forming. The on-the-fly simulation for the circuit area 3p supplies voltage source information VMN as input/output information to one lower-level interface node MN of the lower-level interface nodes M1 through MN. The on-the-fly simulation supplies current source information IM1 through IMN-1 as input/output information to the remaining lower-level interface nodes M1 through MN-1. The voltage source information VMN as input/output information supplied to the lower-level interface node MN is equivalent to the ground potential GND in FIG. 46, for example. The voltage source information VMN can be used to specify the potential reference for the partial circuit VLC that is not connected to the ground potential GND in the circuit area 3p. In addition, the current sources IM1 through IMN-1 can be connected to the lower-level interface nodes M1 through MN-1 of the partial circuit VLC. The targeted on-the-fly simulation can be performed for the circuit 3p including the partial circuit VLC. The same method as described in FIG. 47 can be used to obtain current sources IM1 through IMN-1 for the lower-level interface nodes M1 through MN-1.

Figure 56:
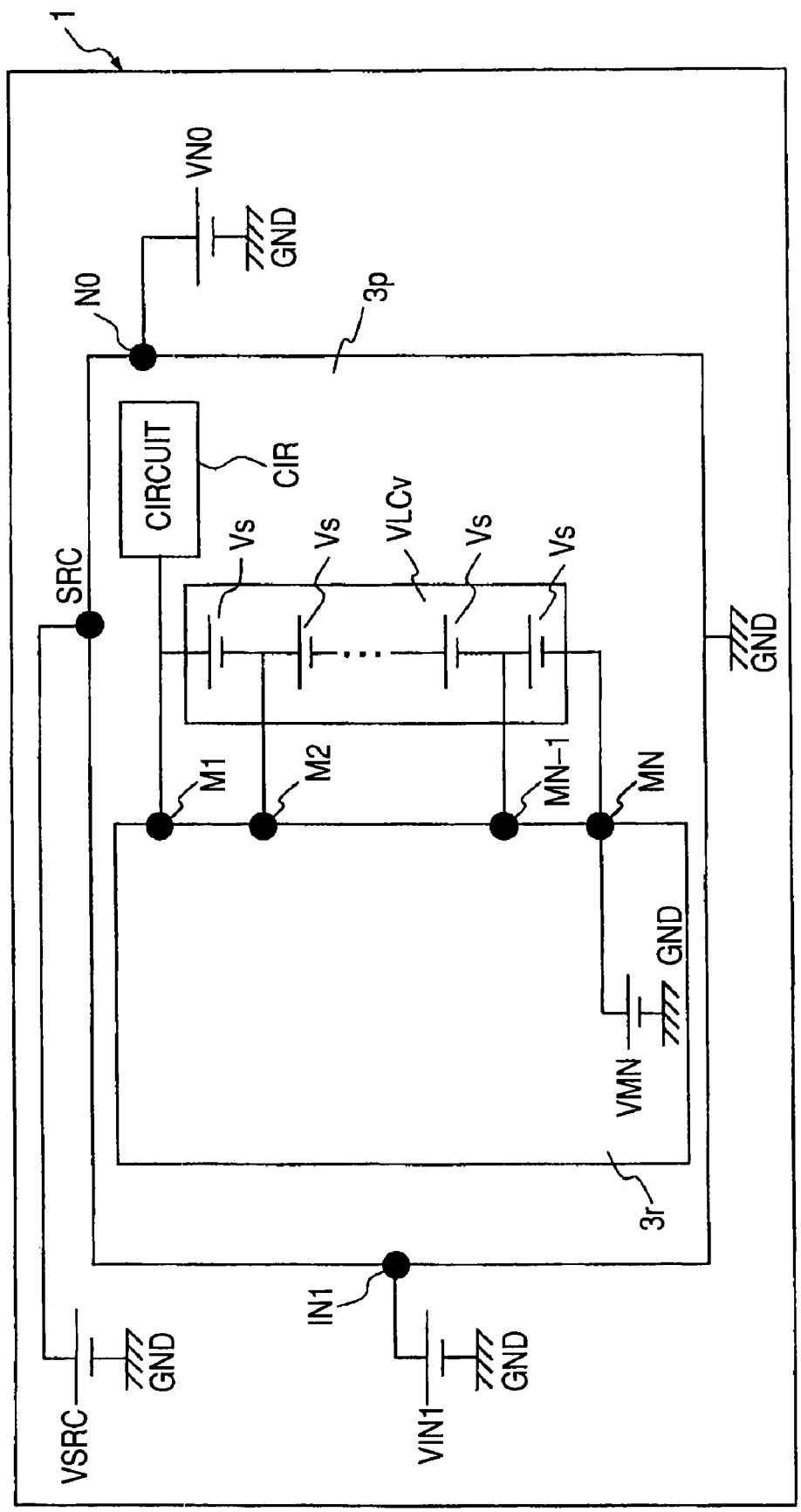
FIG. 56 is a circuit diagram showing a specific solution for the state in FIG. 55, i.e., supplying one higher-level interface node with voltage source information and supplying the partial circuit with one potential reference instead of the ground potential, and where current flow information is not required.
Figure 57:
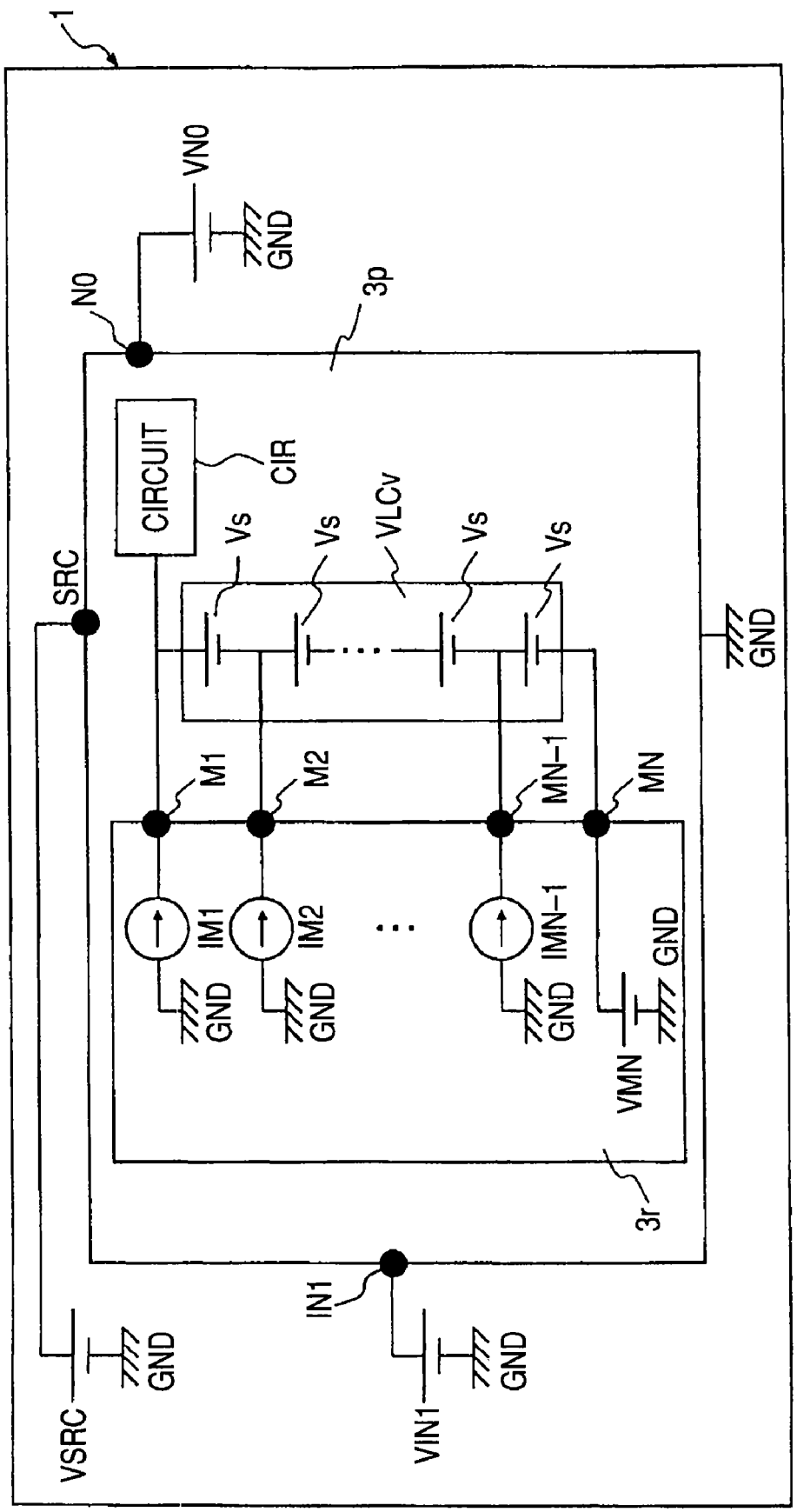
FIG. 57 is a circuit diagram showing a solution for performing the simulation to verify an electric current flowing through the voltage source of the partial circuit in FIG. 56.

A fifth example will be described. According to the above-mentioned description, the partial circuit VLCv is connected to the ground potential GND. This is not mandatory. Let us assume a circuit in FIG. 55 in comparison with the circuit in FIG. 48. A difference from FIG. 48 is that the partial circuit VLCv is not connected to the ground potential. As mentioned above, the partial circuit VLCv is assumed to include one voltage source Vs or at least two connected voltage sources Vs. As exemplified in FIG. 56, the on-the-fly simulation for the circuit area 3p supplies voltage source information VMN as input/output information to one lower-level interface node MN of the lower-level interface nodes M1 through MN. The voltage source information VMN supplies one potential reference to the partial circuit VLCv instead of the ground potential GND. When another circuit CIR is connected to the partial circuit VLCv, the state of the other circuit CIR determines the current flow through the partial circuit VLCv. However, the voltage values of the lower-level interface nodes M1 through MN-1 for the partial circuit VLCv are determined by the voltage sources in VLCv itself. Accordingly, the on-the-fly simulation for the circuit area 3p only needs to float the other higher-level interface nodes M1 through MN-1 than the lower-level interface node MN as shown in FIG. 56. The goal is to prevent the formation of voltage source loops in all cases. There may be a need to perform the on-the-fly simulation for the circuit area 3p to verify an electric current flowing through the voltage source Vs for the partial circuit VLCv. In this case, as shown in FIG. 57, only electric current information IM1 through IMN-1 as input/output information needs to be supplied to the lower-level interface nodes M1 through MN-1 other than the lower-level interface node MN. The electric current information can be found as mentioned above. The method in FIG. 57, when viewed differently, allows to float the lower-level interface nodes other than the lower-level interface node MN for input of the voltage information VMN when the simulation need not verify a current flowing through the voltage source for the partial circuit VLCv.

FIGS. 50 and 57 are also effective when the partial circuit VLCv includes an inductor in FIGS. 48 and 56. When an inductor is included, the electric current needs to be reproduced correctly. The lower-level interface nodes cannot be floated as shown in FIG. 56.

A sixth example will be described. A condition is that the partial circuit VLC is not connected to the ground potential GND as shown in FIG. 52. Similarly to the third example, another condition is that the on-the-fly simulation for the circuit area 3p eliminates consideration for electric currents flowing through all elements in the partial circuit VLC. Under these conditions, it is only necessary to perform the on-the-fly simulation by removing the partial circuit VLC as shown in FIG. 51. In short, when it is unnecessary to simulate an electric current flowing through all elements of the partial circuit VLC for verification, the simulation only needs to be performed by eliminating the partial circuit. This contributes to deleting circuit information for the simulation and shortening the computation time.

The above-mentioned simulation method can display data at any result output points without saving all simulation result data concerning a large-scale object under simulation. The method is hardly subject to disadvantages due to a voltage source loop. Especially, the method saves result data concerning an interface node between higher-level and lower-level hierarchies. There may be a case of discarding all result data at hierarchies lower than a specified hierarchical level. Compared to such case, the method can keep the amount of data to be saved and the simulation process time almost constant irrespectively of the hierarchical level of a hierarchical circuit to be simulated.

The method requires a small storage capacity to be able to provide the data display performance equivalent to that for saving all simulation result data for a large-scale simulation object such as a large-scale integrated circuit. The method is hardly subject to disadvantages due to a voltage source loop.

The method can easily increase the speed to display simulation result data for a large-scale simulation object such as a large-scale integrated circuit. The method is hardly subject to disadvantages due to a voltage source loop.

While there has been described the invention made by the inventors based on the specific embodiments, it is to be distinctly understood that the invention is not limited thereto but may be otherwise variously embodied within the spirit and scope of the invention.

For example, a circuit under simulation may be scaled to include hundreds of thousands to millions of gates. According to the above-mentioned description, the on-the-fly simulation is positioned as an enhanced function of displaying a simulation result. Obviously, it is possible to understand the invention as partial simulation apart from the display. When the invention is positioned as an enhanced display function, the invention is not limited to the display of simulation results but can be understood from a viewpoint of displaying data as a result of processing hierarchical information.

It is to be distinctly understood that the simulation method can be interpreted as a simulation program using a computer for implementing functions or procedures as shown in the flowcharts. Provision of such simulation program can easily embody the simulation method.

The simulation method according to the invention can be applied to not only circuit simulation, but also to device simulation. For example, device simulation may be performed by dividing a sectional area of a device such as a MOS transistor into meshed blocks and hierarchically comprehending them for simulation. In such case, the result output point corresponds to a focused point of electric current or voltage on the device section, for example. When the higher-level hierarchy is simulated, a result output point is found at a boundary of the mesh. When the lower-level hierarchy is simulated, a result output point is found in the mesh. There may be a need to obtain a result output point in the mesh as a simulation result. For this purpose, it is only necessary to perform a partial device simulation using an existing simulation result for an existing result output point at the mesh boundary and using the same initial simulation condition as that used for obtaining the existing result.

The invention can be widely applied to circuit simulation for semiconductor integrated circuits, device simulation for semiconductor devices, and the like.

What is claimed is:

1. A computer-implemented simulation method for semiconductor device circuitry, comprising:
   simulating an interface node associated with the semiconductor device circuitry and interposed between higher-level and lower-level hierarchies of the semiconductor device circuitry, based on simulation using hierarchical circuit data hierarchized for a plurality of hierarchies;
   saving in a memory, in a first process, result data obtained from said simulating an interface node associated with the semiconductor device circuitry; and
   reproducing using a computer, in a second process, internal node data not saved by said saving using said saved result data,
   wherein a first hierarchical circuit having an internal node associated with the second process has a partial circuit including one voltage source or two or more connected voltage sources, one or more specific nodes for connecting the partial circuit to a second hierarchical circuit in another hierarchy, and another circuit for connection to the partial circuit,
   wherein the partial circuit is connected to a ground potential,
   wherein the second process ignores electric current flowing through voltage sources of the partial circuit, and
   wherein all the specific nodes are then floated.

2. A computer-implemented simulation method for semiconductor device circuitry, comprising:
   simulating an interface node associated with the semiconductor device circuitry and interposed between higher-level and lower-level hierarchies of the semiconductor device circuitry, based on simulation using hierarchical circuit data hierarchized for a plurality of hierarchies;
   saving in a memory, in a first process, result data obtained from said simulating an interface node associated with the semiconductor device circuitry; and
   reproducing using a computer, in a second process, internal node data not saved by said saving using said saved result data,
   wherein a first hierarchical circuit having an internal node associated with the second process has a partial circuit including one of a voltage source and an inductor or at least two connected elements including a voltage source and an inductor and has one or more specific nodes for connecting the partial circuit to a second hierarchical circuit in another hierarchy,
   wherein the partial circuit is connected to a ground potential,
   wherein the second process ignores electric current flowing through all elements of the partial circuit, and
   wherein the partial circuit is then deleted.

3. A computer-implemented simulation method for semiconductor device circuitry, comprising:
   simulating an interface node associated with the semiconductor device circuitry and interposed between higher-level and lower-level hierarchies of the semiconductor device circuitry, based on simulation using hierarchical circuit data hierarchized for a plurality of hierarchies;
   saving in a memory, in a first process, result data obtained from said simulating an interface node associated with the semiconductor device circuitry; and
   reproducing using a computer, in a second process, internal node data not saved by said saving using said saved result data,
   wherein a first hierarchical circuit having an internal node associated with the second process has a partial circuit including one voltage source or two or more connected voltage sources, two or more specific nodes for connecting the partial circuit to a second hierarchical circuit in another hierarchy, and another circuit for connection to the partial circuit,
   wherein the partial circuit is not connected to a ground potential,
   wherein the second process ignores electric current flowing through voltage sources of the partial circuit, and
   wherein the second process then supplies voltage source information as input/output information to one specific node and floats the remaining specific nodes.

4. A computer-implemented simulation method for semiconductor device circuitry, comprising:
   simulating an interface node associated with the semiconductor device circuitry and interposed between higher-level and lower-level hierarchies of the semiconductor device circuitry, based on simulation using hierarchical circuit data hierarchized for a plurality of hierarchies;
   saving in a memory, in a first process, result data obtained from said simulating an interface node associated with the semiconductor device circuitry; and reproducing using a computer, in a second process, internal node data not saved by said saving using said saved result data, wherein a first hierarchical circuit having an internal node associated with the second process has a partial circuit including one of a voltage source and an inductor or at least two connected elements including a voltage source and an inductor and has one or more specific nodes for connecting the partial circuit to a second hierarchical circuit in another hierarchy, wherein the partial circuit is not connected to a ground potential, wherein the second process ignores electric current flowing through all elements of the partial circuit, and wherein the partial circuit is then deleted.

* * * * *